US012374672B2

(12) United States Patent
Woo et al.

(10) Patent No.: US 12,374,672 B2
(45) Date of Patent: Jul. 29, 2025

(54) DISPLAY DEVICE COMPRISING PLURALTIY OF LIGHT EMITTING ELEMENTS OVERLAPPING WITH CONTACT ELECTRODES

(71) Applicant: SAMSUNG DISPLAY CO., LTD., Yongin-si (KR)

(72) Inventors: Min Kyu Woo, Yongin-si (KR); Kyung Bae Kim, Yongin-si (KR); Jin Yeong Kim, Yongin-si (KR); Chong Chul Chai, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 140 days.

(21) Appl. No.: 17/862,320

(22) Filed: Jul. 11, 2022

(65) Prior Publication Data
US 2022/0344316 A1 Oct. 27, 2022

Related U.S. Application Data

(63) Continuation of application No. 17/021,504, filed on Sep. 15, 2020, now Pat. No. 11,387,223.

(30) Foreign Application Priority Data

Feb. 11, 2020 (KR) .................... 10-2020-0016648

(51) Int. Cl.
H01L 29/04 (2006.01)
H01L 25/075 (2006.01)
(Continued)

(52) U.S. Cl.
CPC ........ H01L 25/167 (2013.01); H01L 25/0753 (2013.01); H10H 20/857 (2025.01)

(58) Field of Classification Search
CPC ... H01L 25/167; H01L 25/0753; H01L 33/62; H01L 33/24; H01L 33/20
See application file for complete search history.

(56) References Cited

U.S. PATENT DOCUMENTS 10,211,418 B2 2/2019 Im et al.
10,249,603 B2 4/2019 Cho et al.
(Continued)

FOREIGN PATENT DOCUMENTS

JP 2014-75550 A 4/2014
JP 2014-123583 A 7/2014
(Continued)

OTHER PUBLICATIONS

Extended European Search Report dated Jun. 29, 2021 for corresponding European Application No. 20217991.7 (6 pages).

Primary Examiner — Ismail A Muse
(74) Attorney, Agent, or Firm — Womble Bond Dickinson (US) LLP

(57) ABSTRACT

A display device includes a substrate. A first electrode, a second electrode, and a third electrode are on the substrate, and are sequentially arranged along a first direction. A first light emitting element is located between the first electrode and the second electrode. A second light emitting element is located between the second electrode and the third electrode. A first contact electrode overlaps the first electrode and one end of the first light emitting element, and is in contact with the first electrode and the one end of the first light emitting element. A second contact electrode overlaps and is in contact with the other end of the first light emitting element. A third contact electrode overlaps and is in contact with the second electrode and the other end of the second light emitting element. The second contact electrode extends while detouring the third contact electrode.

20 Claims, 32 Drawing Sheets

(51) Int. Cl.
*H01L 25/16* (2023.01)
*H01L 29/10* (2006.01)
*H01L 31/00* (2006.01)
*H10H 20/857* (2025.01)

(56) References Cited

U.S. PATENT DOCUMENTS

| | | | |
|---|---|---|---|
| 10,276,630 | B2 | 4/2019 | Lee et al. |
| 10,340,419 | B2 | 7/2019 | Kim et al. |
| 2014/0084311 | A1 | 3/2014 | Takeda et al. |
| 2018/0019369 | A1* | 1/2018 | Cho .................. H01L 33/32 |
| 2020/0273906 | A1 | 8/2020 | Li et al. |
| 2021/0091050 | A1 | 3/2021 | Heo et al. |
| 2021/0111323 | A1 | 4/2021 | Kim et al. |
| 2021/0134877 | A1 | 5/2021 | Kim et al. |
| 2021/0202450 | A1 | 7/2021 | Min et al. |
| 2021/0249575 | A1 | 8/2021 | Lee et al. |
| 2021/0265329 | A1 | 8/2021 | Woo et al. |
| 2021/0288033 | A1 | 9/2021 | Lim et al. |
| 2021/0288220 | A1 | 9/2021 | Oh et al. |
| 2021/0399040 | A1* | 12/2021 | Chai ................ H01L 25/167 |
| 2023/0246133 | A1* | 8/2023 | Cha ................ H01L 33/0095 257/91 |

FOREIGN PATENT DOCUMENTS

| | | |
|---|---|---|
| KR | 10-2018-0009014 A | 1/2018 |
| KR | 10-2018-0009015 A | 1/2018 |
| KR | 10-2018-0011404 A | 2/2018 |
| KR | 10-1987196 B1 | 6/2019 |
| KR | 10-2021-0045572 A | 4/2021 |
| WO | WO 2020/013386 A1 | 1/2020 |
| WO | WO 2020/013403 A1 | 1/2020 |
| WO | WO 2020/027396 A1 | 2/2020 |
| WO | WO 2021/071148 A1 | 4/2021 |

* cited by examiner

FIG. 1A
FIG. 1B
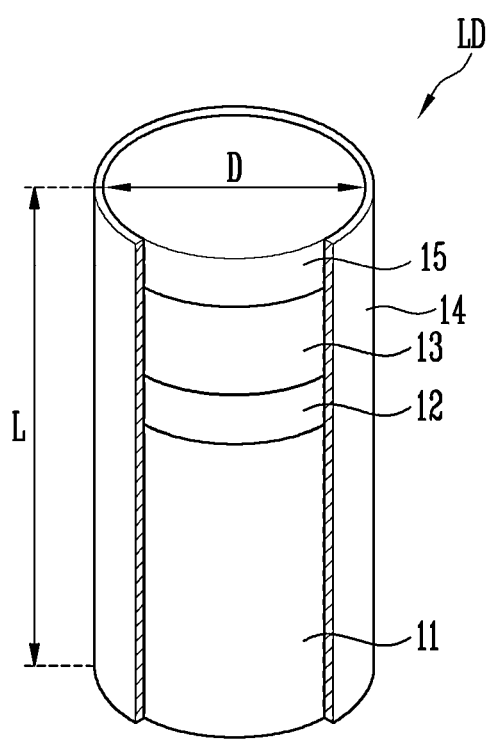
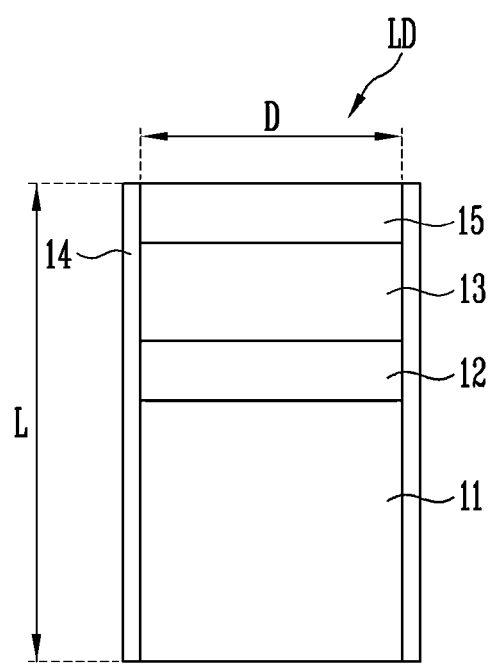

FIG. 3A
FIG. 3B
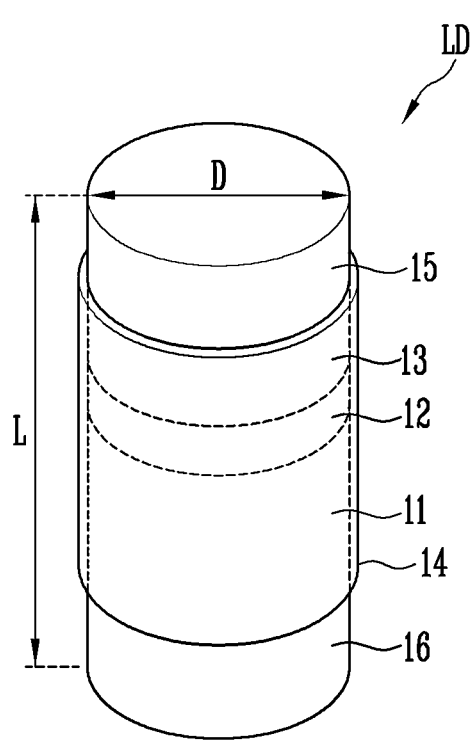
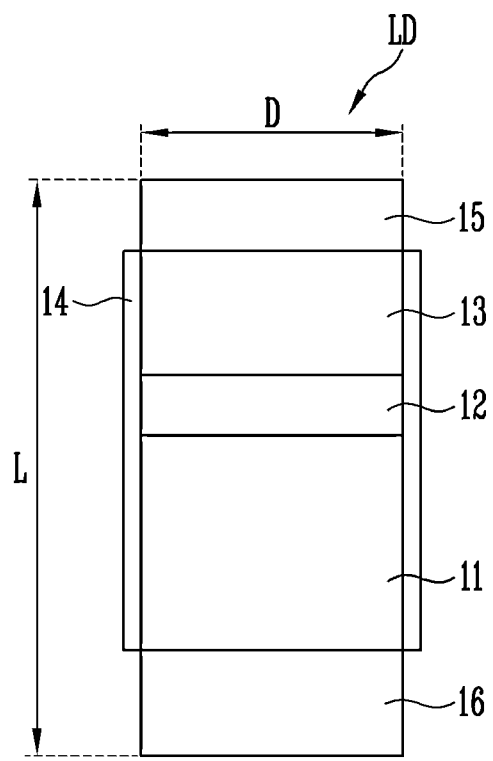

FIG. 4A
FIG. 4B
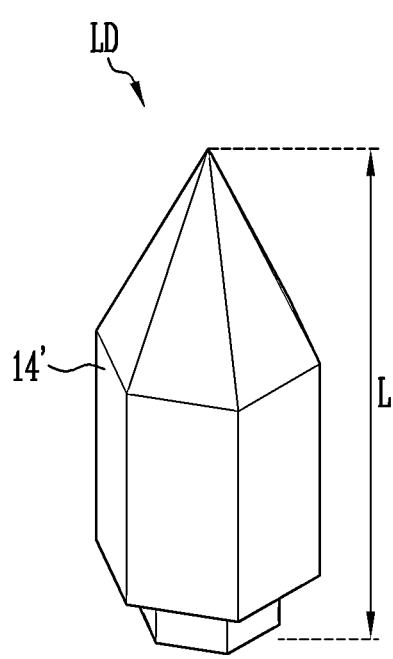
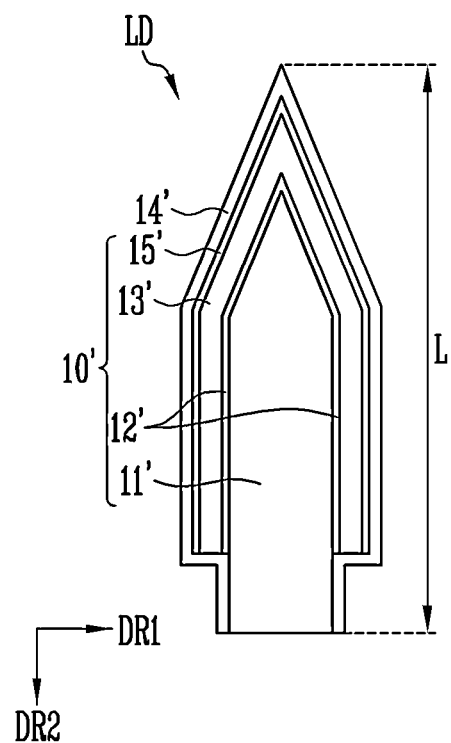

DISPLAY DEVICE COMPRISING PLURALTIY OF LIGHT EMITTING ELEMENTS OVERLAPPING WITH CONTACT ELECTRODES

CROSS-REFERENCE TO RELATED APPLICATIONS

This application is a continuation of U.S. patent application Ser. No. 17/021,504, filed Sep. 15, 2020, now U.S. Pat. No. 11,387,223, which claims priority to and the benefit of Korean Patent Application No. 10-2020-0016648, filed Feb. 11, 2020, the entire content of both of which is incorporated herein by reference.

BACKGROUND

1. Field

The present disclosure generally relates to a display device.

2. Related Art

Recently, a technique has been developed for fabricating a micro light emitting element by using a material having an inorganic crystalline structure with high reliability, and fabricating a light emitting apparatus by using the light emitting element. For example, a technique has been developed for constituting a light source of a light emitting apparatus by using micro light emitting elements having a small size to a degree of micro scales or nano scales. Such a light emitting apparatus can be used for various types of electronic devices such as an illumination device.

In order to increase emission efficiency of a display device (e.g., a light output amount of light emitting elements, or an input current per pixel), the light emitting elements may be connected to each other in a structure in which light sources each including light emitting elements connected in parallel to each other are connected in series to each other, i.e., a connection structure in which serial connection and parallel connection are combined.

However, because a ratio of light emitting elements that are arranged in series between two pixel electrodes is not high, the emission efficiency of the display device is not improved.

SUMMARY

One or more embodiments provide a display device having improved emission efficiency.

In accordance with one or more embodiments of the present disclosure, there is provided a display device including a substrate; a first electrode, a second electrode, and a third electrode on the substrate, the first electrode, the second electrode, and the third electrode being sequentially arranged along a first direction; at least one first light emitting element located between the first electrode and the second electrode; at least one second light emitting element located between the second electrode and the third electrode; a first contact electrode overlapping the first electrode and one end of the at least one first light emitting element, the first contact electrode being in contact with the first electrode and the one end of the at least one first light emitting element; a second contact electrode overlapping the other end of the at least one first light emitting element, the second contact electrode being in contact with the other end of the at least one first light emitting element; and a third contact electrode overlapping the second electrode and the other end of the at least one second light emitting element, the third contact electrode being in contact with the second electrode and the other end of the at least one second light emitting element, wherein the second contact electrode extends while detouring the third contact electrode, overlaps the third electrode and one end of the at least one second light emitting element, and is in contact with the one end of the at least one second light emitting element.

In one or more embodiments, the other end of the at least one first light emitting element and the other end of the at least one second light emitting element may include a same type semiconductor layer, and face each other with the second electrode interposed therebetween.

In one or more embodiments, the at least one first light emitting element and the at least one second light emitting element may be connected in series between the first electrode and the second electrode.

In one or more embodiments, on a plane, the second contact electrode may be spaced from the third contact electrode, and surround at least a portion of the third contact electrode.

In one or more embodiments, the second contact electrode may have a closed loop.

In one or more embodiments, each of the first electrode, the second electrode, and the third electrode may extend in a second direction crossing the first direction. A length of the second electrode in the second direction may be longer than that of the first electrode in the second direction.

In one or more embodiments, the display device may further include a bank extending along an edge of a light emitting area of the substrate, the bank defining the light emitting area. The first contact electrode, the second contact electrode, and the third contact electrode may be at the light emitting area. The first electrode, the second electrode, and the third electrode may overlap the bank.

In one or more embodiments, the display device may further include a transistor on the substrate; and a power line on the substrate. The first electrode may overlap the transistor and may be connected to one electrode of the transistor. The second electrode may overlap the power line and may be connected to the power line. The third electrode may be insulated from the transistor and the power line.

In one or more embodiments, the first contact electrode and the second contact electrode may be at different layers with at least one insulating layer interposed therebetween.

In one or more embodiments, the first contact electrode, the second contact electrode, and the third contact electrode may be at a same layer.

In one or more embodiments, the display device may further include a transistor on the substrate; and a power line on the substrate. The first electrode may overlap the power line and may be connected to the power line. The second electrode may overlap the transistor and may be connected to one electrode of the transistor. The third electrode may be insulated from the transistor and the power line.

In one or more embodiments, the display device may further include a fourth electrode between the first electrode and the second electrode. The at least one first light emitting element may be between the first electrode and the fourth electrode. The second contact electrode may overlap the fourth electrode.

In one or more embodiments, a width of each of the second electrode and the fourth electrode in the first direction may be smaller than that of the first electrode in the first direction.

In one or more embodiments, the second contact electrode may be in contact with the fourth electrode.

In accordance with one or more embodiments of the present disclosure, there is provided a display device including a substrate; a first electrode, a second electrode, a third electrode, and a fourth electrode on the substrate, the first electrode, the second electrode, the third electrode, and the fourth electrode being sequentially arranged along a first direction; at least one first light emitting element located between the first electrode and the second electrode; at least one second light emitting element located between the second electrode and the third electrode; at least one third light emitting element located between the third electrode and the fourth electrode; a first contact electrode overlapping the first electrode and one end of the at least one first light emitting element, the first contact electrode being in contact with the first electrode and the one end of the at least one first light emitting element; a second contact electrode overlapping the other end of the at least one first light emitting element, the second contact electrode being in contact with the other end of the at least one first light emitting element; a third contact electrode overlapping the second electrode and the other end of the at least one second light emitting element, the third contact electrode being in contact with the second electrode and the other end of the at least one second light emitting element; and a fourth contact electrode overlapping the fourth electrode and the other end of the at least one third light emitting element, the fourth contact electrode being in contact with the other end of the at least one third light emitting element, wherein the second contact electrode extends while detouring the third contact electrode, overlaps one end of the at least one third light emitting element, and is in contact with the one end of the at least one third light emitting element, wherein the fourth contact electrode extends while detouring the second contact electrode, overlaps one end of the at least one second light emitting element, and is in contact with the one end of the at least one second light emitting element.

In one or more embodiments, the other end of the at least one first light emitting element and the other end of the at least one second light emitting element may include a same type semiconductor layer, and face each other with the second electrode interposed therebetween. The one end of the at least one second light emitting element and the one end of the at least one third light emitting element may include a same type semiconductor layer, and may face each other with the third electrode interposed therebetween.

In one or more embodiments, the at least one first light emitting element, the at least one second light emitting element, and the at least one third light emitting element may be connected in series between the first electrode and the second electrode.

In one or more embodiments, the second contact electrode may extend from the second electrode to the third electrode while being adjacent to one end of the third contact electrode. The fourth contact electrode may extend from the fourth electrode to the third electrode while being adjacent to the other end of the third contact electrode.

In one or more embodiments, the display device may further include a fifth electrode between the first electrode and the second electrode. The at least one first light emitting element may be between the first electrode and the fifth electrode. The second contact electrode may overlap the fifth electrode.

The display device may further include a sixth electrode between the third electrode and the fourth electrode. The at least one third light emitting element may be between the sixth electrode and the fourth electrode. The second contact electrode may overlap the sixth electrode.

BRIEF DESCRIPTION OF THE DRAWINGS

One or more embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 1A is a view illustrating a light emitting element in accordance with one or more embodiments of the present disclosure.

FIG. 1B is a sectional view of the light emitting element shown in FIG. 1A.

FIG. 3A is a view illustrating a light emitting element in accordance with one or more embodiments of the present disclosure.

FIG. 3B is a sectional view of the light emitting element shown in FIG. 3A.

FIG. 4A is a view illustrating a light emitting element in accordance with one or more embodiments of the present disclosure.

FIG. 4B is a sectional view of the light emitting element shown in FIG. 4A.

DETAILED DESCRIPTION

Figure 2A:
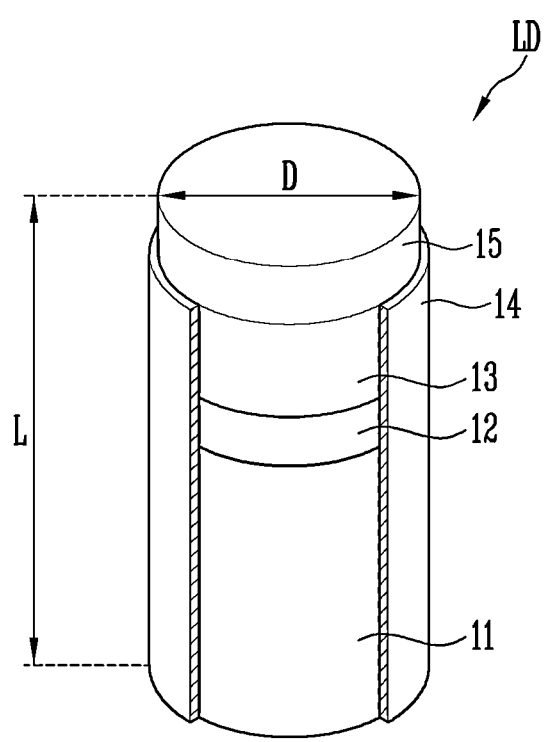
FIG. 2A is a view illustrating a light emitting element in accordance with one or more embodiments of the present disclosure.

As embodiments according to the present disclosure may have different shapes and various changes may be applied thereto, particular examples will be illustrated in drawings and described in detail. However, the embodiments according to the present disclosure are not limited to below described examples, and may be changed to have various shapes and with equivalent materials and/or replacements.

In the following embodiments and the attached drawings, elements not directly related to the present disclosure are omitted from depiction, and dimensional relationships among individual elements in the attached drawings are illustrated only for ease of understanding but not to limit the actual scale. It should be noted that in giving reference numerals to elements of each drawing, like reference numerals refer to like elements even though like elements are shown in different drawings.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed herein could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present invention". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Figure 2B:
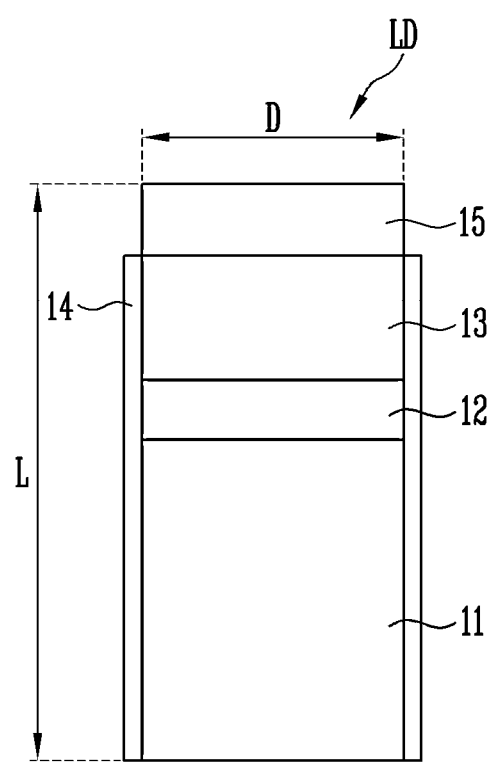
FIG. 2B is a sectional view of the light emitting element shown in FIG. 2A.

FIG. 1A is a view illustrating a light emitting element in accordance with one or more embodiments of the present disclosure. FIG. 1B is a sectional view of the light emitting element shown in FIG. 1A. FIG. 2A is a view illustrating a light emitting element in accordance with one or more embodiments of the present disclosure. FIG. 2B is a sectional view of the light emitting element shown in FIG. 2A. FIG. 3A is a view illustrating a light emitting element in accordance with one or more embodiments of the present disclosure. FIG. 3B is a sectional view of the light emitting element shown in FIG. 3A. FIG. 4A is a view illustrating a light emitting element in accordance with one or more embodiments of the present disclosure. FIG. 4B is a sectional view of the light emitting element shown in FIG. 4A.

FIGS. 1A, 1B, 2A, 2B, 3A, and 3B, which illustrate light emitting elements fabricated through an etching process, will be described, and FIGS. 4A and 4B, which illustrate a light emitting element fabricated through a growth process, will then be described. In one or more embodiments of the present disclosure, kinds and/or shapes of the light emitting elements are not limited to the embodiments shown in FIGS. 1A, 1B, 2A, 2B, 3A, 3B, 4A, and 4B.

First, referring to FIGS. 1A, 1B, 2A, 2B, 3A, and 3B, each light emitting element LD (or a light emitting device) may include a first semiconductor layer 11, a second semiconductor layer 13, and an active layer 12 interposed between the first and second semiconductor layers 11 and 13. In one or more embodiments, the light emitting element LD may be implemented as a light emitting stack structure in which the first semiconductor layer 11, the active layer 12, and the second semiconductor layer 13 are sequentially stacked.

In one or more embodiments, the light emitting element LD may have a shape extending in one direction. When assuming that an extending direction of the light emitting element LD is a length direction, the light emitting element LD may have one end portion and the other end portion along the extending direction. Any one of the first and second semiconductor layers 11 and 13 may be disposed at the one end portion of the light emitting element LD, and the other one of the first and second semiconductor layers 11 and 13 may be disposed at the other end portion of the light emitting element LD.

The light emitting element LD may have various shapes. For example, the light emitting element LD may have a rod-like shape or bar-like shape, which is long in its length direction (e.g., the aspect ratio of the light emitting element LD is greater than 1). For example, a length L of the light emitting element LD in the length direction may be greater than a diameter D (or a width of a cross-section) of the light emitting element LD. The light emitting element LD may include a light emitting diode fabricated small enough to have a diameter D and/or a length L to a degree of micro scales or nano scales. According to one or more embodiments of the present disclosure, the size of the light emitting element LD may be modified to be suitable for requirements (or design conditions) of a lighting device or a self-luminescent display device, to which the light emitting element LD is applied.

The first semiconductor layer 11 may include at least one n-type semiconductor layer. For example, the first semiconductor layer 11 may include any one semiconductor material from among the semiconductor materials InAlGaN, GaN, AlGaN, InGaN, AlN, and InN, and may include an n-type semiconductor layer doped with a first conductive dopant such as Si, Ge, or Sn. However, the material constituting the first semiconductor layer 11 is not limited thereto. In one or more embodiments, the first semiconductor layer 11 may be configured with various materials.

The active layer 12 is formed on the first semiconductor layer 11, and may be formed in a single or multiple quantum well structure. The position of the active layer 12 may be variously changed depending on a kind of the light emitting element LD. The active layer 12 may emit light having a wavelength of 400 nm to 900 nm, and use a double hetero structure. A clad layer (not shown) doped with a conductive dopant may be formed on the top and/or the bottom of the active layer 12. In one or more embodiments, the clad layer may be formed as an AlGaN layer or InAlGaN layer. In some embodiments, a material such as AlGaN or AlInGaN may be used to form the active layer 12. In one or more embodiments, the active layer 12 may be configured with various materials.

When an electric field having a suitable voltage (e.g., a set or predetermined voltage) or more is applied between end portions of the light emitting element LD, the light emitting element LD emits light as electron-hole pairs are combined in the active layer 12. The light emission of the light emitting element LD is controlled using such a principle, so that the light emitting element LD can be used as a light source for various light emitting apparatuses, including a pixel of a display device.

The second semiconductor layer 13 is formed on the active layer 12, and may include a semiconductor layer having a type different from that of the first semiconductor layer 11. For example, the second semiconductor layer 13 may be formed of a semiconductor material different from the semiconductor material of the first semiconductor layer 11, or the second semiconductor layer 13 may be formed of a semiconductor material having material properties that are different from material properties of the semiconductor material of the first semiconductor layer 11. The second semiconductor layer 13 may include at least one p-type semiconductor material. For example, the second semiconductor layer 13 may include at least one semiconductor material from among InAlGaN, GaN, AlGaN, InGaN, AlN, and InN, and may include a p-type semiconductor layer doped with a second conductive dopant such as Mg. However, the material constituting the second semiconductor layer 13 is not limited thereto. In one or more embodiments, the second semiconductor layer 13 may be configured with various other suitable materials.

In one or more embodiments of the present disclosure, the first semiconductor layer 11 and the second semiconductor layer 13 may have different widths (or thicknesses) in the length L direction of the light emitting element LD. In one or more embodiments, the first semiconductor layer 11 may have a width (or thickness) relatively wider (or thicker) than that of the second semiconductor layer 13 along the length L direction of the light emitting element LD. For example, the active layer 12 of the light emitting element LD may be located more adjacent to an upper surface of the second semiconductor layer 13 than a lower surface of the first semiconductor layer 11 as shown in FIGS. 1A-3B.

In one or more embodiments, the light emitting element LD may further include an additional electrode 15 disposed on the top of the second semiconductor layer 13, in addition to the first semiconductor layer 11, the active layer 12, and the second semiconductor layer 13, which are described above. In some embodiments, the light emitting element LD may further include another additional electrode 16 disposed at one end of the first semiconductor layer 11 as shown in FIGS. 3A and 3B.

The additional electrodes 15 and 16 may be ohmic contact electrodes, but the present disclosure is not limited thereto. In some embodiments, the additional electrodes 15 and 16 may be Schottky contact electrodes. The additional electrodes 15 and 16 may include a metal or metal oxide. For example, the additional electrodes 15 and 16 may include one or mixture of chromium (Cr), titanium (Ti), aluminum (Al), gold (Au), nickel (Ni), and any oxide or alloy thereof and ITO, but the present disclosure is not limited thereto.

Materials respectively included in the additional electrodes 15 and 16 may be identical to (or substantially identical to) or different from each other. The additional electrodes 15 and 16 may be substantially transparent or translucent. For example, light generated in the light emitting element LD may be emitted to the outside of the light emitting element LD by passing through the additional electrodes 15 and 16. In some embodiments, when light generated in the light emitting element LD does not pass through the additional electrodes 15 and 16 and is emitted to the outside of the light emitting element LD through an area except both the end portions of the light emitting element LD, the additional electrodes 15 and 16 may include an opaque metal.

In one or more embodiments, the light emitting element LD may further include an insulative film 14. However, in some embodiments, the insulative film 14 may be omitted, or may be provided to cover only portions of the first semiconductor layer 11, the active layer 12, and the second semiconductor layer 13.

The insulative film 14 can prevent (or protect from) an electrical short circuit that may occur when the active layer 12 is in contact with a conductive material except the first semiconductor layer 11 and the second semiconductor layer 13. Also, the insulative film 14 is formed, so that a surface defect of the light emitting element LD is minimized or reduced, thereby improving the lifespan and efficiency of the light emitting element LD. Also, when a plurality of light emitting elements LD are densely disposed, the insulative film 14 can prevent (or protect from) an unwanted short circuit that may occur between the light emitting elements LD. Whether the insulative film 14 is provided is not limited as long as the active layer 12 can prevent (or protect from) occurrence of a short circuit with external conductive material.

As shown in FIGS. 1A and 1B, the insulative film 14 may be provided in a shape entirely surrounding the outer peripheral (e.g., circumferential) surface of the light emitting stack structure including the first semiconductor layer 11, the active layer 12, the second semiconductor layer 13, and the additional electrode 15. For convenience of description, a case where a portion of the insulative film 14 is omitted is illustrated in FIG. 1A, and the first semiconductor layer 11, the active layer 12, the second semiconductor layer 13, and the additional electrode 15, which are included in the actual light emitting element LD, may be surrounded by (or partially covered by) the insulative film 14.

Although a case where the insulative film 14 is provided in a shape entirely surrounding the outer circumference of each of the first semiconductor layer 11, the active layer 12, the second semiconductor layer 13, and the additional electrode 15 is described in the above-described embodiment, the present disclosure is not limited thereto.

In some embodiments, as shown in FIGS. 2A and 2B, the insulative film 14 may surround (or partially cover) the outer peripheral (e.g., circumferential) surface of each of the first semiconductor layer 11, the active layer 12, and the second semiconductor layer 13, and may not entirely surround the outer peripheral (e.g., circumferential) surface of the additional electrode 15 disposed on the second semiconductor layer 13. In some embodiments, the insulative film 14 may surround only a portion of the outer peripheral (e.g., circumferential) surface of the additional electrode 15, and may not surround the outer peripheral (e.g., circumferential) surface of the additional electrode 15. However, the insulative film 14 may expose at least both the end portions of the light emitting element LD. In one or more embodiments, the insulative film 14 may expose one end portion of the first semiconductor layer 11, in addition to the additional electrode 15 disposed at one end of the second semiconductor layer 13. In some embodiments, as shown in FIGS. 3A and 3B, when the additional electrodes 15 and 16 are disposed at both the end portions of the light emitting element LD, the insulative film 14 may expose at least one area of each of the additional electrodes 15 and 16. In one or more embodiments, the insulative film 14 may not be provided.

In accordance with one or more embodiments of the present disclosure, the insulative film 14 may include a transparent insulating material. For example, the insulative film 14 may be formed of $SiO_x$, $SiN_x$, and the like, which are not determined as $SiO_2$, $Si_3N_4$. However, the present disclosure is not limited thereto, and various materials having insulating properties may be used for the insulative film 14.

In one or more embodiments, when the insulative film 14 is provided in the light emitting element LD, the active layer 12 can be prevented (or protected) from being short-circuited with a first electrode and/or a second electrode. In one or more embodiments, the insulative film 14 is formed, so that a surface defect of the light emitting element LD is minimized or reduced, thereby improving the lifespan and efficiency of the light emitting element LD. In one or more embodiments, when a plurality of light emitting elements LD are densely disposed, the insulative film 14 can prevent (or protect from) an unwanted short circuit that may occur between the light emitting elements LD.

The light emitting element LD may be used as a light emitting source for various display devices. The light emitting element LD may be fabricated through a surface treatment process. For example, when a plurality of light emitting elements LD are mixed in a liquid solution (or solvent) to be supplied to each light emitting area (e.g., a light emitting area of each pixel or a light emitting area of each sub-pixel), each light emitting element LD may be surface-treated such that the light emitting elements LD are not unequally condensed in the solution but equally dispersed in the solution.

A light emitting apparatus including the light emitting element LD may be used in various types of devices that require a light source, including a display device. When a plurality of light emitting elements LD are disposed in a light emitting area of each pixel of a display panel, the light emitting elements LD may be used as a light source of the pixel. However, the application field of the light emitting element LD is not limited to the above-described example. For example, the light emitting element LD may be used in other types of devices that require a light source, such as a lighting device.

Next, a light emitting element LD fabricated through a growth process will be described with reference to FIGS. 4A and 4B.

In description of the light emitting element LD fabricated through the growth process, portions different from those of the above-described embodiments will be mainly described to avoid or reduce redundancy. Portions not particularly described in the light emitting element LD fabricated through the growth process follow those of the above-described embodiments. In one or more embodiments, components similar and/or identical to those of the above-described embodiments are designated by like reference numerals.

Referring to FIGS. 4A and 4B, the light emitting element LD, in accordance with one or more embodiments of the present disclosure, includes a first semiconductor layer 11', a second semiconductor layer 13', and an active layer 12' interposed between the first and second semiconductor layers 11' and 13'. In some embodiments, the light emitting element LD may include a light emitting pattern 10' having a core-shell structure including a first semiconductor layer 11' located at the center thereof, an active layer 12' surrounding at least one side of the first semiconductor layer 11' (e.g., the active layer 12' may surround the first semiconductor layer 11' around the periphery of the first semiconductor layer 11'), a second semiconductor layer 13' surrounding at least one side of the active layer 12' (e.g., the second semiconductor layer 13' may surround the active layer 12' around the periphery of the active layer 12'), and an additional electrode 15' surrounding at least one side of the second semiconductor layer 13' (e.g., the additional electrode 15' may surround the second semiconductor layer 13' around the periphery of the second semiconductor layer 13').

The light emitting element LD may be provided in a polygonal pyramid shape extending in one direction. In one or more embodiments, the light emitting element LD may be provided in a hexagonal pyramid shape. When assuming that an extending direction of the light emitting element LD is a length L direction of the light emitting element LD, the light emitting element LD may have one end portion (or lower end portion) and the other end portion (or upper end portion) along the length L direction. A portion of one of the first and second semiconductor layers 11' and 13' may be exposed at the one end portion (or lower end portion) of the light emitting element LD, and a portion of the other one of the first and second semiconductor layers 11' and 13' may be exposed at the other end portion (or upper end portion) of the light emitting element LD. In one or more embodiments, a portion of the first semiconductor layer 11' may be exposed at the one end portion (or lower end portion) of the light emitting element LD, and a portion of the second semiconductor layer 13' may be exposed at the other end portion (or upper end portion) of the light emitting element LD. When the light emitting element LD is applied as a light source of a display device, the exposed portion of the first semiconductor layer 11' may be in contact with one of driving electrodes for driving the light emitting element LD, and the exposed portion of the second semiconductor layer 13' may be in contact with another one of the driving electrodes.

In some embodiments, when the light emitting element LD includes the additional electrode 15', a portion of the additional electrode 15' surrounding at least one side of the second semiconductor layer 13' may be exposed at the other end portion (or upper end portion) of the light emitting element LD. When the light emitting element LD is applied as a light source of a display device, the exposed portion of the additional electrode 15' may be in contact with the another driving electrode to be electrically connected to the one electrode.

In one or more embodiments, the first semiconductor layer 11' may be located at a core, e.g., the center (or middle) of the light emitting element LD. The light emitting element LD may be provided in a shape corresponding to that of the first semiconductor layer 11'. In one or more embodiments, when the first semiconductor layer 11' has a hexagonal pyramid shape, the light emitting element LD and the light emitting pattern 10' may also have a hexagonal pyramid shape.

The active layer 12' may be provided and/or formed in a shape surrounding the outer peripheral (e.g., circumferential) surface of the first semiconductor layer 11' in the length L direction of the light emitting element LD. For example, the active layer 12' may be provided and/or formed in a shape surrounding the other area except the other end portion disposed at a lower side between both end portions of the first semiconductor layer 11' in the length L direction of the light emitting element LD.

The second semiconductor layer 13' may be provided and/or formed in a shape surrounding the active layer 12' in the length L direction of the light emitting element LD, and include a semiconductor layer having a type different from that of the first semiconductor layer 11'. For example, the second semiconductor layer 13' may be formed of a semiconductor material different from the semiconductor material of the first semiconductor layer 11' or the second semiconductor layer 13' may be formed of a semiconductor material having material properties that are different from material properties of the semiconductor material of the first semiconductor layer 11'. In one or more embodiments, the second semiconductor layer 13' may include at least one p-type semiconductor layer.

In one or more embodiments, the light emitting element LD may include an additional electrode 15' surrounding at least one side of the second semiconductor layer 13'. The additional electrode 15' may be an ohmic contact electrode or a Schottky contact electrode, which is electrically connected to the second semiconductor layer 13', but the present disclosure is not limited thereto.

As described above, the light emitting element LD may be configured in a hexagonal pyramid shape having both protruding end portions, and may include a light emitting pattern 10' having a core-shell structure including a first semiconductor layer 11' located at the center thereof, an active layer 12' surrounding at least one side of the first semiconductor layer 11', a second semiconductor layer 13' surrounding at least one side of the active layer 12', and an additional electrode 15' surrounding at least one side of the second semiconductor layer 13'. The first semiconductor layer 11' may be disposed at one end portion (or lower end portion) of the light emitting element LD having the hexagonal pyramid shape, and the additional electrode 15' may be disposed at the other end portion (or upper end portion) of the light emitting element LD.

In some embodiments, the light emitting element LD may further include an insulative film 14' provided on the outer peripheral (e.g., circumferential) surface of the light emitting pattern 10' having the core-sell structure. The insulative film 14' may include a transparent insulating material.

Figure 5:
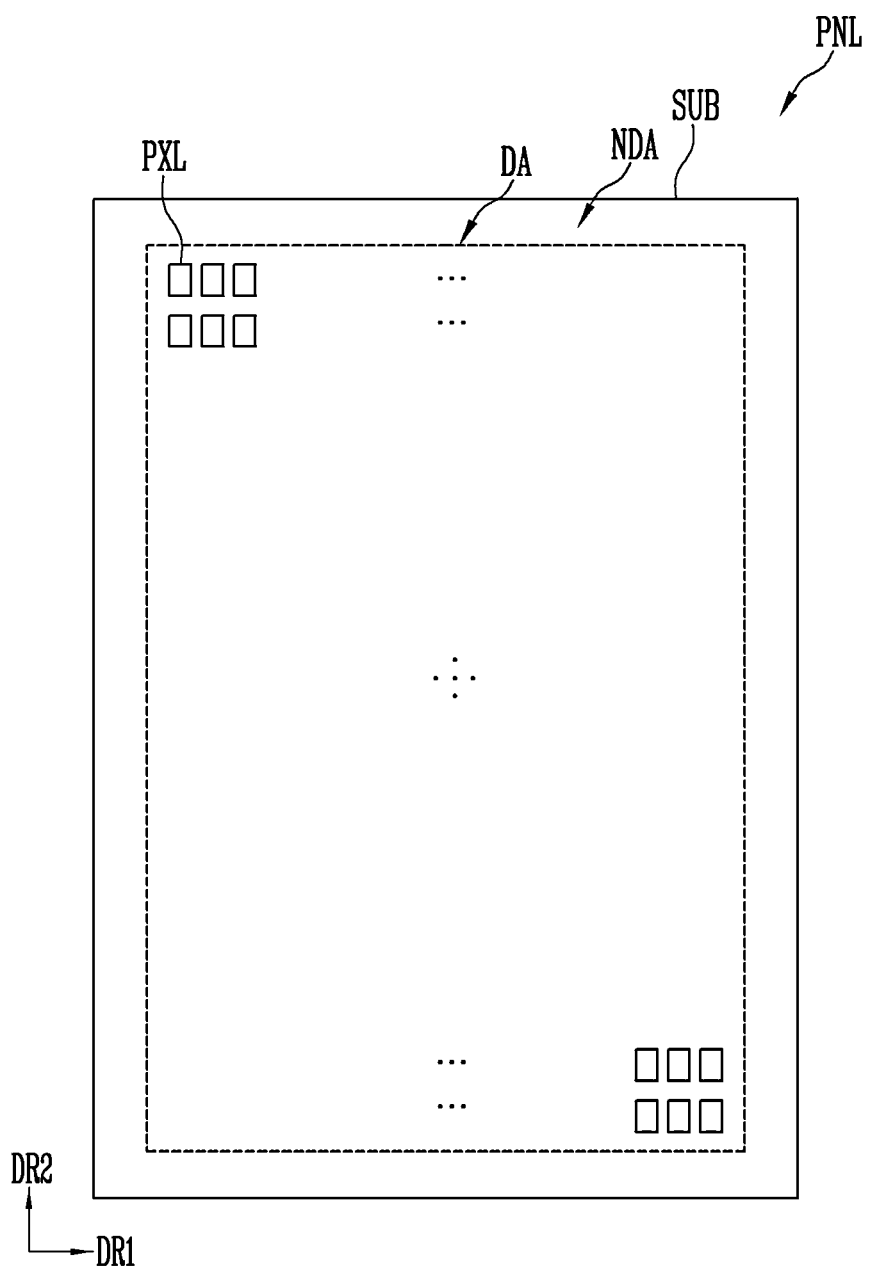
FIG. 5 is a plan view illustrating a display device in accordance with one or more embodiments of the present disclosure.

FIG. 5 is a plan view illustrating a display device in accordance with one or more embodiments of the present disclosure. In some embodiments, a display device, for example, a display panel PNL provided in the display device, is illustrated as an example of a device which can use, as a light source, the light emitting element LD described in FIGS. 1A-4B. In some embodiments, a structure of the display panel PNL is briefly illustrated based on a display area DA. However, in some embodiments, at least one driving circuit (e.g., a scan driver and a data driver) and/or a plurality of lines may be further disposed in the display panel PNL.

Referring to FIG. 5, the display panel PNL may include a base layer SUB (or substrate), and pixels PXL arranged on the base layer SUB. For example, the display panel PNL and the base layer SUB may include a display area DA in which an image is displayed and a non-display area NDA except the display area DA. The non-display area NDA may surround the display area DA along one or more edges (or around a periphery) of the display area DA.

In some embodiments, the display area DA is disposed in a central area of the display panel PNL, and the non-display area NDA may be disposed along an edge of the display panel PNL to surround the display area DA. However, the positions of the display area DA and the non-display area NDA are not limited thereto, and may be changed.

The base layer SUB may constitute a base member of the display panel PNL. For example, the base layer SUB may constitute a base member of a lower panel (e.g., a lower plate of the display panel PNL).

In some embodiments, the base layer SUB may be a rigid substrate or a flexible substrate, and the material or property of the base layer SUB is not particularly limited. In one or more embodiments, the base layer SUB may be a rigid substrate made of glass or tempered glass, or a flexible substrate configured with a thin film made of plastic or metal. Also, the base layer SUB may be a transparent substrate, but the present disclosure is not limited thereto. In one or more embodiments, the base layer SUB may be a translucent substrate, an opaque substrate, or a reflective substrate.

One area on the base layer SUB is defined as the display area DA such that the pixels PXL are arranged therein, and the other area is defined as the non-display area NDA. In one or more embodiments, the base layer SUB may include the display area DA including a plurality of pixel areas in which the pixels PXL are formed and the non-display area NDA disposed at the periphery of the display area DA. Various lines and/or a built-in circuit, which are connected to the pixels PXL of the display area DA may be disposed in the non-display area NDA.

The pixel PXL may include at least one light emitting element LD, e.g., at least one bar type light emitting diode in accordance with any one of the embodiments shown in FIGS. 1A-4B, which is driven by a corresponding scan signal and a corresponding data signal. For example, the pixel PXL may include a plurality of bar type light emitting diodes which have a size small to a degree of nano scales to micro scales and are connected in parallel or series to each other. The plurality of bar type light emitting diodes may constitute a light source of the pixel PXL.

Although one or more embodiments in which the pixels PXL are arranged in a stripe shape is illustrated in FIG. 5, the present disclosure is not limited thereto. For example, the pixels PXL may be arranged in various suitable pixel arrangement forms that are known to those skilled in the art.

FIGS. 6A-6E are circuit diagrams illustrating an example of the pixel included in the display device shown in FIG. 5, according to one or more embodiments of the present disclosure.

Figure 6A:
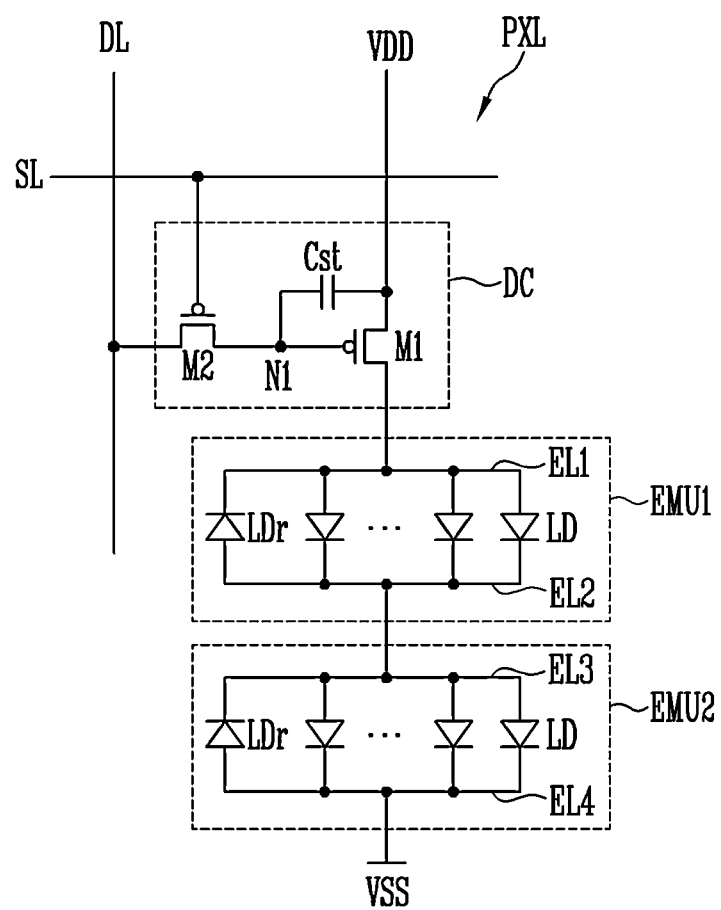
FIGS. 6A-6E are circuit diagrams illustrating an example of a pixel included in the display device shown in FIG. 5.

First, referring to FIG. 6A, the pixel PXL may include light emitting units EMU1 and EMU2 and a pixel driving circuit DC for driving the light emitting units EMU1 and EMU2.

The light emitting units EMU1 and EMU2 may be connected in series to each other between a first power source VDD (or first driving power source) and a second power source VSS (or second driving power source). Each of the light emitting units EMU1 and EMU2 may include a plurality of light emitting elements LD connected in parallel between the first power source VDD (or a first power line to which the first power source VDD is applied) and the second power source VSS (or a second power line to which the second power source VSS is applied).

A first light emitting unit EMU1 may include a first electrode EU (or first alignment electrode) connected to the first power source VDD via the pixel driving circuit DC, a second electrode EL2 (or second alignment electrode) connected to the second power source VSS via a second light emitting unit EMU2, and a plurality of light emitting elements LD connected in parallel in the same direction between the first and second electrodes EL1 and EL2. For example, the first electrode EL1 may be an anode electrode, and the second electrode EL2 may be a cathode electrode.

In one or more embodiments, the second light emitting unit EMU2 may include a third electrode EL3 (or third alignment electrode) connected to the first power source VDD via the first light emitting unit EMU1 and the pixel driving circuit DC, a fourth electrode EL4 (or fourth alignment electrode) connected to the second power source VSS, and a plurality of light emitting element LD connected in parallel in the same direction between the third and fourth electrodes EL3 and EL4. For example, the third electrode EL3 may be an anode electrode, and the fourth electrode EL4 may be a cathode electrode.

Each of the light emitting elements LD included in the light emitting units EMU1 and EMU2 may include a first end portion connected to the first power source VDD through the first electrode EU (or third electrode EL3) and a second end portion connected to the second power source VSS through the second electrode EL2 (or fourth electrode EL4). The first power source VDD may be set as a high-potential power source, and the second power source VSS may be set as a low-potential power source. A potential difference between the first and second power sources VDD and VSS may be set to be greater than or equal to a threshold voltage of the light emitting elements LD during an emission period of the pixel PXL.

As described above, each of the light emitting elements LD connected in parallel in the same direction (e.g., a forward direction) between the first electrode EL1 and the second electrode EL2, to which difference voltages are respectively supplied, may form an effective light source.

The light emitting elements LD of the light emitting units EMU1 and EMU2 may emit light with a luminance corresponding to a driving current supplied through the corresponding pixel driving circuit DC. For example, the pixel driving circuit DC may supply, to the light emitting units EMU1 and EMU2, a driving current corresponding to a grayscale value of corresponding frame data during each frame period. The driving current supplied to each of the light emitting units EMU1 and EMU2 may be divided to flow through the light emitting elements LD connected in the same direction (e.g., in parallel connection with each other). For example, the light emitting units EMU1 and EMU2 can emit light with a luminance corresponding to the driving current while each light emitting element LD is emitting light with a luminance corresponding to a current flowing therethrough.

In some embodiments, the light emitting units EMU1 and EMU2 may further include at least one ineffective light source in addition to the light emitting elements LD forming the respective effective light sources. For example, at least one reverse light emitting element LDr may be further connected between the first and second electrodes EL1 and EL2 of the first light emitting unit EMU1. The reverse light emitting element LDr along with the light emitting elements LD forming the effective light sources (e.g., the light emitting elements LD connected in the forward direction) are connected in parallel between the first and second electrodes EU and EL2. However, the reverse light emitting element LDr may be connected between the first and second electrodes EU and EL2 in a direction opposite to that in which the light emitting elements LD are connected. Although a driving voltage (e.g., a set or predetermined driving voltage or a forward driving voltage) is applied between the first and second electrodes EL1 and EL2, the reverse light emitting element LDr may maintain an inactive state, and accordingly, substantially no current may flow through the reverse light emitting element LDr.

In some embodiments of the present disclosure, the pixel driving circuit DC may include a first transistor M1, a second transistor M2, and a storage capacitor Cst.

A first electrode of the first transistor M1 (e.g., a driving transistor) may be connected to the first power source VDD, and a second electrode of the first transistor M1 may be electrically connected to a first electrode (e.g., an anode electrode) of the light emitting element LD. For example, the second electrode of the first transistor M1 may be electrically connected to the first electrode EL1 (or first alignment electrode) of the first light emitting unit EMU1. A gate electrode of the first transistor M1 may be connected to a first node N1. The first transistor M1 may control an amount of driving current supplied to the light emitting element LD, corresponding to a voltage of the first node N1. For example, the first transistor M1 may control an amount of the driving current supplied to each of the light emitting elements LD of the first light emitting unit EMU1 and the second light emitting unit EMU2.

A first electrode of the second transistor M2 (e.g., a switching transistor) may be connected to a data line DL, and a second electrode of the second transistor M2 may be connected to the first node N1. The first electrode and the second electrode of the second transistor M2 are different electrodes. For example, when the first electrode is a source electrode, the second electrode may be a drain electrode. A gate electrode of the second transistor M2 may be connected to a line (e.g., a first scan line SL).

The second transistor M2 may be turned on when a scan signal having a voltage (e.g., a gate-on voltage) at which the first transistor M1 can be turned on is supplied from the line (e.g., a first scan line SL), to electrically connect the data line DL and the first node N1. A data signal of a corresponding frame may be supplied to the data line DL. Accordingly, the data signal may be transferred to the first node N1. The data signal transferred to the first node N1 may be stored in the storage capacitor Cst.

One electrode of the storage capacitor Cst may be connected to the first power source VDD, and the other electrode of the storage capacitor Cst may be connected to the first node N1. The storage capacitor Cst may be charged with a voltage corresponding to the data signal supplied to the first node N1, and maintain the charged voltage until a data signal of a next frame is supplied.

For convenience of description, the pixel driving circuit DC having a relatively simple structure has been illustrated, which includes the second transistor M2 for transferring a data signal to the inside of the pixel PXL, the storage capacitor Cst for storing the data signal, and the first transistor M1 for supplying a driving current corresponding to the data signal to the light emitting element LD.

However, the present disclosure is not limited thereto, and the structure of the pixel driving circuit DC may be variously modified and embodied. In one or more embodiments, the pixel driving circuit DC may further additionally include various types of transistors such as a compensation transistor for compensating for a threshold voltage of the first transistor M1, an initialization transistor for initializing the first node N1, and/or an emission control transistor for controlling the emission time of the light emitting element LD, or other circuit elements such as a boosting capacitor for boosting the voltage of the first node N1.

Although a case where all the transistors, e.g., the first and second transistors M1 and M2 included in the pixel driving circuit DC are P-type transistors is illustrated in FIG. 6A, the present disclosure is not limited thereto. For example, at least one of the first and second transistors M1 and M2 included in the pixel driving circuit DC may be changed to an N-type transistor.

Figure 6B:
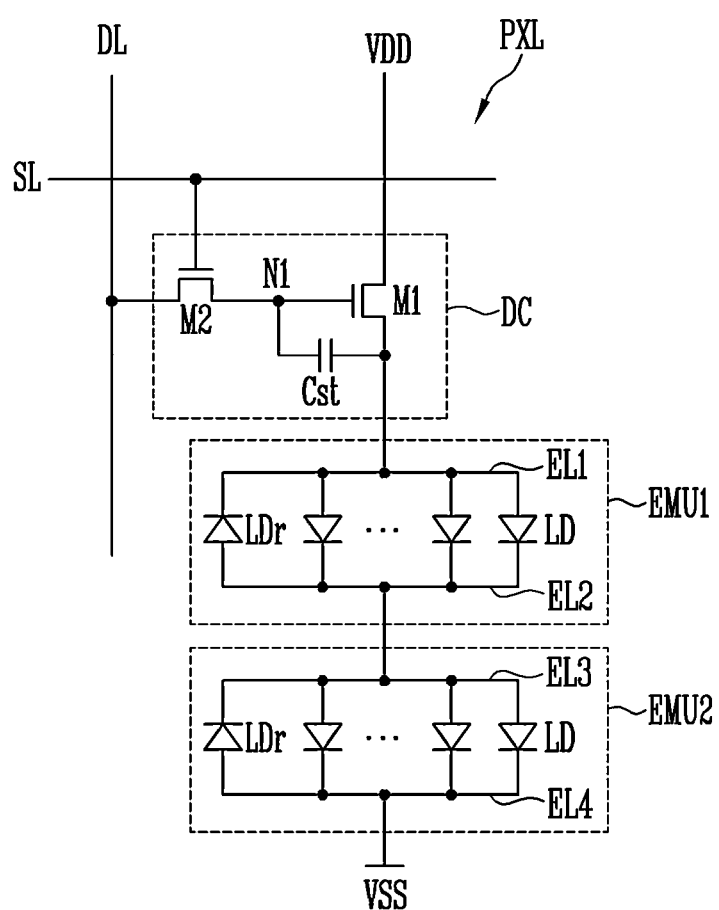

For example, as shown in FIG. 6B, the first and second transistors M1 and M2 of the pixel driving circuit DC may be implemented with an N-type transistor. A configuration or operation of the pixel driving circuit DC shown in FIG. 6B may be similar to that of the pixel driving circuit DC shown in FIG. 6A, except that connection positions of some components (e.g., the storage capacitor Cst connected between the first node N1 and the second electrode of the first transistor M1) are changed due to a change in the transistor type. Therefore, a detailed description of this will not be repeated.

Figure 6C:
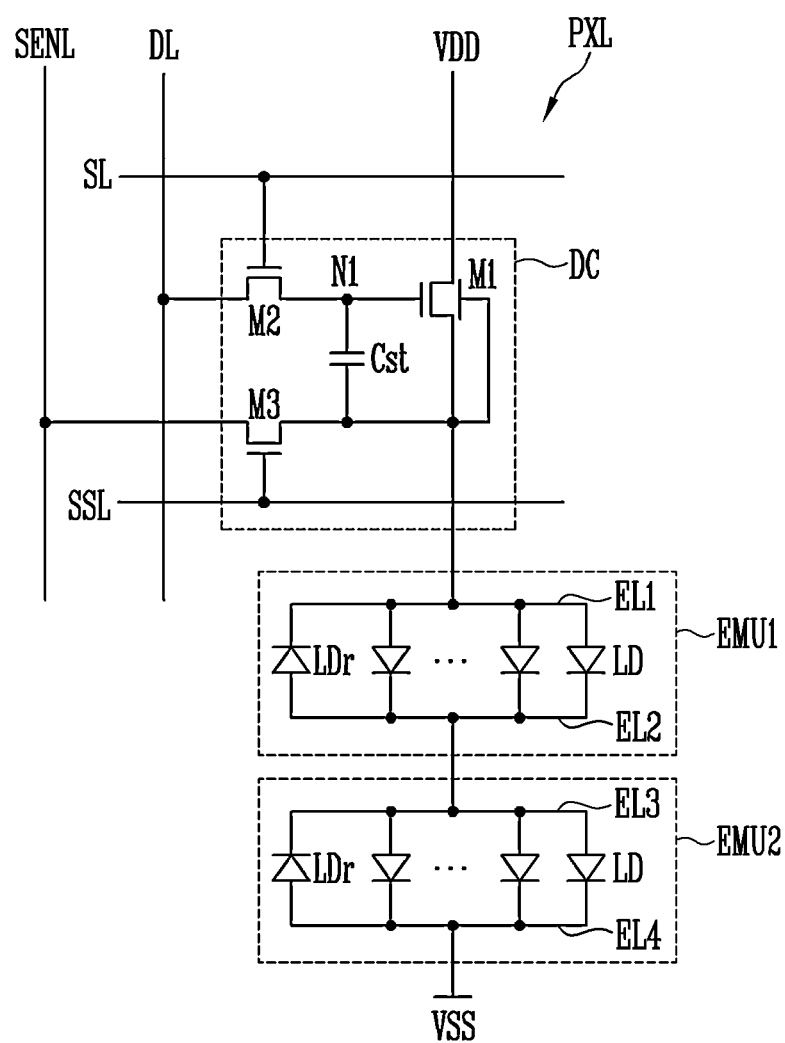

In one or more embodiments, referring to FIG. 6C, the pixel PXL may further include a third transistor M3 (e.g., a sensing transistor).

A gate electrode of the third transistor M3 may be connected to a sensing signal line SSL. One electrode of the third transistor M3 may be connected to a sensing line SENL, and the other electrode of the third transistor M3 may be connected to an anode electrode of the light emitting element LD. For example, the other electrode of the third transistor M3 may be electrically connected to the first electrode EL1 (or first alignment electrode) of the first light emitting unit EMU1 and the second electrode of the first transistor M1. The third transistor M3 may transfer a voltage value of the anode electrode of the light emitting element LD to the sensing line SENL according to a sensing signal supplied to the sensing signal line SSL in a sensing period. The voltage value transferred through the sensing line SENL may be provided to an external circuit (e.g., a timing controller), and the external circuit may extract a characteristic information of the pixel PXL (e.g., the threshold voltage of the first transistor M1, etc.), based on the provided voltage value. The extracted characteristic information may be used to convert image data such that a characteristic variation of the pixel PXL is compensated.

In one or more embodiments, the first transistor M1 may further include a back gate electrode connected to the first electrode EL1 (or first alignment electrode) of the first light emitting unit EMU1. The back gate electrode may be disposed to overlap the gate electrode with an insulating layer interposed therebetween. The back gate electrode may constitute a body of the first transistor M1, and serve as the gate electrode.

In one or more embodiments, although a case where the pixel PXL includes two light emitting units EMU1 and EMU2 is illustrated in FIG. 6C (and also in FIGS. 6A, and 6B), the pixel PXL is not limited thereto.

Figure 6D:
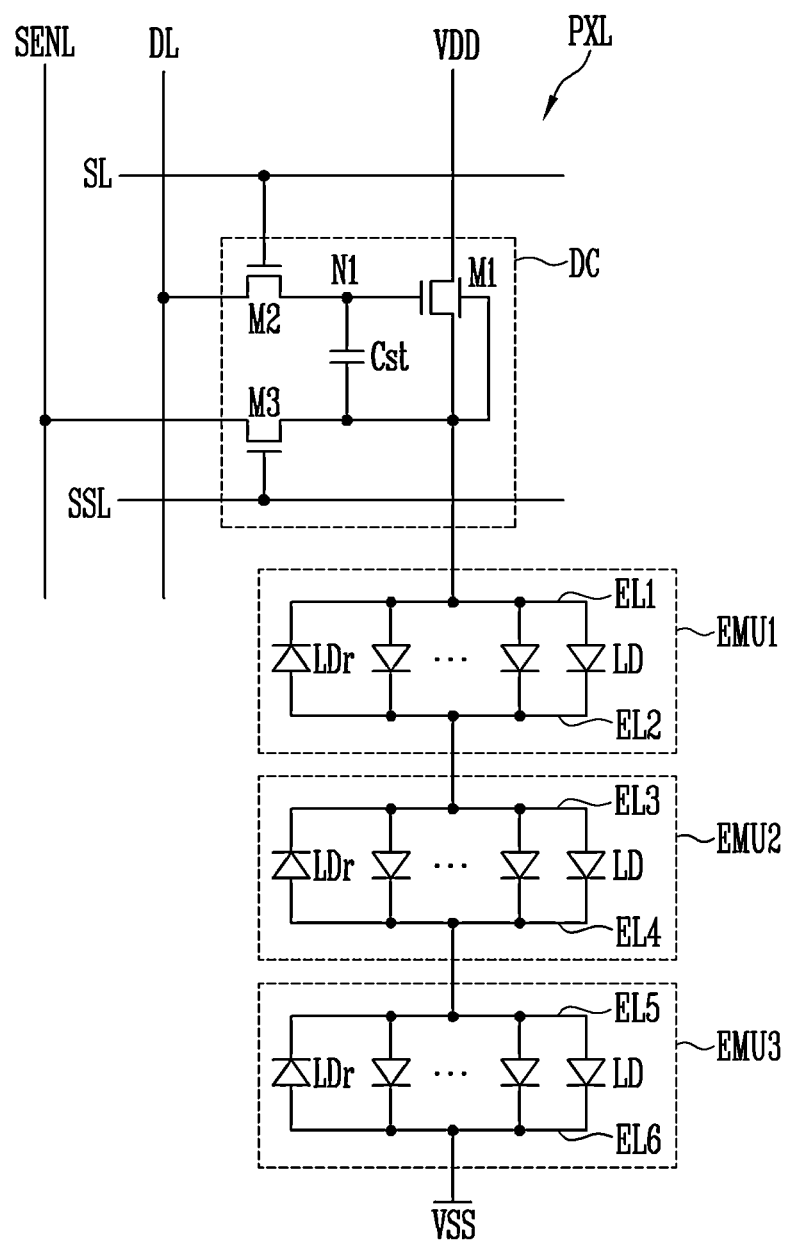

For example, as shown in FIG. 6D, the pixel PXL may further include a third light emitting unit EMU3 in addition to the first and second light emitting units EMU1 and EMU2. The first to third light emitting units EMU1, EMU2, and EMU3 may be connected in series to each other between the first power source VDD and the second power source VSS.

The third light emitting unit EMU3 may include a fifth electrode EL5 (or fifth alignment electrode) connected to the first power source VDD via the pixel driving circuit DC, a sixth electrode EL6 (or sixth alignment electrode) connected to the second power source VSS, and a plurality of light emitting elements LD connected in parallel in the same direction between the fifth and sixth electrodes EL5 and EL6. For example, the fifth electrode EL5 may be an anode electrode, and the sixth electrode EL6 may be a cathode electrode. In one or more embodiments, at least one reverse light emitting element LDr may be further connected between the fifth electrode EL5 (or fifth alignment electrode) and the sixth electrode EL6 (or sixth alignment electrode) of the third light emitting unit EMU3.

Figure 6E:
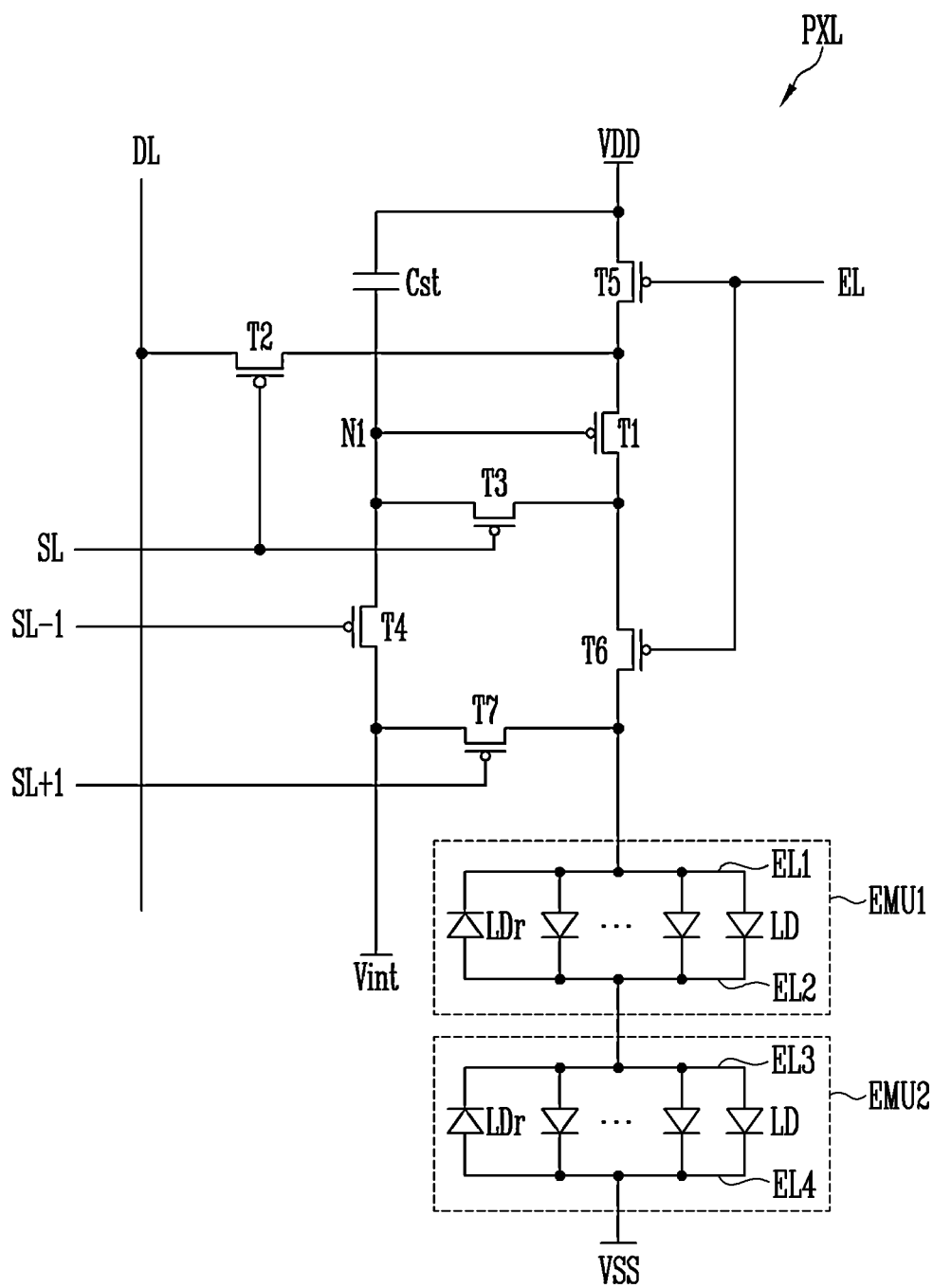

Referring to FIG. 6E, a pixel PXL in accordance with one or more embodiments of the present disclosure may include a light emitting element LD (e.g., one or more light emitting elements LD are connected in parallel with each other in each of the first light emitting unit EMU1 and the second light emitting unit EMU2, where the first light emitting unit EMU1 and the second light emitting unit EMU2 are connected in series, as discussed with respect to FIGS. 6A-6C), first to seventh transistors T1, T2, T3, T4, T5, T6, and T7, and a storage capacitor Cst.

A first electrode (e.g., an anode electrode) of the light emitting element LD may be connected to the first transistor T1 via the sixth transistor T6, and a second electrode (e.g., a cathode electrode) of the light emitting element LD may be connected to the second power source VSS. For example, the first electrode EU of the first light emitting unit EMU1 may be connected to the first transistor T1 via the sixth transistor T6, and the fourth electrode EL4 of the second light emitting unit EMU2 may be connected to the second power source VSS. The light emitting element LD may emit light with a luminance (e.g., a set or predetermined luminance) corresponding to an amount of driving current supplied from the first transistor T1.

One electrode of the first transistor T1 (e.g., a driving transistor) may be connected to the first power source VDD via the fifth transistor T5, and another electrode of the first transistor T1 may be connected to the first electrode of the light emitting element LD via the sixth transistor T6. The first transistor T1 may control an amount of current flowing from the first power source VDD to the second power source VSS via the light emitting element LD (e.g., one or more light emitting elements LD in each of the first light emitting unit EMU1 and the second light emitting unit EMU2).

The second transistor T2 (e.g., a switching transistor) may be connected between a data line DL and the one electrode of the first transistor T1. In one or more embodiments, a gate electrode of the second transistor T2 may be connected to a first scan line SL. The second transistor T2 may be turned on when a scan signal having a gate-on voltage is supplied to the first scan line SL, to electrically connect the data line DL and the one electrode of the first transistor T1.

The third transistor T3 may be connected between the another electrode of the first transistor T1 and a first node N1. In one or more embodiments, a gate electrode of the third transistor T3 may be connected to the first scan line SL. The third transistor T3 may be turned on when a scan signal having a gate-on voltage is supplied to the first scan line SL, to electrically connect the another electrode of the first transistor T1 and the first node N1.

The fourth transistor T4 may be connected between the first node N1 and an initialization power source Vint. In one or more embodiments, a gate electrode of the fourth transistor T4 may be connected to a second scan line SL−1 (e.g., a previous scan line). The fourth transistor T4 may be turned on when a scan signal having a gate-on voltage is supplied to the second scan line SL−1, to supply a voltage of the initialization power source Vint to the first node N1. The initialization power source Vint may be set to a voltage lower than that of a data signal. The scan signal supplied to the second scan line SL−1 may have the same waveform as a scan signal supplied to a first scan line of a previous stage pixel.

The fifth transistor T5 may be connected between the first power source VDD and the one electrode of the first transistor T1. A gate electrode of the fifth transistor T5 may be connected to an emission control line EL. The fifth transistor T5 may be turned on when an emission control signal having a gate-on voltage is supplied to the emission control line EL, and be turned off in other cases.

The sixth transistor T6 may be connected between the another electrode of the first transistor T1 and the first electrode of the light emitting element LD (e.g., the first electrode EL1 of the first light emitting unit EMU1). A gate electrode of the sixth transistor T6 may be connected to the emission control line EL. The sixth transistor T6 may be turned on when an emission control signal having a gate-on voltage is supplied to the emission control line EL, and be turned off in other cases.

The seventh transistor T7 may be connected between the initialization power source Vint and the first electrode (e.g. the anode electrode) of the light emitting element LD (e.g., the first electrode EL1 of the first light emitting unit EMU1). In one or more embodiments, a gate electrode of the seventh transistor T7 may be connected to a third scan line SL+1 (e.g., a next scan line). The seventh transistor T7 may be turned on when a scan signal having a gate-on voltage is supplied to the third scan line SL+1, to supply the voltage of the initialization power source Vint to the first electrode of the light emitting element LD (e.g., the first electrode EU of the first light emitting unit EMU1). The scan signal supplied to the third scan line SL+1 may have the same waveform as a scan signal supplied to a first scan line of a next stage pixel.

A case where the gate electrode of the seventh transistor T7 is connected to the third scan line SL+1 is illustrated in FIG. 6E. However, the scope of the technical concept of the present disclosure is not limited thereto. For example, in another embodiment of the present disclosure, the gate electrode of the seventh transistor T7 may be connected to the first scan line SL or the second scan line SL−1. The voltage of the initialization power source Vint may be supplied to the anode electrode of the light emitting element LD (e.g., the first electrode EL1 of the first light emitting unit EMU1) via the seventh transistor T7, when a scan signal having a gate-on voltage is supplied to the first scan line SL or the second scan line SL−1.

The storage capacitor Cst may be connected between the first power source VDD and the first node N1. A voltage corresponding to the data signal and the threshold voltage of the first transistor T1 may be stored in the storage capacitor Cst.

In one or more embodiments, although a case where all the transistors, e.g., the first to seventh transistors T1, T2, T3, T4, T5, T6, and T7 included in the pixel driving circuit DC are P-type transistors has been illustrated in FIG. 6E, the present disclosure is not limited thereto. For example, at least one of the first to seventh transistors T1, T2, T3, T4, T5, T6, and T7 may be changed to an N-type transistor.

Figure 7:
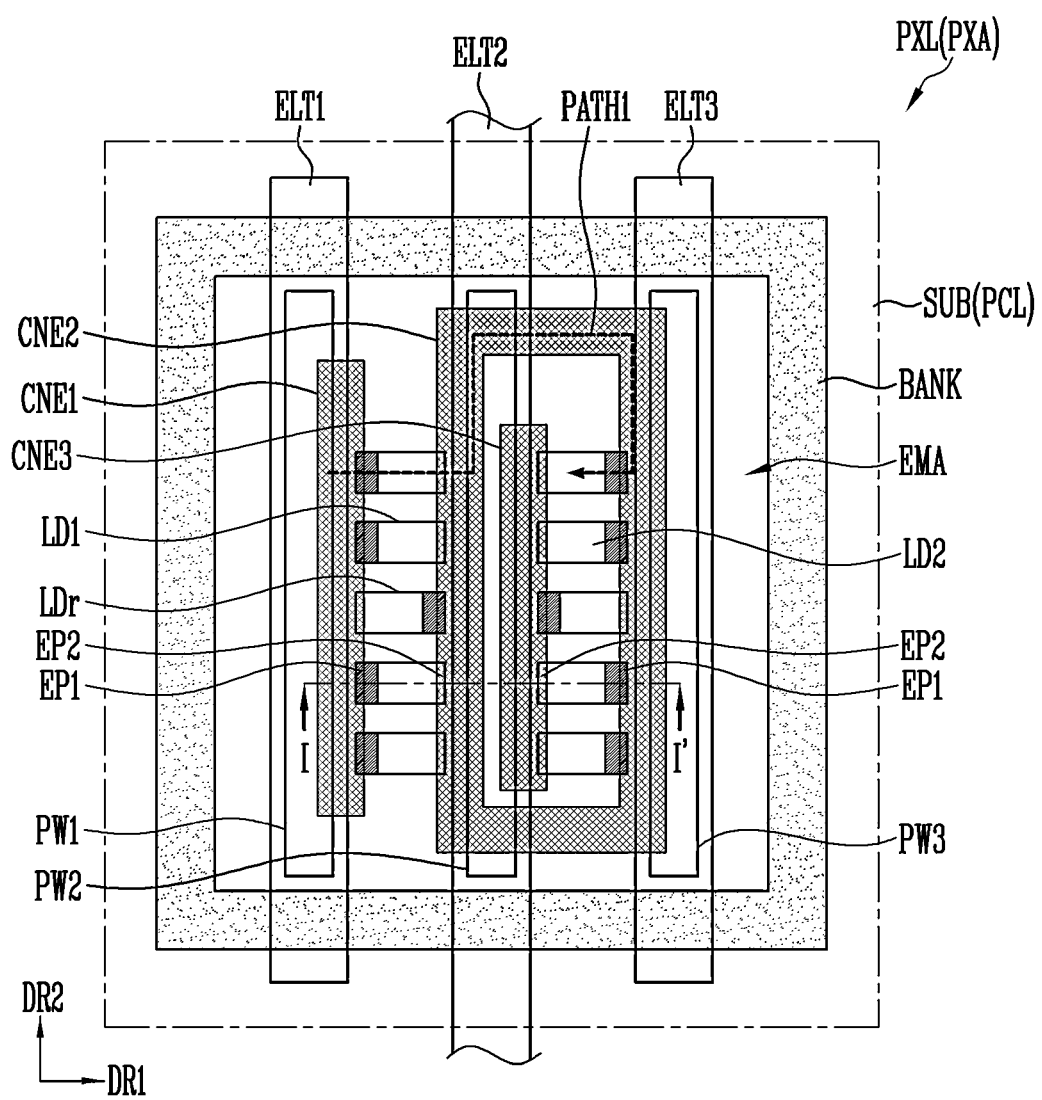
FIG. 7 is a plan view illustrating an example of the pixel included in the display device shown in FIG. 5.

FIG. 7 is a plan view illustrating an example of the pixel included in the display device shown in FIG. 5, according to one or more embodiments of the present disclosure. A structure of the pixel PXL is illustrated in FIG. 7, based on a light emitting element layer LDL (see FIG. 8A) in which light emitting elements LD are disposed (or the light emitting units EMU1 and EMU2 described with reference to FIG. 6C).

Referring to FIG. 7, the pixel PXL may be formed in a pixel area PXA defined on the base layer SUB. The pixel area PXA may include a light emitting area EMA. In some embodiments, the pixel PXL may include a bank BANK (or a partition wall), and the light emitting area EMA may be defined by the bank BANK surrounding the light emitting area EMA.

The pixel PXL may include a first electrode ELT1, a second electrode ELT2, and a third electrode ELT3, which are sequentially arranged along a first direction DR1. Each of the first electrode ELT1, the second electrode ELT2, and the third electrode ELT3 may correspond to one of the first to fourth electrodes EL1 to EL4 described with reference to FIGS. 6A, 6B, 6C, and 6E.

Each of the first electrode ELT1, the second electrode ELT2, and the third electrode ELT3 may extend in a second direction DR2 crossing the first direction DR1, and the first electrode ELT1, the second electrode ELT2, and the third electrode ELT3 may be disposed to be spaced from each other along the first direction DR1. However, the first electrode ELT1, the second electrode ELT2, and the third electrode ELT3 are not limited thereto. For example, the shapes and/or mutual arrangement relationship of the first electrode ELT1, the second electrode ELT2, and the third electrode ELT3 may be variously changed.

In some embodiments, a length of the second electrode ELT2 in the second direction DR2 may be longer than that of each of the first electrode ELT1 and the third electrode ELT3 in the second direction DR2. As shown in FIG. 7, the first electrode ELT1 and the third electrode ELT3 may be disposed in the pixel area PXA, and the second electrode ELT2 may extend up to another pixel area adjacent to the pixel area PXA. Although will be described later, the first electrode ELT1 may be connected to the first transistor M1 described with reference to FIG. 6A, etc., and the second electrode ELT2 may be connected to the second power source VSS (or the second power line) described with reference to FIG. 6A, etc. The first electrode ELT1, the second electrode ELT2, and the third electrode ELT3 may overlap the bank BANK, and an end portion of each of the first electrode ELT1 and the third electrode ELT3 may be more adjacent to an edge of the pixel area PXA than the bank BANK. The first electrode ELT1 and the third electrode ELT3 may extend up to adjacent pixel areas before light emitting elements LD1 and LD2 are supplied, and may be cut (or partially removed) at the outside of the bank BANK after the light emitting elements LD1 and LD2 are supplied and arranged in the pixel area PXA.

In some embodiments, each of the first electrode ELT1, the second electrode ELT2, and the third electrode ELT3 may have a single or multi-layered structure. In one or more embodiments, each of the first electrode ELT1, the second electrode ELT2, and the third electrode ELT3 may have a multi-layered structure including a reflective electrode and a conductive capping layer. The reflective electrode may have a single or multi-layered structure. In one or more embodiments, the reflective electrode may include at least one reflective conductive layer, and further include at least one transparent conductive layer disposed on the top and/or the bottom of the reflective conductive layer.

In some embodiments, the pixel PXL may include a first bank pattern PW1 overlapping one area of the first electrode ELT1, a second bank pattern PW2 overlapping one area of the second electrode ELT2, and a third bank pattern PW3 overlapping one area of the third electrode ELT3.

The first bank pattern PW1, the second bank pattern PW2, and the third bank pattern PW3 may be disposed in the light emitting area EMA to be spaced from each other, and respectively allow one areas of the first electrode ELT1, the second electrode ELT2, and the third electrode ELT3 to protrude in an upper direction. For example, the first electrode ELT1 may be disposed on the first bank pattern PW1 to protrude in a height direction (or thickness direction) of the base layer SUB due to the first bank pattern PW1, the second electrode ELT2 may be disposed on the second bank pattern PW2 to protrude in the height direction of the base layer SUB due to the second bank pattern PW2, and the third electrode ELT3 may be disposed on the third bank pattern PW3 to protrude in the height direction of the base layer SUB due to the third bank pattern PW3.

The pixel PXL may include a first light emitting element LD1 and a second light emitting element LD2. Also, the pixel PXL may include the reverse light emitting element LDr described with reference to FIG. 6A, etc.

The first light emitting element LD1 may be disposed between the first electrode ELT1 and the second electrode ELT2. A first end portion EP1 of the first light emitting element LD1 may face the first electrode ELT1, and a second end portion EP2 of the first light emitting element LD1 may face the second electrode ELT2. When the first light emitting element LD1 is provided in plurality, the plurality of first light emitting elements LD1 may be connected in parallel to each other between the first electrode ELT1 and the second electrode ELT2, and constitute the first light emitting unit EMU1 described with reference to FIG. 6A, etc.

In one or more embodiments, the second light emitting element LD2 may be disposed between the second electrode ELT2 and the third electrode ELT3. A first end portion EP1 of the second light emitting element LD2 may face the third electrode ELT3, and a second end portion EP2 of the second light emitting element LD2 may face the second electrode ELT2. The second end portion EP2 of the first light emitting element LD1 and the second end portion EP2 of the second light emitting element LD2 may include the same type semiconductor layer (e.g., the first semiconductor layer 11 described with reference to FIG. 1A), and face each other with the second electrode ELT2 interposed therebetween. When the second light emitting element LD2 is provided in plurality, the plurality of second light emitting elements LD2 may be connected in parallel to each other between the second electrode ELT2 and the third electrode ELT3, and constitute the second light emitting unit EMU2 described with reference to FIG. 6A, etc.

In one or more embodiments, although a case where the light emitting elements LD1 and LD2 are aligned in the first direction DR1, e.g., in a lateral direction crossing the first electrode ELT1, the second electrode ELT2, and the third electrode ELT3, has been illustrated in FIG. 7, the arrangement direction of the light emitting elements LD1 and LD2 is not limited thereto. For example, at least one of the light emitting elements LD1 and LD2 may be arranged in an oblique direction.

The first light emitting element LD1 and the second light emitting element LD2 may be electrically connected between the first electrode ELT1 and the second electrode ELT2. For example, the first end portion EP1 of the first light emitting element LD1 may be electrically connected to the first electrode ELT1, and the second end portion EP2 of the second light emitting element LD2 may be electrically connected to the second electrode ELT2.

In one or more embodiments, the first end portion EP1 of the first light emitting element LD1 is not disposed directly on the first electrode ELT1, but may be electrically connected to the first electrode ELT1 through at least one contact electrode, e.g., a first contact electrode CNE1. Similarly, the second end portion EP2 of the second light emitting element LD2 is not disposed directly on the second electrode ELT2, but may be electrically connected to the second electrode ELT2 through at least one contact electrode, e.g., a third contact electrode CNE3. However, the present disclosure is not limited thereto. For example, in another embodiment of the present disclosure, the first end portion EP1 of the first light emitting element LD1 may be in direct contact with the first electrode ELT1, to be electrically connected to the first electrode ELT1.

In some embodiments, each of the light emitting elements LD1 and LD2 may be a light emitting diode having a micro size, e.g., a size small to a degree of nano scales or micro scales, which is fabricated using a material having an inorganic crystalline structure. For example, each of the first light emitting element LD1 and the second light emitting element LD2 may be the light emitting element LD shown in any one of FIGS. 1A-4B.

In some embodiments, the light emitting elements LD1 and LD2 may be prepared in a form in which the light emitting elements LD1 and LD2 are dispersed in a solution (e.g., a set or predetermined solution), to be supplied to the light emitting area EMA of the pixel area PXA through an inkjet printing process, a slit coating process, or the like. In one or more embodiments, the light emitting elements LD1 and LD2 may be supplied to the light emitting area EMA while being mixed in a volatile solvent. When a voltage (e.g., a set or predetermined voltage) is applied between the first electrode ELT1 and the second electrode ELT2 and between the second electrode ELT2 and the third electrode ELT3, the light emitting elements LD1 and LD2 are self-aligned between the first electrode ELT1 and the second electrode ELT2 and between the second electrode ELT2 and the third electrode ELT3, while an electric field is being formed between the first electrode ELT1 and the second electrode ELT2 and between the second electrode ELT2 and the third electrode ELT3. After the light emitting elements LD1 and LD2 are aligned, the solvent is volatilized or removed through another process, so that the light emitting elements LD1 and LD2 can be stably arranged between the first electrode ELT1, the second electrode ELT2, and between the second electrode ELT2 and the third electrode ELT3, respectively.

In some embodiments, the pixel PXL may also include a third contact electrode CNE3 in addition to the first contact electrode CNE1 and the second contact electrode CNE2.

The first contact electrode CNE1 may be formed at the first end portion EP1 of the first light emitting element LD1 and at least one area of the first electrode ELT1, which corresponds to the first end portion EP1, to physically and/or electrically connect the first end portion EP1 of the first light emitting element LD1 to the first electrode ELT1.

The second contact electrode CNE2 may be formed on the second end portion EP2 of the first light emitting element LD1 and at least one area of the second electrode ELT2, which corresponds to the second end portion EP2. Also, the second contact electrode CNE2 may extend while detouring the third contact electrode CNE3 or the second light emitting element LD2, and be formed on the first end portion EP1 of the second light emitting element LD2 and at least one area of the third electrode ELT3, which corresponds to the first end portion EP1. The second contact electrode CNE2 may electrically connect the second end portion EP2 of the first light emitting element LD1 and the first end portion EP1 of the second light emitting element LD2.

As shown in FIG. 7, the second contact electrode CNE2 is spaced from the third contact electrode CNE3, and may have a closed loop shape surrounding the third contact electrode CNE3.

The third contact electrode CNE3 may be formed on the second end portion EP2 of the second light emitting element LD2 and at least one area of the second electrode ELT2, which corresponds to the second end portion EP2, to physically and/or electrically connect the second end portion EP2 of the second light emitting element LD2 to the second electrode ELT2. Therefore, the first light emitting element LD1 and the second light emitting element LD2 may be connected in series between the first electrode ELT1 and the second electrode ELT2 through the first contact electrode CNE1, the second contact electrode CNE2, and the third contact electrode CNE3.

The light emitting elements LD1 and LD2 gathered in the pixel area PXA may constitute a light source of the corresponding pixel PXL. In one or more embodiments, when a driving current flows along a first path PATH1 or the like in the pixel PXL during each frame period, the pixel PXL may emit light with a luminance corresponding to the driving current while the light emitting elements LD1 and LD2 connected in the forward direction between the first electrode ELT1 and the second electrode ELT2 of the pixel PXL are emitting light.

Figure 8A:
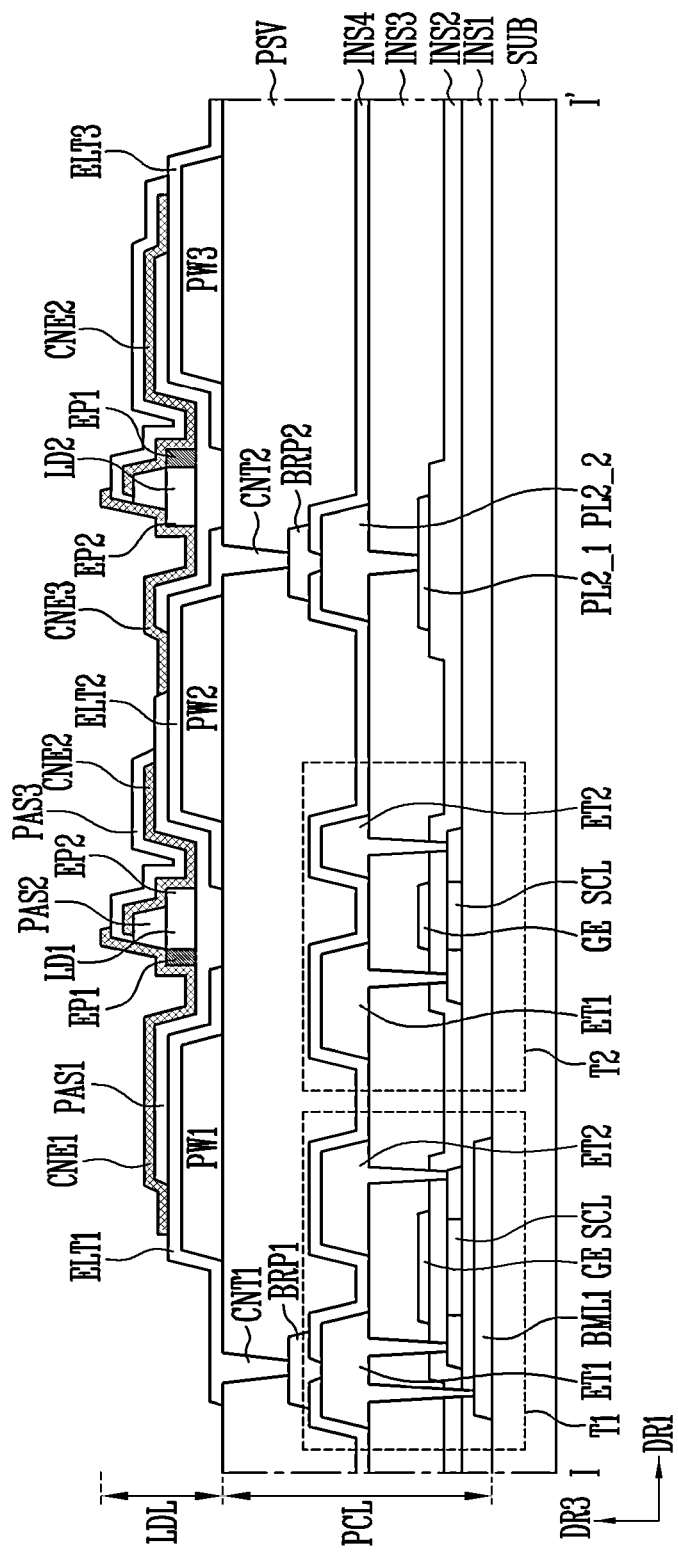
FIGS. 8A and 8B are sectional views illustrating an example of the pixel taken along the line I-I' shown in FIG. 7.
Figure 8B:
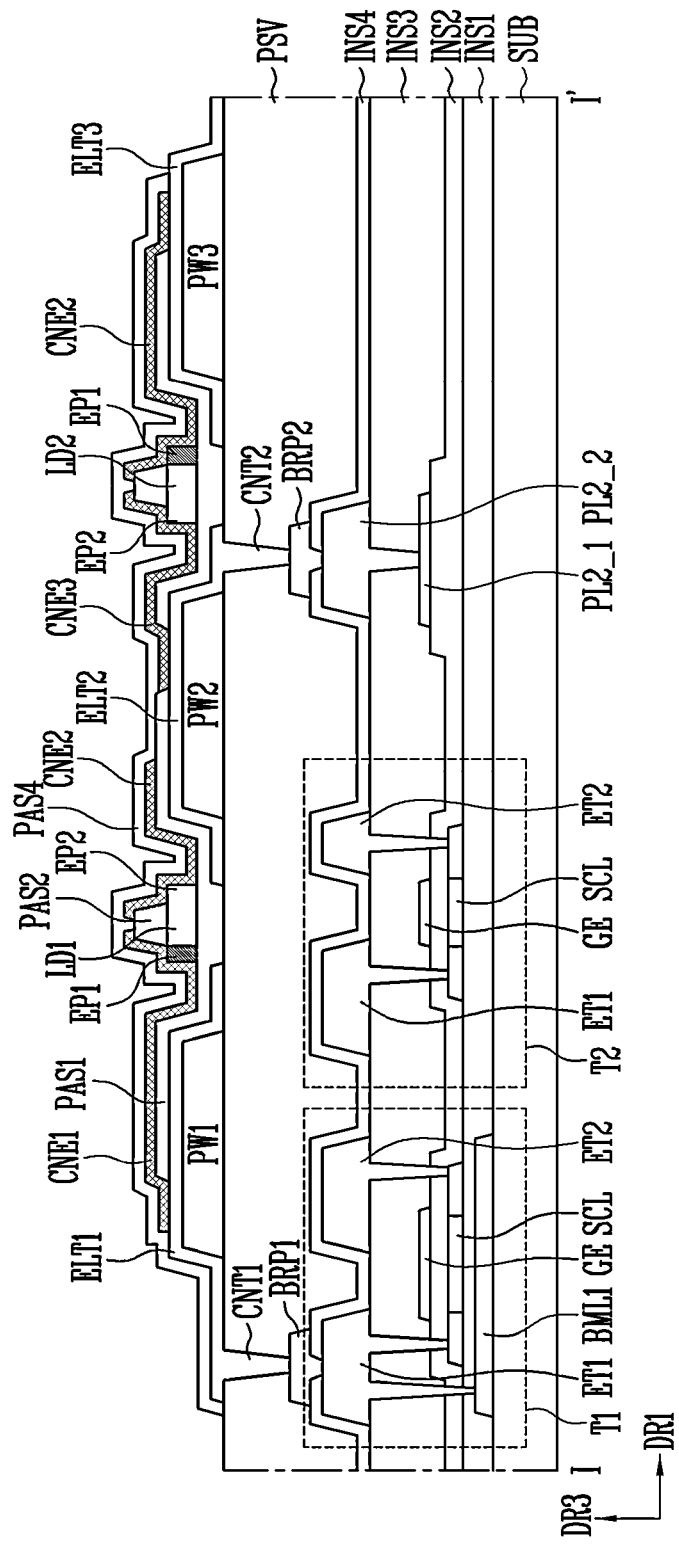

FIGS. 8A and 8B are sectional views illustrating an example of the pixel taken along the line I-I' shown in FIG. 7, according to one or more embodiments of the present disclosure.

Referring to FIG. 8A, a pixel circuit layer PCL and a light emitting element layer LDL may be sequentially disposed on the base layer SUB. In some embodiments, the pixel circuit layer PCL and the light emitting element layer LDL may be entirely formed in the display area DA of the display panel PNL (see FIG. 5).

The pixel circuit layer PCL may include a first conductive layer, a first insulating layer INS1, a semiconductor layer, a second insulating layer INS2, a second conductive layer, a third insulating layer INS3, a third conductive layer, a fourth insulating layer INS4, a fourth conductive layer, and a protective layer PSV. As shown in FIG. 8A, the first conductive layer, the first insulating layer INS1, the semiconductor layer, the second insulating layer INS2, the second conductive layer, the third insulating layer INS3, the third conductive layer, the fourth insulating layer INS4, the fourth conductive layer, and the protective layer PSV may be sequentially stacked on the base layer SUB.

The first conductive layer may be disposed on the base layer SUB, and include a back gate electrode BML1. The back gate electrode BML1 may be substantially identical to the back gate electrode described with reference to FIG. 6C, and form a back gate electrode of a first transistor T1. The first transistor T1 may be the first transistor M1 described with reference to FIGS. 6A-6D or the first transistor T1 described with reference to FIG. 6E. In one or more embodiments, a second transistor T2 may be the second transistor M2 described with reference to FIGS. 6A-6D or the second transistor T2 described with reference to FIG. 6E, and may be substantially identical or similar to the first transistor T1 except the back gate electrode BML1. Therefore, the pixel circuit layer PCL will be described based on the first transistor T1.

In some embodiments, a buffer layer may be disposed between the first conductive layer and the base layer SUB. The buffer layer may be disposed on the entire surface of the base layer SUB. The buffer layer may prevent (or protect from) diffusion of impurity ions, prevent (or protect from) penetration of moisture or external air, and perform a surface planarization function. The buffer layer may include silicon nitride, silicon oxide, silicon oxynitride, or the like.

The first insulating layer INS1 may be disposed on the base layer SUB and the first conductive layer (e.g., the back gate electrode BML1 of the first conductive layer). The first insulating layer INS1 may be roughly disposed throughout the entire surface of the base layer SUB.

The first insulating layer INS1 may include an inorganic insulating material such as silicon oxide, silicon nitride, silicon oxynitride, hafnium oxide, aluminum oxide, titanium oxide, tantalum oxide, or zinc oxide, or an organic insulating material such as polyacrylates resin, epoxy resin, phenolic resin, polyamides resin, unsaturated polyesters resin, polyphenylenethers resin, polyphenylenesulfides resin, or benzocyclobutene (BCB). The first insulating layer INS1 may be a single layer or a multi-layer in which layers made of different materials are stacked.

The semiconductor layer may be disposed on the first insulating layer INS1. The semiconductor layer may be an active layer forming a channel of the first transistor T1. The semiconductor layer may include a source region and a drain region, which are in contact with a first transistor electrode (or source electrode) and a second transistor electrode (or drain electrode), which will be described later. A region between the source region and the drain region may be a channel region.

The semiconductor layer may include a semiconductor pattern SCL. The semiconductor pattern SCL may form the channel of the first transistor T1 (or the second transistor T2).

The semiconductor pattern SCL may include an oxide semiconductor. The channel region of the semiconductor pattern SCL is a semiconductor pattern undoped with an impurity, and may be an intrinsic semiconductor. The source region and the drain region of the semiconductor pattern SCL may be semiconductor patterns doped with an impurity. An n-type impurity may be used as the impurity.

The second insulating layer INS2 (or gate insulating layer) may be disposed on the semiconductor layer and the first insulating layer INS1. The second insulating layer INS2 may be roughly disposed on the entire surface of the base layer SUB. The second insulating layer INS2 may be a gate insulating layer having a gate insulating function.

Like the first insulating layer INS1, the second insulating layer INS2 may include an inorganic insulating material such as a silicon compound or metal oxide.

The second conductive layer may be disposed on the second insulating layer INS2. The second conductive layer may include a gate electrode GE (or first conductive pattern) and a first sub-power line PL2_1. Also, the second conductive layer may further include lines (e.g., a scan line and a gate line) which are connected to the gate electrode GE or constitute the gate electrode GE, capacitor electrodes, and the like.

The gate electrode GE may be disposed to overlap the semiconductor pattern SCL, and form a gate electrode of the first transistor T1 (or the second transistor T2).

The second power source VSS described with reference to FIG. 6A, etc. may be applied to the first sub-power line PL2_1.

The second conductive layer may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), titanium (Ti), tantalum (Ta), tungsten (W), and copper (Cu). The second conductive layer may have a single or multi-layered structure.

The third insulating layer INS3 (or interlayer insulating layer) may be disposed on the second conductive layer, and be roughly disposed through the entire surface of the base layer SUB. The third insulating layer INS3 may function to insulate the second conductive layer and the third conductive layer from each other, and may be an interlayer insulating layer.

The third insulating layer INS3 may include an inorganic insulating material such as silicon oxide, silicon nitride, silicon oxynitride, hafnium oxide, aluminum oxide, titanium oxide, tantalum oxide, or zinc oxide, or an organic insulating material such as polyacrylates resin, epoxy resin, phenolic resin, polyamides resin, unsaturated polyesters resin, polyphenylenethers resin, polyphenylenesulfides resin, or benzocyclobutene (BCB). The third insulating layer INS3 may be a single layer or a multi-layer in which layers made of different materials are stacked.

The third conductive layer may be disposed on the third insulating layer INS3. The third conductive layer may include a first transistor electrode ET1 (or second conductive pattern), a second transistor electrode ET2 (or third conductive pattern), and the second sub-power line PL2_2. Also, the third conductive layer may further include lines (e.g., a data line) connected to at least one of the first transistor electrode ET1 and the second transistor electrode ET2, and power lines.

The first transistor electrode ET1 may overlap a partial region of the semiconductor pattern SCL (e.g., the source region of the first transistor T1 or the second transistor T2), and may be connected to the partial region of the semiconductor pattern SCL, which is exposed through a contact hole. The first transistor electrode ET1 may form a first electrode (e.g., a source electrode) of the first transistor T1 (or the second transistor T2).

In one or more embodiments, the second transistor electrode ET2 may overlap a partial region of the semiconductor pattern SCL (e.g., the drain region of the first transistor T1), and may be connected to the partial region of the semiconductor pattern SCL, which is exposed through a contact hole. The second transistor electrode ET2 may form a second electrode (e.g., a drain electrode) of the first transistor T1 (or the second transistor T2).

The second sub-power line PL2_2 may be connected to the first sub-power line PL2_1 exposed through a contact hole. The second sub-power line PL2_2 along with the first sub-power line PL2_1 may constitute a power line for supplying the second power source VSS to the pixel PXL (see FIG. 6A).

The third conductive layer may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), titanium (Ti), tantalum (Ta), tungsten (W), and copper (Cu). The third conductive layer may have a single or multi-layered structure.

The fourth insulating layer INS4 may be disposed on the third conductive layer, and may be roughly disposed on the entire surface of the base layer SUB. The fourth insulating layer INS4 may function to insulate the third conductive layer and the fourth conductive layer, and may be an interlayer insulating layer.

Like the third insulating layer INS3, the fourth insulating layer INS4 may include an inorganic insulating material or an organic insulating material.

The fourth conductive layer may be disposed on the fourth insulating layer INS4. The fourth conductive layer may include a first bridge pattern BRP1 and a second bridge pattern BRP2.

The first bridge pattern BRP1 may overlap the first transistor electrode ET1 of the first transistor T1, and may be connected to the first transistor electrode ET1 exposed through a contact hole. The first bridge pattern BRP1 may connect the first transistor T1 to a first electrode ELT1 (e.g., the first electrode ELT1 of the light emitting element layer LDL) which will be described later.

The second bridge pattern BRP2 may overlap the second sub-power line PL2_2, and may be connected to the second sub-power line PL2_2 exposed through a contact hole. The second bridge pattern BRP2 may connect the second sub-power line PL2_2 to a second electrode ELT2 (i.e., the second electrode ELT2 of the light emitting element layer LDL) which will be described later.

The protective layer PSV may be disposed on the fourth conductive layer and the fourth insulating layer INS4. The protective layer PSV may be provided in a form including an organic insulating layer, an inorganic insulating layer, or the organic insulating layer disposed on the inorganic insulating layer.

A first contact hole CNT1 exposing the first bridge pattern BRP1 (for example, to connect the first bridge pattern BRP1 to the first electrode ELT1 of the light emitting element layer LDL) and a second contact hole CNT2 exposing the second bridge pattern BRP2 (for example, to connect the second bridge pattern BRP2 to the second electrode ELT2 of the light emitting element layer LDL) may be formed in the protective layer PSV.

The light emitting element layer LDL may include first to third bank patterns PW1, PW2, and PW3, first to third electrodes ELT1, ELT2, and ELT3, a first passivation layer PAS1 (or fifth insulating layer), first and second light emitting elements LD1 and LD2, a second passivation layer PAS2 (or sixth insulating layer), a third contact electrode CNE3, a third passivation layer PAS3 (or seventh insulating layer), and first and second contact electrodes CNE1 and CNE2, which are sequentially disposed and/or formed on the pixel circuit layer PCL.

The first to third bank patterns PW1, PW2, and PW3 may be disposed on the pixel circuit layer PCL (or the protective layer PSV). The first to third bank patterns PW1, PW2, and PW3 may be disposed to be spaced from each other in the light emitting area EMA (see FIG. 7). The first to third bank patterns PW1, PW2, and PW3 may protrude in a height direction (i.e., a third direction DR3) on the pixel circuit layer PCL. In some embodiments, the first to third bank patterns PW1, PW2, and PW3 may substantially have the same height, but the present disclosure is not limited thereto.

In some embodiments, the first bank pattern PW1 may be disposed between the pixel circuit layer PCL and the first electrode ELT1. The first bank pattern PW1 may be disposed to be adjacent to a first end portion EP1 of the first light emitting element LD1. In one or more embodiments, one side surface of the first bank pattern PW1 may be located at a distance at which the one side surface is adjacent to the first end portion EP1 of the first light emitting element LD1, to face the first end portion EP1 of the first light emitting element LD1.

In some embodiments, the second bank pattern PW2 may be disposed between the pixel circuit layer PCL and the second electrode ELT2. The second bank pattern PW2 may be disposed to be adjacent to a second end portion EP2 of the first light emitting element LD1. In one or more embodiments, one side surface of the second bank pattern PW2 may be located at a distance at which the one side surface is adjacent to the second end portion EP2 of the first light emitting element LD1, to face a second end portion EP2 of the first light emitting element LD1. Also, the second bank pattern PW2 may be disposed to be adjacent to the second end portion EP2 of the second light emitting element LD2. In one or more embodiments, the other side surface of the second bank pattern PW2 may be located at a distance at which the other side surface is adjacent to the second end portion EP2 of the second light emitting element LD2, to face the second end portion EP2 of the second light emitting element LD2.

In some embodiments, the third bank pattern PW3 may be disposed between the pixel circuit layer PCL and the third electrode ELT3. The third bank pattern PW3 may be disposed to be adjacent to a first end portion EP1 of the second light emitting element LD2. In one or more embodiments, one side surface of the third bank pattern PW3 may be located at a distance at which the one side surface is adjacent to the first end portion EP1 of the second light emitting element LD2, to face the first end portion EP1 of the second light emitting element LD2.

In some embodiments, the first to third bank patterns PW1, PW2, and PW3 may have various shapes. In an example, the first to third bank patterns PW1, PW2, and PW3 may have a sectional shape of a trapezoid of which width is narrowed as approaching the top thereof as shown in FIG. 8A. Each of the first to third bank patterns PW1, PW2, and PW3 may have an inclined surface at least one side surface thereof. In one or more embodiments, the first to third bank patterns PW1, PW2, and PW3 may have a section of a semicircle or semi-ellipse of which width is narrowed as approaching the top thereof. Each of the first to third bank patterns PW1, PW2, and PW3 may have a curved surface at at least one side surface thereof. For example, in the present disclosure, the shape of the first to third bank patterns PW1, PW2, and PW3 is not particularly limited, and may be variously changed in a suitable manner known to those skilled in the art. In some embodiments, at least one of the first to third bank patterns PW1, PW2, and PW3 may be omitted, or the position of the at least one of the first to third bank patterns PW1, PW2, and PW3 may be changed.

The first to third bank patterns PW1, PW2, and PW3 may include an insulating material including an inorganic material and/or an organic material. In one or more embodiments, the first to third bank patterns PW1, PW2, and PW3 may include at least one-layered inorganic layer which includes various inorganic insulating materials currently known in the art, including silicon nitride ($SiN_x$) or silicon oxide ($SiO_x$). In one or more embodiments, the first to third bank patterns PW1, PW2, and PW3 may include at least one-layered organic layer and/or a photoresist layer, which includes various insulating organic insulating materials currently known in the art, or configured with a single or multi-layered insulator complexly including organic/inorganic materials. That is, the material constituting the first to third bank patterns PW1, PW2, and PW3 may be variously changed.

In one or more embodiments, the first to third bank patterns PW1, PW2, and PW3 may serve as a reflective member. In one or more embodiments, the first to third bank patterns PW1, PW2, and PW3 along with the first to third electrodes ELT1, ELT2, and ELT3 provided on the top thereof may serve as a reflective member which guides light emitted from each light emitting element LD in a desired direction, thereby improving light efficiency of the pixel PXL.

The first to third electrodes ELT1, ELT2, and ELT3 may be respectively disposed on the top of the first to third bank patterns PW1, PW2, and PW3. The first to third electrodes ELT1, ELT2, and ELT3 may be disposed to be spaced from each other in the light emitting area EMA (see FIG. 7).

In some embodiments, the first to third electrodes ELT1, ELT2, and ELT3 disposed on the top of the first to third bank patterns PW1, PW2, and PW3 may have shapes corresponding to those of the first to third bank patterns PW1, PW2, and PW3, respectively. For example, the first to third electrodes ELT1, ELT2, and ELT3 may protrude in a height direction (or thickness direction) of the light emitting element layer LDL while respectively having inclined surfaces or curved surfaces, which correspond to the first to third bank patterns PW1, PW2, and PW3.

Each of the first to third electrodes ELT1, ELT2, and ELT3 may include at least one conductive material. Each of the first to third electrodes ELT1, ELT2, and ELT3 may include at least one material from among a metal such as Ag, Mg, Al, Pt, Pd, Au, Ni, Nd, Ir, Cr, Ti, or any alloy thereof, a conductive oxide such as ITO, IZO, ZnO or ITZO, and a conductive polymer such as PEDOT, but the present disclosure is not limited thereto.

Also, each of the first to third electrodes ELT1, ELT2, and ELT3 may be provided in a single layer or a multi-layer. In one or more embodiments, each of the first to third electrodes ELT1, ELT2, and ELT3 may include at least one-layered reflective electrode layer. Also, each of the first to third electrodes ELT1, ELT2, and ELT3 may selectively further include at least one of at least one-layered transparent electrode layer disposed on the top and/or the bottom of the reflective electrode layer and at least one-layered conductive capping layer covering the top of the reflective electrode layer and/or the transparent electrode layer.

In some embodiments, the reflective electrode layer of each of first to third electrodes ELT1, ELT2, and ELT3 may be made of a conductive material having a uniform reflexibility. In one or more embodiments, the reflective electrode layer may include at least one of metals such as Ag, Mg, Al, Pt, Pd, Au, Ni, Nd, Ir, Cr, and alloys thereof, but the present disclosure is not limited thereto. For example, the reflective electrode layer may be made of various reflective conductive materials. When each of the first to third electrodes ELT1, ELT2, and ELT3 includes the reflective electrode layer, the first to third electrodes ELT1, ELT2, and ELT3 may allow lights emitted from both ends, for example, the first and second end portions EP1 and EP2 of each of the first and second light emitting elements LD1 and LD2 to further advance in a direction in which an image is displayed (e.g., a front direction). In one or more embodiments, when the first to third electrodes ELT1, ELT2, and ELT3 are disposed to face the first and second end portions EP1 and EP2 of the light emitting elements LD1 and LD2 while having inclined surfaces or curved surfaces respectively corresponding to the shapes of the first to third bank patterns PW1, PW2, and PW3, lights emitted from the first and second end portions EP1 and EP2 of each of the first and second light emitting elements LD1 and LD2 may be reflected by the first to third electrodes ELT1, ELT2, and ELT3, to further advance in a front direction of the display panel PNL (e.g., an upper direction of the base layer SUB). Accordingly, the efficiency of light emitted from the light emitting elements LD can be improved.

In one or more embodiments, the transparent electrode layer of each of the first to third electrodes ELT1, ELT2, and ELT3 may be made of various transparent electrode materials. In one or more embodiments, the transparent electrode layer may include ITO, IZO or ITZO, but the present disclosure is not limited thereto. In one or more embodiments, each of the first to third electrodes ELT1, ELT2, and ELT3 may be provided in a triple-layer having a stacked structure of ITO/Ag/ITO. As described above, when each of the first to third electrodes ELT1, ELT2, and ELT3 is provided in a multi-layer including at least two layers, a voltage drop caused by RC delay can be minimized or reduced. Accordingly, a desired voltage can be effectively transferred to the light emitting elements LD (e.g., LD1, LD2).

In one or more embodiments, when each of the first to third electrodes ELT1, ELT2, and ELT3 includes the conductive capping layer covering the reflective electrode layer and/or the transparent electrode layer, the reflective electrode layer, etc. of each of the first to third electrodes ELT1, ELT2, and ELT3 can be prevented (or protected) from being damaged due to a defect occurring in a fabricating process of the pixel PXL, etc. However, the conductive capping layer may be selectively included in the first to third electrodes ELT1, ELT2, and ELT3. In some embodiments, the conductive capping layer may be omitted. Also, the conductive capping layer may be considered as a component of each of the first to third electrodes ELT1, ELT2, and ELT3, or be considered as a separate component disposed on each of the first to third electrodes ELT1, ELT2, and ELT3.

The first passivation layer PAS1 may be disposed on one areas of the first to third electrodes ELT1, ELT2, and ELT3. For example, the first passivation layer PAS1 may be formed to cover the one areas of the first to third electrodes ELT1, ELT2, and ELT3, and include openings exposing other areas of the first to third electrodes ELT1, ELT2, and ELT3.

In one or more embodiments, the first passivation layer PAS1 may be primarily formed to entirely cover the first to third electrodes ELT1, ELT2, and ELT3. After the light emitting elements LD are supplied and aligned on the first passivation layer PAS1, the first passivation layer PAS1 may be partially opened to expose the first to third electrodes ELT1, ELT2, and ELT3 at first and second contact portions (e.g., at set or predetermined first and second contact portions and in some embodiments a third contact portion on the third electrode ELT3) as shown in FIG. 8A. In one or more embodiments, after the supply and alignment of the light emitting elements LD is completed, the first passivation layer PAS1 may be patterned in the form of individual patterns locally disposed on the bottom of the light emitting elements LD.

For example, the first passivation layer PAS1 is interposed between the first and second electrodes ELT1 and ELT2 and the first light emitting element LD1 and between the second and third electrodes ELT2 and ELT3 and the second light emitting element LD2, and may expose at least one area of each of the first to third electrodes ELT1, ELT2, and ELT3. The first passivation layer PAS1 may be formed to cover the first to third electrodes ELT1, ELT2, and ELT3 after the first to third electrodes ELT1, ELT2, and ELT3 are formed, to prevent (or protect) the first to third electrodes ELT1, ELT2, and ELT3 from being damaged in a subsequent process or to prevent (or protect) metal from being educed in a subsequent process. Also, the first passivation layer PAS1 may stably support the light emitting elements LD1 and LD2. In some embodiments, the first passivation layer PAS1 may be omitted.

In some embodiments, a bank BANK (see FIG. 7) may be disposed on the first passivation layer PAS1. In one or more embodiments, the bank BANK may be formed between other pixels to surround the light emitting area EMA of the pixel PXL, to constitute of a pixel defining layer defining the light emitting area EMA of the pixel PXL. In a process of supplying the light emitting elements LD1 and LD2 to the light emitting area EMA, the bank BANK may prevent a solution in which the light emitting elements LD1 and LD2 are mixed from being introduced into the light emitting area EMA of an adjacent pixel PXL (e.g., the bank BANK may act as a barrier between adjacent pixels to reduce a chance that the solution in which the light emitting elements LD1 and LD2 are mixed is spilled into an adjacent pixel PXL), or serve as a dam structure for controlling a certain amount of solution to be supplied to each light emitting area EMA.

The light emitting elements LD1 and LD2 may be supplied and aligned in the light emitting area EMA (see FIG. 7) in which the first passivation layer PAS1 is disposed. In one or more embodiments, the light emitting elements LD1 and LD2 may be supplied in the light emitting area EMA through an inkjet process or the like, and be aligned between the first and second electrodes ELT1 and ELT2 and between the second and third electrodes ELT2 and ELT3 by an alignment voltage (e.g., a set or predetermined alignment voltage or an alignment signal) applied to the first to third electrodes ELT1, ELT2, and ELT3.

The second passivation layer PAS2 may be disposed on each of the first and second light emitting elements LD1 and LD2, for example, each of the top of the first light emitting element LD1 aligned between the first and second electrodes ELT1 and ELT2 and the top of the second light emitting element LD2 aligned between the second and third electrodes ELT2 and ELT3, and expose the first and second end portions EP1 and EP2 of each of the light emitting elements LD1 and LD2. For example, the second passivation layer PAS2 does not cover the first and second end portions EP1 and EP2 of the first light emitting element LD1, but may be partially disposed on only the top of one area of the first light emitting element LD1. The second passivation layer PAS2 may be formed as an independent pattern, but the present disclosure is not limited thereto. In one or more embodiments, when a separation space exists between the first passivation layer PAS1 and the light emitting elements LD1 and LD2 before the second passivation layer PAS2 is formed, the space may be filled by the second passivation layer PAS2. Accordingly, the light emitting elements LD1 and LD2 can be more stably supported.

The second contact electrode CNE2 may be disposed on the second and third electrodes ELT2 and ELT3, the second end portion EP2 of the first light emitting element LD1, and the first end portion EP1 of the second light emitting element LD2. The second contact electrode CNE2 may electrically connect the second end portion EP2 of the first light emitting element LD1 and the first end portion EP1 of the second light emitting element LD2.

The second contact electrode CNE2 is disposed on the second electrode ELT2, but may be insulated from the second electrode ELT2 by the first passivation layer PAS1. Also, the second contact electrode CNE2 may be disposed on the second end portion EP2 of the first light emitting element LD1 to be in contact with the second end portion EP2 of the first light emitting element LD1, which is adjacent to the second electrode ELT2. Further, the second contact electrode CNE2 may be disposed on the third electrode ELT3 to be in contact with the third electrode ELT3. In one or more embodiments, the second contact electrode CNE2 may be disposed to be in contact with the third electrode ELT3 on one area of the third electrode ELT3, which is not covered by the first passivation layer PAS1. Also, the second contact electrode CNE2 may be disposed on the first end portion EP1 of the second light emitting element LD2 to be in contact with the first end portion EP1 of the second light emitting element LD2, which is adjacent to the third electrode ELT3.

The third passivation layer PAS3 may be disposed over the second contact electrode CNE2. The third passivation layer PAS3 may cover the second contact electrode CNE2.

The first contact electrode CNE1 and the third contact electrode CNE3 may be disposed on the first electrode ELT1, the second electrode ELT2, the first end portion EP1 of the first light emitting element LD1, and the second end portion EP2 of the second light emitting element LD2. The first contact electrode CNE1 and the third contact electrode CNE3 may be at the same layer as shown in FIG. 8A. The first contact electrode CNE1 and the third contact electrode CNE3 may be formed of the same conductive material through the same process, but the present disclosure is not limited thereto.

The first contact electrode CNE1 may electrically connect the first end portion EP1 of the first light emitting element LD1 and the first electrode ELT1. The third contact electrode CNE3 may electrically connect the second end portion EP2 of the second light emitting element LD2 and the second electrode ELT2.

For example, the first contact electrode CNE1 may be disposed on the first electrode ELT1 to be in contact with the first electrode ELT1. In one or more embodiments, the first contact electrode CNE1 may be disposed to be in contact with the first electrode ELT1 at one area of the first electrode ELT1, which is not covered by the first passivation layer PAS1. Also, the first contact electrode CNE1 may be disposed on the first end portion EP1 of the first light emitting element LD1 to be in contact with the first end portion EP1 of the first light emitting element LD1, which is adjacent to the first electrode ELT1. For example, the first contact electrode CNE1 may be disposed to cover the first end portion EP1 of the first light emitting element LD1 and at least one area of the first electrode ELT1, which corresponds thereto.

Similarly, the third contact electrode CNE3 may be disposed on the second electrode ELT2 to be in contact with the second electrode ELT2. In one or more embodiments, the third contact electrode CNE3 may be disposed to be in contact with the second electrode ELT2 on one area of the second electrode ELT2, which is not covered by the first passivation layer PAS1. Also, the third contact electrode CNE3 may be disposed on the second end portion EP2 of the second light emitting element LD2 to be in contact with the second end portion EP2 of the second light emitting element LD2, which is adjacent to the second electrode ELT2. For example, the third contact electrode CNE3 may be disposed to cover the second end portion EP2 of the second light emitting element LD2 and at least one area of the second electrode ELT2, which corresponds thereto.

In some embodiments, each of the first to third passivation layers PAS1, PAS2, and PAS3 may be provided in a single layer or a multi-layer, and include at least one inorganic insulating material and/or at least one organic insulating material. For example, each of the first to third passivation layers PAS1, PAS2, and PAS3 may include various kinds of organic/inorganic insulating materials currently know in the art, including silicon nitride ($SiN_x$), and the material constituting each of the first to third passivation layers PAS1, PAS2, and PAS3 is not particularly limited. Also, the first to third passivation layers PAS1, PAS2, and PAS3 may include different insulating materials, or at least some of the first to third passivation layers PAS1, PAS2, and PAS3 may include the same insulating material.

In one or more embodiments, although a case where the first contact electrode CNE1 (or the third contact electrode CNE3) and the second contact electrode CNE2 are disposed in different layers with the third passivation layer PAS3 interposed therebetween is illustrated in FIG. 8A, the first to third contact electrodes CNE1, CNE2, and CNE3 are not limited thereto.

Also, although the first and second contact electrodes CNE1 and CNE2 (or the second and third contact electrodes CNE2 and CNE3) overlap each other is illustrated in FIG. 8A, the present disclosure is not limited thereto. For example, the first and second contact electrodes CNE1 and CNE2 (or the second and third contact electrodes CNE2 and CNE3) may not overlap each other.

In some embodiments, the first and second contact electrodes CNE1 and CNE2 (or the first to third contact electrodes CNE1, CNE2, and CNE3) may be at the same layer.

Referring to FIG. 8B, the first to third contact electrodes CNE1, CNE2, and CNE3 may be disposed on the first passivation layer PAS1 (and the second passivation layer PAS2). The arrangement relationship (or overlapping relationship) among the first to third contact electrodes CNE1, CNE2, and CNE3, the first to third electrodes ELT1, ELT2, and ELT3, and the first and second light emitting elements LD1 and LD2 is substantially identical or similar to that described with reference to FIG. 8A, and therefore, duplicated descriptions may not be repeated.

The first contact electrode CNE1 and the second contact electrode CNE2 may be disposed on the first light emitting element LD1 to be spaced from each other, and the second contact electrode CNE2 and the third contact electrode CNE3 may be disposed on the second light emitting element LD2 to be spaced from each other. The first contact electrode CNE1 and the second contact electrode CNE2 may not overlap each other, and the second contact electrode CNE2 and the third contact electrode CNE3 may not overlap each other.

A fourth passivation layer PAS4 may be formed and/or disposed on one surface of the base layer SUB, on which the first to third electrodes ELT1, ELT2, and ELT3, the first and second light emitting elements LD1 and LD2, and the first to third contact electrodes CNE1, CNE2, and CNE3 are disposed, to cover the first to third electrodes ELT1, ELT2, and ELT3, the first and second light emitting elements LD1 and LD2, and the first to third contact electrodes CNE1, CNE2, and CNE3. The fourth passivation layer PAS4 may include a thin film encapsulation layer including at least one-layered inorganic layer and/or at least one-layered organic layer, but the present disclosure is not limited thereto. In some embodiments, at least one-layered overcoat layer (e.g., a layer for planarizing an upper surface of the light emitting element layer LDL) may be further disposed on the top of the fourth passivation layer PAS4.

Figure 9A:
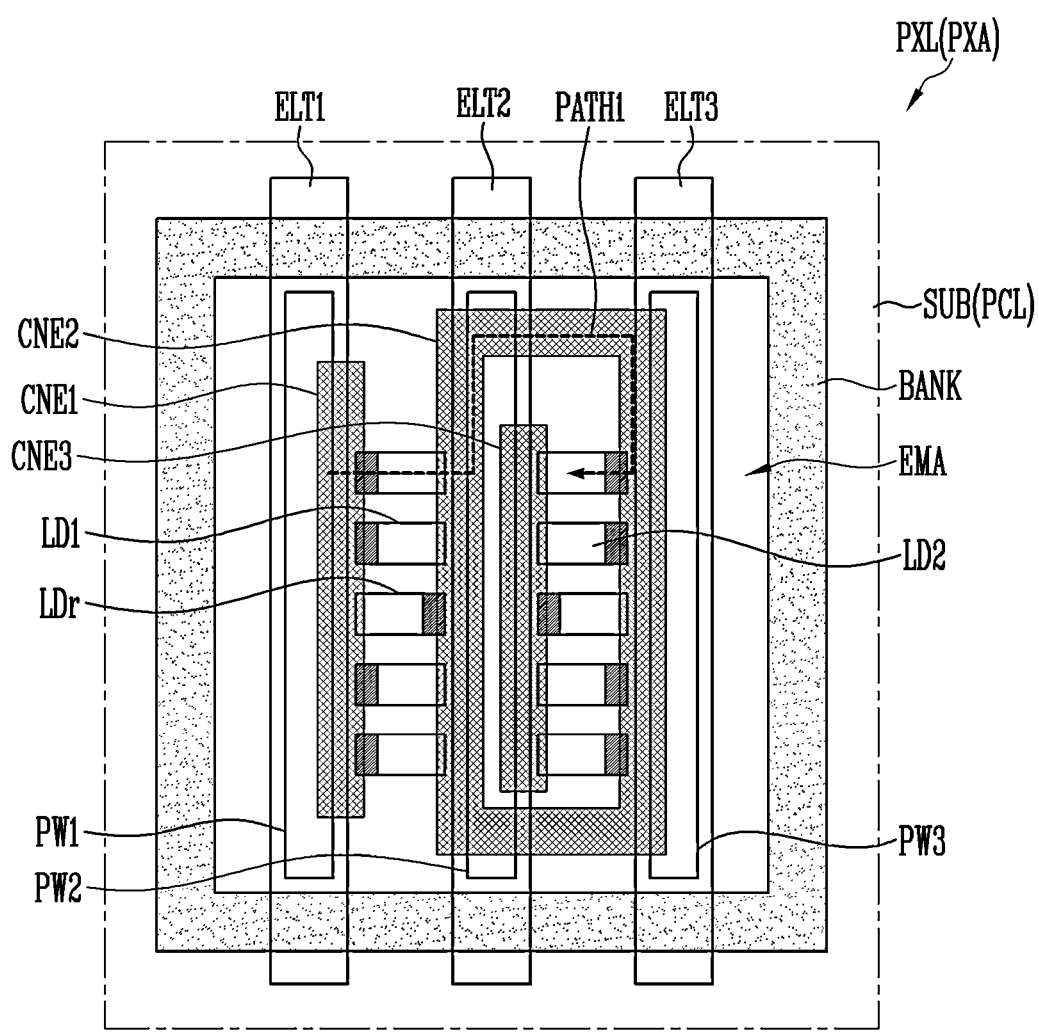
FIGS. 9A-9C are plan views illustrating another example of the pixel included in the display device shown in FIG. 5.
Figure 9B:
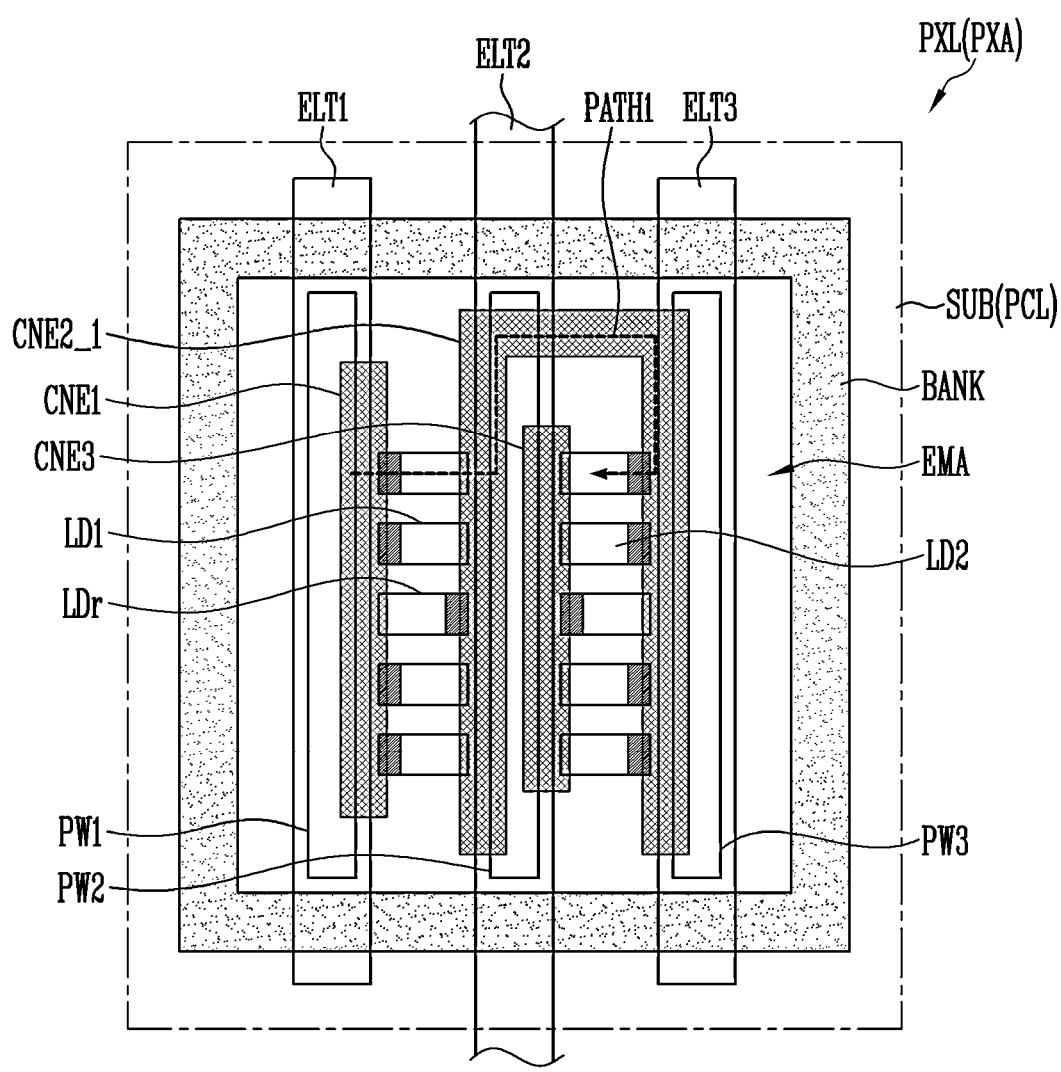
Figure 9C:
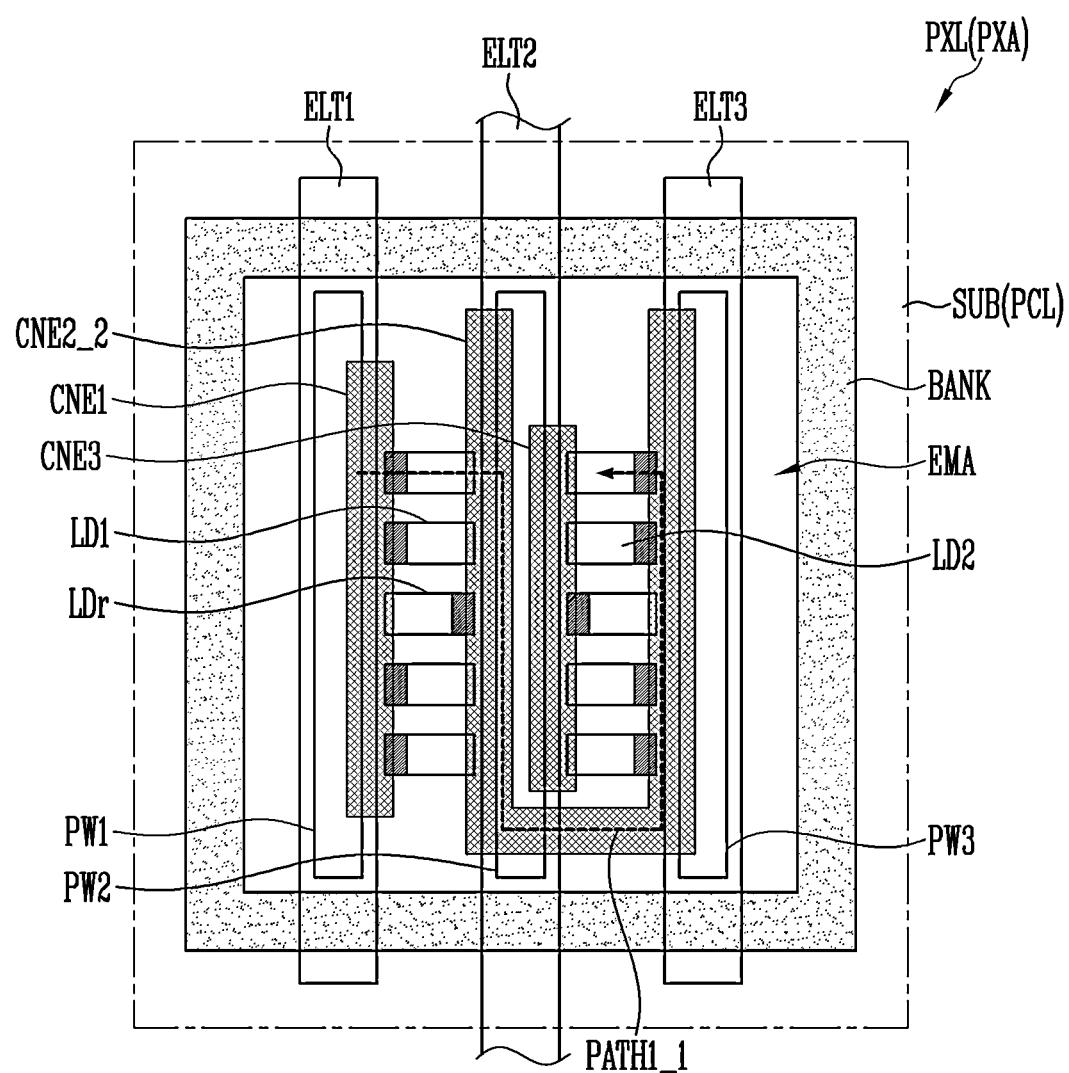

FIGS. 9A-9C are plan views illustrating another example of the pixel included in the display device shown in FIG. 5. A pixel PXL corresponding to FIG. 7 is illustrated in each of FIGS. 9A-9C.

Referring to FIGS. 7, 9A, 9B, and 9C, the pixel PXL shown in each of FIGS. 9A, 9B, and 9C may be substantially identical or similar to the pixel PXL shown in FIG. 7, except the second electrode ELT2 or a second contact electrode CNE2_1 or CNE2_2. Therefore, duplicated descriptions will not be repeated.

As shown in FIG. 9A, a length of the second electrode ELT2 may be equal to that of the first electrode ELT1 (or the third electrode ELT3). Like the first electrode ELT1 and the third electrode ELT3, the second electrode ELT2 may be disposed in the pixel area PXA. After the light emitting elements LD1 and LD2 are supplied and arranged in the pixel area PXA (or the light emitting area EMA), the first to third electrodes ELT1, ELT2, and ELT3 may be cut (or partially removed) at the outside of the bank BANK.

In some embodiments, the second contact electrode CNE2_1 or CNE2_2 may surround only a portion of the third contact electrode CNE3 (or the second light emitting element LD2).

As shown in FIG. 9B, the second contact electrode CNE2_1 may extend from the second electrode ELT2 to the third electrode ELT3 while being adjacent to one end of the third contact electrode CNE3, and include a space opened adjacent to the other end of the third contact electrode CNE3.

In one or more embodiments, as shown in FIG. 9C, the second contact electrode CNE2_2 may extend from the second electrode ELT2 to the third electrode ELT3 while being adjacent to the other end of the third contact electrode CNE3, and include a space opened adjacent to the one end of the third contact electrode CNE3. A driving current may flow between the first electrode ELT1 and the second electrode ELT2 along a first path PATH1_1.

For example, when the second contact electrode CNE2_1 or CNE2_2 includes a portion extending between the second electrode ELT2 and the third electrode ELT3, the arrangement position of the extending portion may be variously modified.

Figure 10:
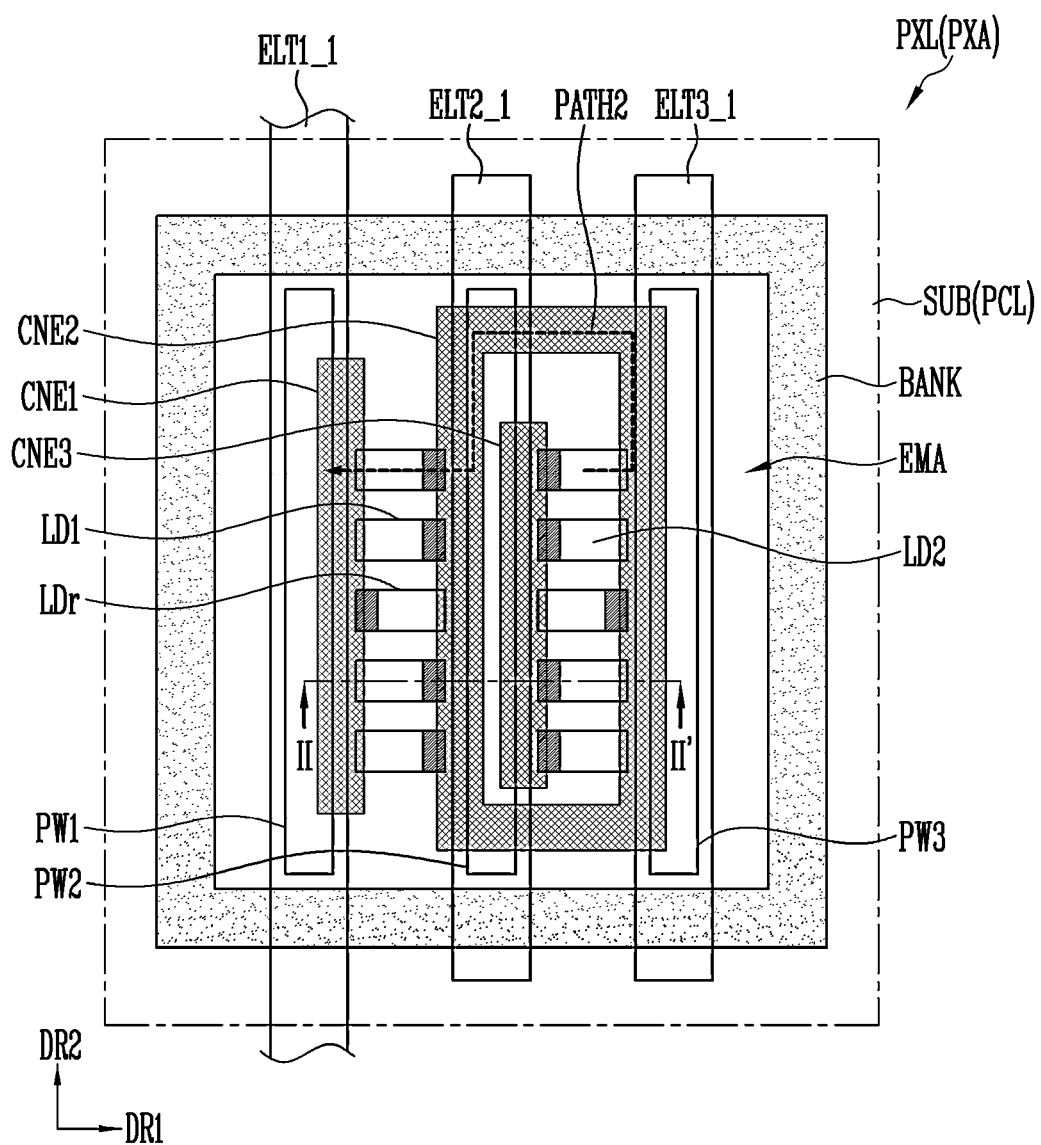
FIG. 10 is a plan view illustrating an example of the pixel included in the display device shown in FIG. 5.

FIG. 10 is a plan view illustrating an example of the pixel included in the display device shown in FIG. 5, according to one or more embodiments of the present disclosure. A pixel PXL corresponding to FIG. 7 is illustrated in FIG. 10, according to one or more embodiments of the present disclosure.

Referring to FIGS. 7 and 10, the pixel PXL shown in FIG. 10 may be substantially identical or similar to the pixel PXL shown in FIG. 7, except first to third electrodes ELT1_1, ELT2_1, and ELT3_1 and an arrangement direction of the first and second light emitting elements LD1 and LD2. Therefore, duplicated descriptions will not be repeated.

Each of the first to third electrodes ELT1_1, ELT2_1, and ELT3_1 may extend in the second direction DR2 crossing the first direction DR1, and may be disposed to be spaced from each other along the first direction DR1.

A length of the first electrode ELT1_1 in the second direction DR2 may be longer than that of each of the second electrode ELT2_1 and the third electrode ELT3_1 in the second direction DR2. As shown in FIG. 10, the second electrode ELT2_1 and the third electrode ELT3_1 may extend up to another pixel area adjacent to the pixel area PXA. Although will be described later with reference to FIG. 11A, the first electrode ELT1_1 may be connected to the second power source VSS (or second power line) described with reference to FIG. 6A, etc., and the second electrode ELT2_1 may be connected to the first transistor M1 described with reference to FIG. 6A, etc.

In order to arrange the light emitting elements LD1 and LD2, an AC voltage may be applied to the first electrode ELT1_1 and the third electrode ELT3_1 and a reference voltage (e.g., a ground voltage) may be applied to the second electrode ELT2_1, in a fabricating process of the display device. Accordingly, the first light emitting element LD1 may be arranged such that the first end portion EP1 of the first light emitting element LD1 faces the second electrode ELT2_1 and the second end portion EP2 of the first light emitting element LD1 faces the first electrode ELT1_1. Similarly, the second light emitting element LD2 may be arranged such that the first end portion EP1 of the second light emitting element LD2 faces the second electrode ELT2_1 and the second end portion EP2 of the second light emitting element LD2 faces the third electrode ELT3_1.

The first contact electrode CNE1 may be formed on the second end portion EP2 of the first light emitting element LD1 and at least one area of the first electrode ELT1_1, which corresponds thereto, to physically and/or electrically connect the second end portion EP2 of the first light emitting element LD1 to the first electrode ELT1_1.

The second contact electrode CNE2 may be formed on the first end portion EP1 of the first light emitting element LD1 and at least one area of the second electrode ELT2_1, which corresponds thereto. Also, the second contact electrode CNE2 may extend while detouring the third contact electrode CNE3 or the second light emitting element LD2, and may be formed on the second end portion EP2 of the second light emitting element LD2 and at least one area of the third electrode ELT3_1, which corresponds thereto. The second contact electrode CNE2 may electrically connect the first end portion EP1 of the first light emitting element LD1 and the second end portion EP2 of the second light emitting element LD2.

The third contact electrode CNE3 may be formed on the first end portion EP1 of the second light emitting element LD2 and at least one area of the second electrode ELT2_1, which corresponds thereto, to physically and/or electrically connect the first end portion EP1 of the second light emitting element LD2 to the second electrode ELT2_1.

Therefore, a driving current for driving the pixel PXL may flow along a second path PATH2 via the second light emitting element LD2 and the first light emitting element LD1.

Figure 11A:
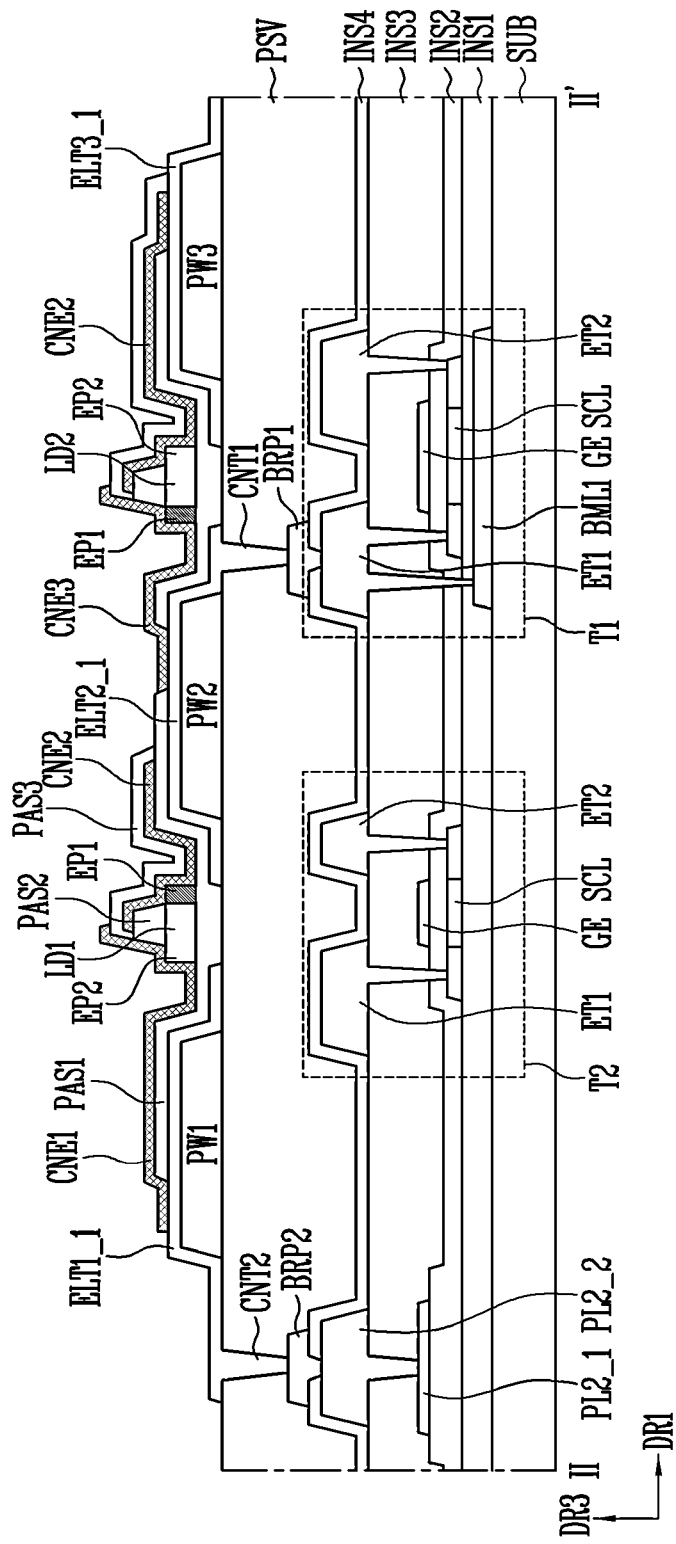
FIGS. 11A and 11B are sectional views illustrating an example of the pixel taken along the line II-II' shown in FIG. 10.
Figure 11B:
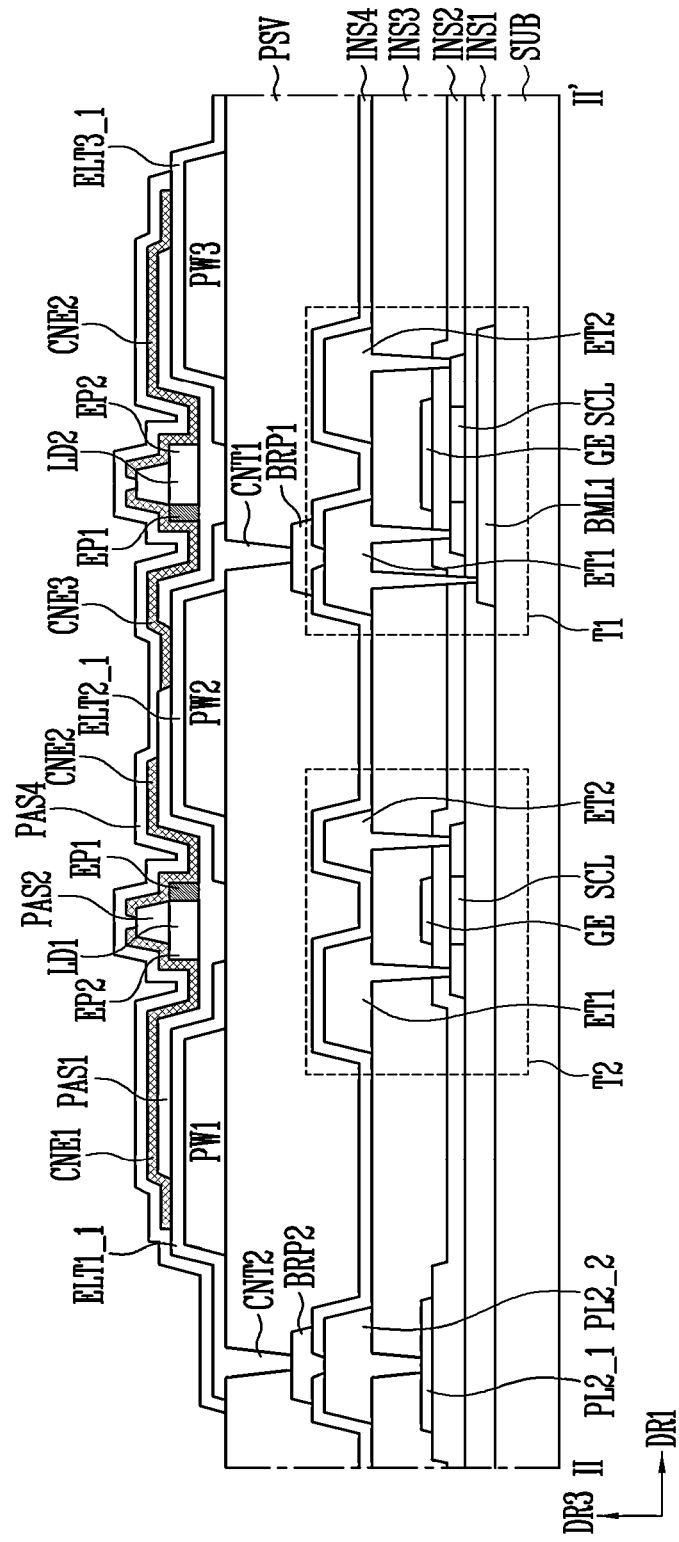

FIGS. 11A and 11B are sectional views illustrating an example of the pixel taken along the line II-II' shown in FIG. 10, according to one or more embodiments of the present disclosure. Figures corresponding to FIGS. 8A and 8B are illustrated in FIGS. 11A and 11B, respectively.

First, referring to FIGS. 8A and 11A, the pixel shown in FIG. 11A may be substantially identical or similar to the pixel shown in FIG. 8A, except arrangement positions (and a connection relationship) of the first transistor T1 and first and second sub-power lines PL2_1 and PL2_2. Therefore, duplicated descriptions will not be repeated.

As shown in FIG. 11A, the first and second sub-power lines PL2_1 and PL2_2 may be disposed to overlap the first electrode ELT1_1, and may be connected to the first electrode ELT1_1 through the second contact hole CNT2.

The first transistor T1 may be disposed to overlap the second electrode ELT2_1, and may be connected to the second electrode ELT2_1 through the first contact hole CNT1.

In one or more embodiments, although a case where the first contact electrode CNE1 (or the third contact electrode CNE3) and the second contact electrode CNE2 are disposed in different layers with the third passivation layer PAS3 interposed therebetween is illustrated in FIG. 11A, the first to third contact electrodes CNE1, CNE2, and CNE3 are not limited thereto.

As shown in FIG. 11B, for example, as described with reference to FIG. 8B, the first and second contact electrodes CNE1 and CNE2 (or the first to third contact electrodes CNE1, CNE2, and CNE3) may be at the same layer.

Figure 12A:
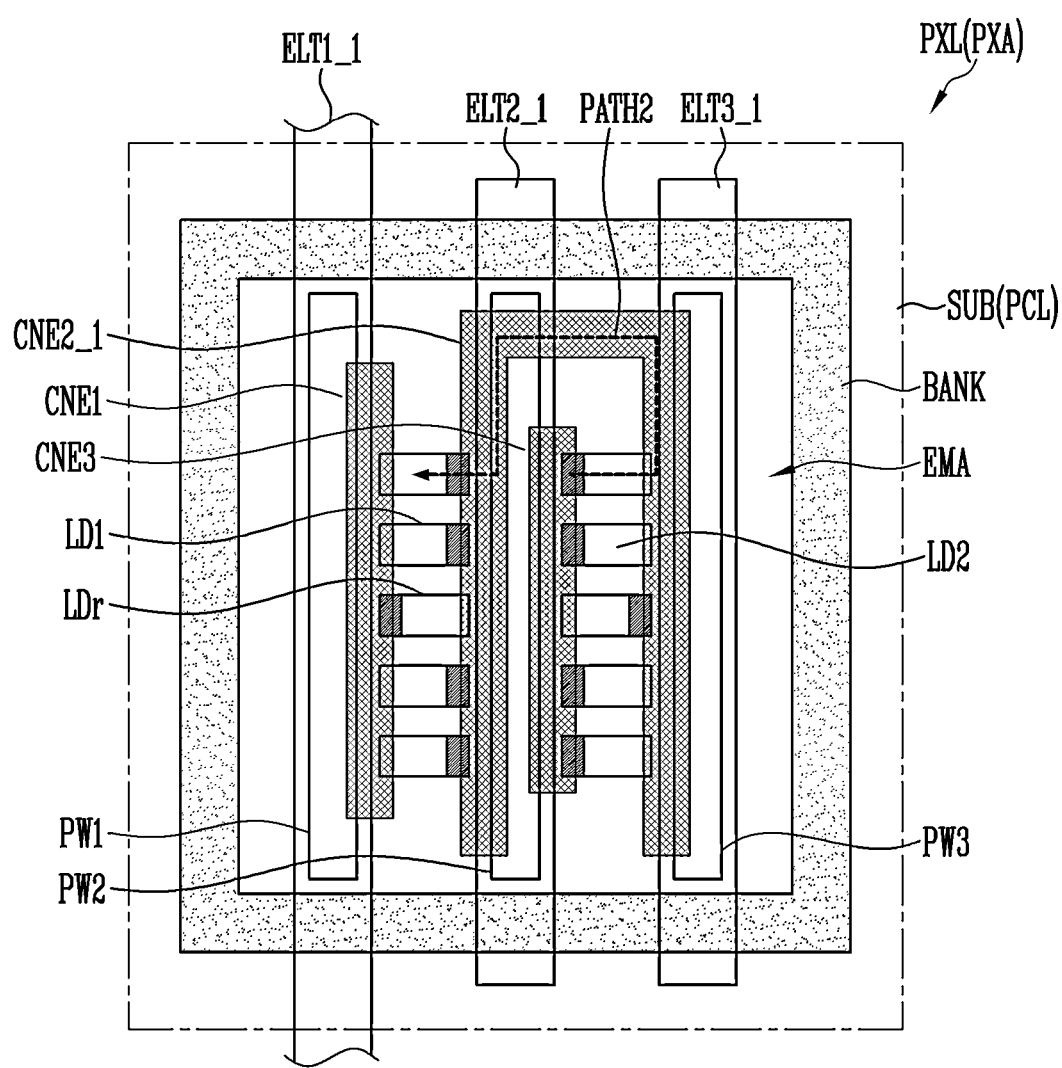
FIGS. 12A and 12B are plan views illustrating another example of the pixel included in the display device shown in FIG. 5.
Figure 12B:
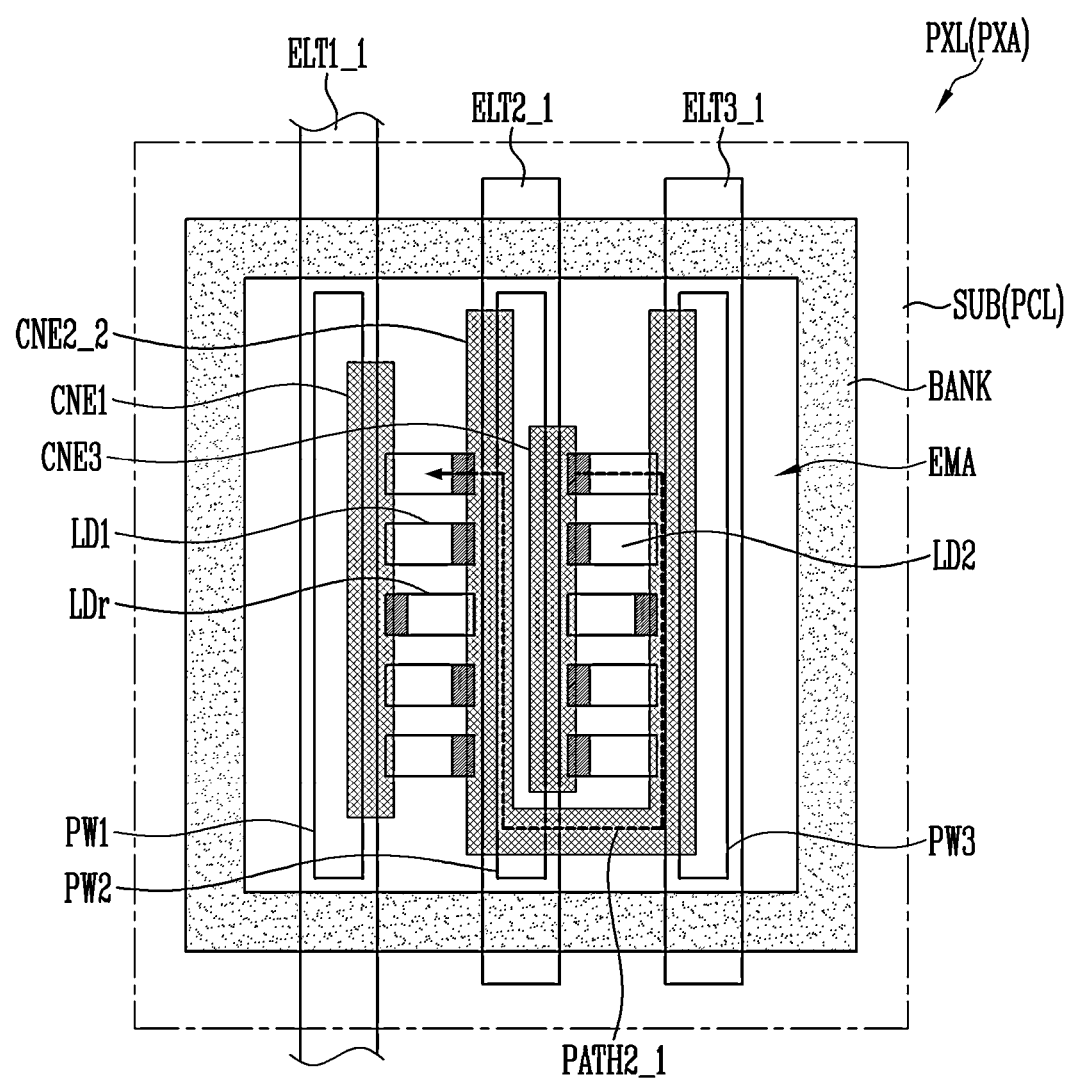

FIGS. 12A and 12B are plan views illustrating another example of the pixel included in the display device shown in FIG. 5, according to one or more embodiments of the present disclosure. A pixel PXL corresponding to FIG. 10 is illustrated in each of FIGS. 12A and 12B.

Referring to FIGS. 10, 12A, and 12B, the pixel PXL shown in each of FIGS. 12A and 12B may be substantially identical or similar to the pixel PXL shown in FIG. 10, except the second contact electrode CNE2_1 or CNE2_2. Therefore, duplicated descriptions will not be repeated.

As described with reference to FIGS. 9B and 9C, the second contact electrode CNE2_1 or CNE2_2 may surround only a portion of the third contact electrode CNE3 (or the second light emitting element LD2).

As shown in FIG. 12A, the second contact electrode CNE2_1 may extend from the second electrode ELT2_1 to the third electrode ELT3_1 while being adjacent to one end of the third contact electrode CNE3, and include a space opened adjacent to the other end of the third contact electrode CNE3.

In one or more embodiments, as shown in FIG. 12B, the second contact electrode CNE2_2 may extend from the second electrode ELT2_1 to the third electrode ELT3_1 while being adjacent to the third contact electrode CNE3, and may include a space opened adjacent to the one end of the third contact electrode CNE3. A driving current may flow from the second electrode ELT2_1 to the first electrode ELT1_1 along a second path PATH2_1.

Figure 13:
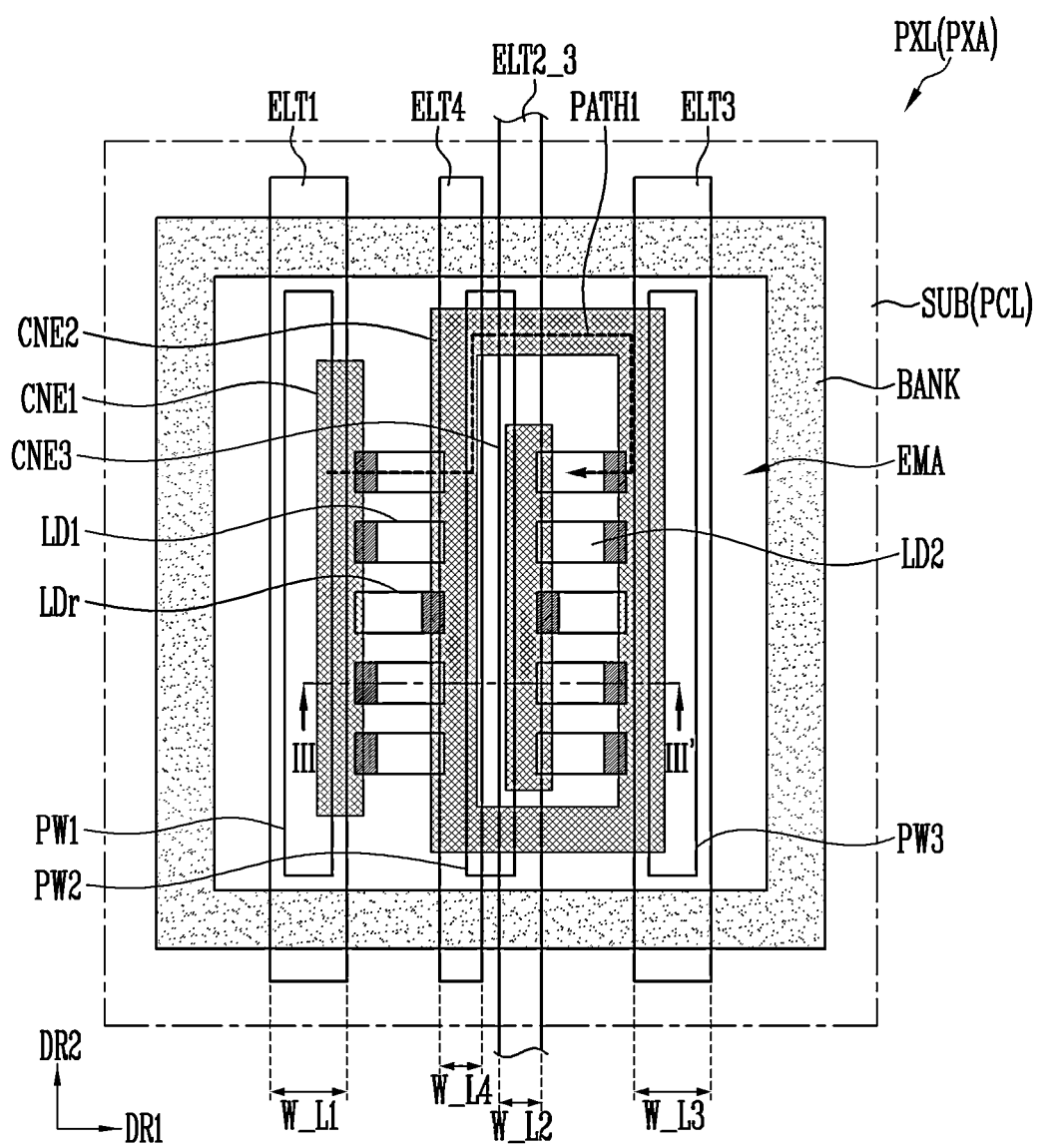
FIG. 13 is a plan view illustrating an example of the pixel included in the display device shown in FIG. 5.

FIG. 13 is a plan view illustrating an example of the pixel included in the display device shown in FIG. 5, according to one or more embodiments of the present disclosure. A pixel PXL corresponding to FIG. 7 is illustrated in FIG. 13.

Referring to FIGS. 7 and 13, the pixel PXL shown in FIG. 13 may be substantially identical or similar to the pixel PXL shown in FIG. 7, except a second electrode ELT2_3 and a fourth electrode ELT4. Therefore, duplicated descriptions will not be repeated.

The pixel PXL may further include the fourth electrode ELT4 in addition to the first electrode ELT1, the second electrode ELT2_3, and the third electrode ELT3.

The fourth electrode ELT4 may extend in the second direction DR2, and may be disposed between the first electrode ELT1 and the second electrode ELT2_3. A length of the fourth electrode ELT4 in the second direction DR2 may be equal or similar to that of the first electrode ELT1 (or the third electrode ELT3) in the second direction DR2, and be shorter than that of the second electrode ELT2_3 in the second direction DR2.

The fourth electrode ELT4 may overlap the second bank pattern PW2. The second electrode ELT2_3 and the fourth electrode ELT4 may be disposed on the second bank pattern PW2 to face each other, and protrude in a height direction of the base layer SUB due to the second bank pattern PW2.

In one or more embodiments, in the light emitting area EMA (or the pixel area PXA), a first line width $W\_L1$ (e.g., a width in the first direction DR1) of the first electrode ELT1 may be equal to or substantially equal to a third line width $W\_L3$ of the third electrode ELT3, and each of a second line width $W\_L2$ of the second electrode ELT2_3 and a fourth line width $W\_L4$ of the fourth electrode ELT4 may be smaller than the first line width $W\_L1$ of the first electrode ELT1. For example, a total sum of the second line width $W\_L2$ of the second electrode ELT2_3 and the fourth line width $W\_L4$ of the fourth electrode ELT4 may be equal to or substantially equal to the first line width $W\_L1$ of the first electrode ELT1.

For example, the second electrode ELT2 described with reference to FIG. 7 may be separated into the second electrode ELT2_3 and the fourth electrode ELT4, e.g., two electrodes (or sub-electrodes). For example, referring to FIG. 8A, when the thickness of the first passivation layer PAS1 decreases, a short circuit may occur between the second contact electrode CNE2 and the second electrode ELT2. The second light emitting element LD2 arranged between the second electrode ELT2 and the third electrode ELT3 may not emit light. Therefore, the second electrode ELT2 shown in FIG. 7 is separated into the second electrode ELT2_3 and the fourth electrode ELT4, e.g., two electrodes, so that the second light emitting element LD2 (and the first light emitting element LD1) can normally emit light with a desired luminance, even when the short circuit occurs between the second contact electrode CNE2 and the second electrode ELT2_3.

The second electrode ELT2_3 and the fourth electrode ELT4 may be connected to each other before the light emitting elements LD1 and LD2 are supplied, and the fourth electrode ELT4 may be separated from the second electrode ELT2_3 at the outside of the bank BANK, after the light emitting elements LD1 and LD2 are supplied and arranged in the pixel area PXA.

The first light emitting element LD1 may be disposed between the first electrode ELT1 and the fourth electrode ELT4, and the second light emitting element LD2 may be disposed between the second electrode ELT2_3 and the third electrode ELT3.

The second contact electrode CNE2 may be formed on the second end portion EP2 of the first light emitting element LD1 and at least one area of the fourth electrode ELT4, which corresponds thereto. Also, the second contact electrode CNE2 may extend while detouring the third contact electrode CNE3 or the second light emitting element LD2, and may be formed on the first end portion EP1 of the second light emitting element LD2 and at least one area of the third electrode ELT3, which corresponds thereto. The second contact electrode CNE2 may electrically connect the second end portion EP2 of the first light emitting element LD1 and the first end portion EP1 of the second light emitting element LD2.

Figure 14A:
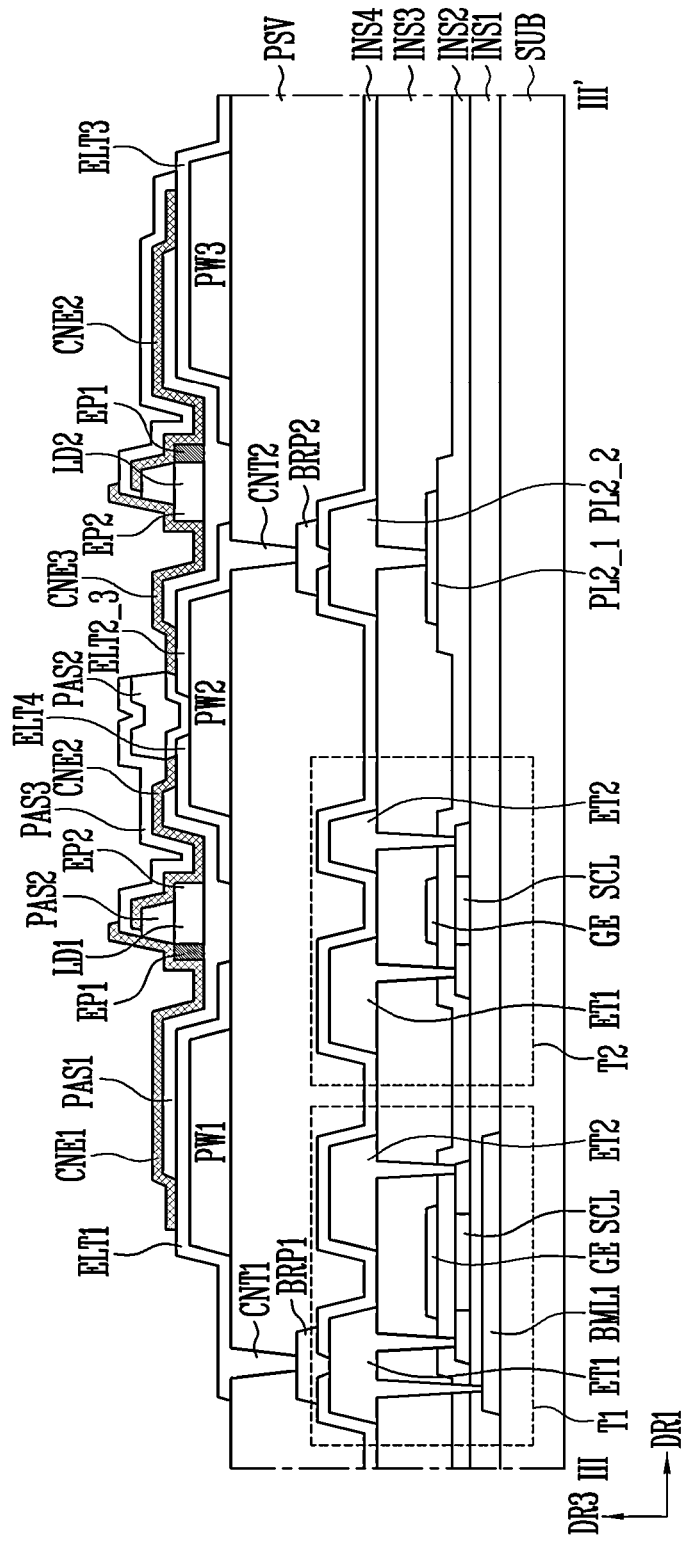
FIGS. 14A and 14B are sectional views illustrating an example of the pixel taken along the line III-III' shown in FIG. 13.
Figure 14B:
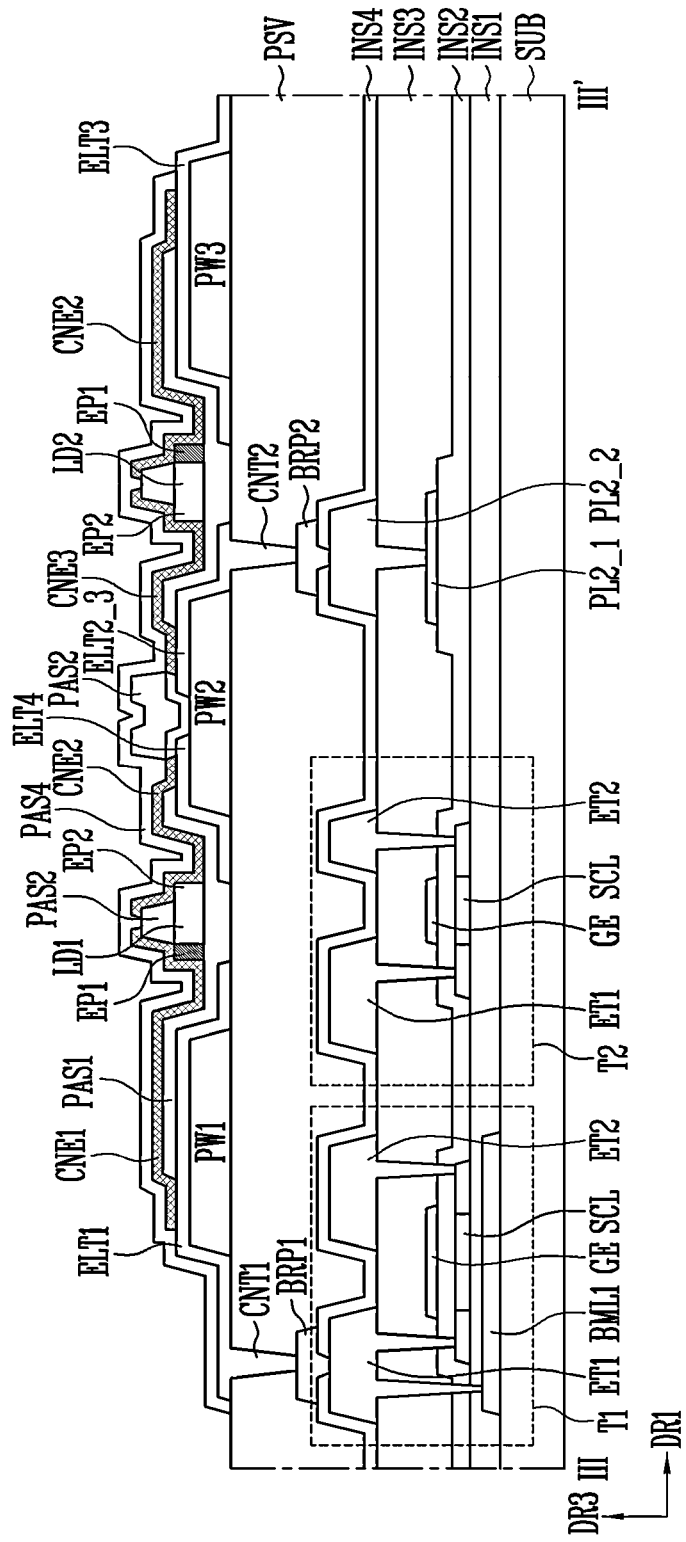

FIGS. 14A and 14B are sectional views illustrating an example of the pixel taken along the line III-III' shown in FIG. 13, according to one or more embodiments of the present disclosure. Figures corresponding to FIGS. 8A and 8B are illustrated in FIGS. 14A and 14B, respectively.

First, referring to FIGS. 8A and 14A, the pixel shown in FIG. 14A may be substantially identical or similar to the pixel shown in FIG. 8A, except the second electrode ELT2_3 and the fourth electrode ELT4. Therefore, duplicated descriptions will not be repeated.

The second electrode ELT2_3 and the fourth electrode ELT4 may be disposed on the top of the second bank pattern PW2.

The second electrode ELT2_3 may overlap one side surface (e.g., a right side surface) of the second bank pattern PW2, and have a shape that is same as or similar to that of the one side surface of the second bank pattern PW2. Similarly, the fourth electrode ELT4 may overlap the other side surface (e.g., a left side surface) of the second bank pattern PW2, and have a shape that is same as or similar to that of the other side surface of the second bank pattern PW2.

Like the first to third electrodes ELT1, ELT2_3, and ELT3, the fourth electrode ELT4 may include at least one conductive material. In one or more embodiments, the fourth electrode ELT4 may include at least one material from among a metal such as Ag, Mg, Al, Pt, Pd, Au, Ni, Nd, Ir, Cr, Ti, or any alloy thereof, a conductive oxide such as ITO, IZO, ZnO or ITZO, and a conductive polymer such as PEDOT, but the present disclosure is not limited thereto.

Also, the fourth electrode ELT4 may have a structure similar to those of the first to third electrodes ELT1, ELT2_3, and ELT3. For example, the fourth electrode ELT4 may selectively further include at least one of at least one-layered transparent electrode layer disposed on the top and/or the bottom of the reflective electrode layer and at least one-layered conductive capping layer covering the top of the reflective electrode layer and/or the transparent electrode layer.

The first passivation layer PAS1 may be disposed on one areas of the first to fourth electrodes ELT1, ELT2_3, ELT3, and ELT4. For example, the first passivation layer PAS1 may be formed to cover the one areas of the first to fourth electrodes ELT1, ELT2_3, ELT3, and ELT4, and include openings exposing other areas of the first to fourth electrodes ELT1, ELT2_3, ELT3, and ELT4. Also, the first passivation layer PAS1 may cover one side surface of the second electrode ELT2_3 and one side surface of the fourth electrode ELT4, which face each other, and may be disposed between the second electrode ELT2_3 and the fourth electrode ELT4 (e.g., to provide insulation between the second electrode ELT2_3 and the fourth electrode ELT4).

The second passivation layer PAS2 may be disposed on the top of each of the light emitting elements LD1 and LD2, and expose the first and second end portions EP1 and EP2 of each of the light emitting elements LD1 and LD2. Also, the second passivation layer PAS2 may also be disposed on the first passivation layer PAS1 disposed between the second electrode ELT2_3 and the fourth electrode ELT4. The second passivation layer PAS2 may be disposed between the second contact electrode CNE2 and the third contact electrode CNE3, which are adjacent to each other, to insulate the second contact electrode CNE2 and the third contact electrode CNE3 from each other.

The second contact electrode CNE2 may be disposed on the third electrode ELT3, the fourth electrode ELT4, the second end portion EP2 of the first light emitting element LD1, and the first end portion EP1 of the second light emitting element LD2. The second contact electrode CNE2 may electrically connect the second end portion EP2 of the first light emitting element LD1 and the first end portion EP1 of the second light emitting element LD2.

The second contact electrode CNE2 may be disposed on the fourth electrode ELT4 to be in contact with the fourth electrode ELT4. In one or more embodiments, the second contact electrode CNE2 may be disposed to be in contact with the fourth electrode ELT4 on one area of the fourth electrode ELT4, which is not covered by the first passivation layer PAS1. However, the present disclosure is not limited thereto, and the second contact electrode CNE2 may be insulated from the fourth electrode ELT4 by the first passivation layer PAS1. Also, the second contact electrode CNE2 may be disposed on the second end portion EP2 of the first light emitting element LD1 to be in contact with the second end portion EP2 of the first light emitting element LD1, which is adjacent to the fourth electrode ELT4. Further, the second contact electrode CNE2 may be disposed on the third electrode ELT3 to be in contact with the third electrode ELT3. In one or more embodiments, the second contact electrode CNE2 may be disposed to be in contact with the third electrode ELT3 on one area of the third electrode ELT3, which is not covered by the first passivation layer PAS1. Also, the second contact electrode CNE2 may be disposed on the first end portion EP1 of the second light emitting element LD2 to be in contact with the first end portion EP1 of the second light emitting element LD2, which is adjacent to the third electrode ELT3.

The third passivation layer PAS3 may be disposed over the second contact electrode CNE2. Also, the third passivation layer PAS3 may be disposed over the second passivation layer PAS2. The third passivation layer PAS3 may cover the second contact electrode CNE2 and the second passivation layer PAS2.

The third contact electrode CNE3 may be disposed on the second electrode ELT2_3 to be in contact with the second electrode ELT2_3. In one or more embodiments, the third contact electrode CNE3 may be disposed to be in contact with the second electrode ELT2_3 on one area of the second electrode ELT2_3, which is not covered by the first passivation layer PAS1. Also, the third contact electrode CNE3 may be disposed on the second end portion EP2 of the second light emitting element LD2 to be in contact with the second end portion EP2 of the second light emitting element LD2, which is adjacent to the second electrode ELT2_3. That is, the third contact electrode CNE3 may be disposed to cover the second end portion EP2 of the second light emitting element LD2 and at least one area of the second electrode ELT2_3, which corresponds thereto.

In one or more embodiments, although a case where the first contact electrode CNE1 (or the third contact electrode CNE3) and the second contact electrode CNE2 are disposed at different layers with the third passivation layer PAS3 interposed therebetween is illustrated in FIG. 14A, the first to third contact electrodes CNE1, CNE2, and CNE3 are not limited thereto.

As shown in FIG. 14B, for example, as described with reference to FIG. 8B, the first and second contact electrodes CNE1 and CNE2 (or the first to third contact electrodes CNE1, CNE2, and CNE3) may be at the same layer.

Figure 15:
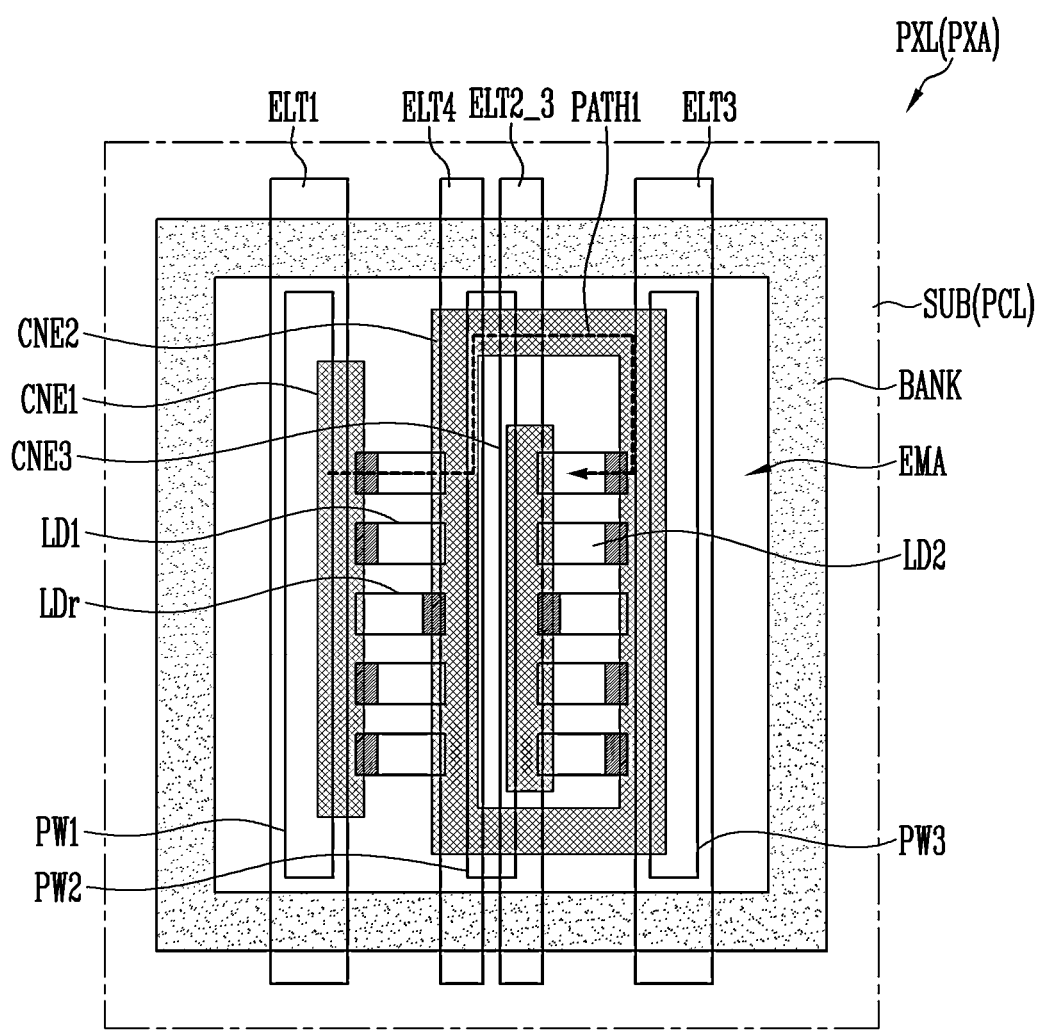
FIG. 15 is a plan view illustrating another example of the pixel included in the display device shown in FIG. 5.

FIG. 15 is a plan view illustrating another example of the pixel included in the display device shown in FIG. 5, according to one or more embodiments of the present disclosure. A pixel PXL corresponding to FIG. 13 is illustrated in FIG. 15.

Referring to FIGS. 13 and 15, the pixel PXL shown in FIG. 15 may be substantially identical or similar to the pixel PXL shown in FIG. 13, except the second electrode ELT2_3. Therefore, duplicated descriptions will not be repeated.

As shown in FIG. 15, a length of the second electrode ELT2_3 may be equal to that of the first electrode ELT1 (e.g., the third electrode ELT3 or the fourth electrode ELT4). Like the first electrode ELT1, the third electrode ELT3, and the fourth electrode ELT4, the second electrode ELT2_3 may be disposed in the pixel area PXA. After the light emitting elements LD1 and LD2 are supplied and arranged in the pixel area PXA (or the light emitting area EMA), the first to fourth electrodes ELT1, ELT2_3, ELT3, and ELT4 may be cut (or partially removed) at the outside of the bank BANK.

Figure 16:
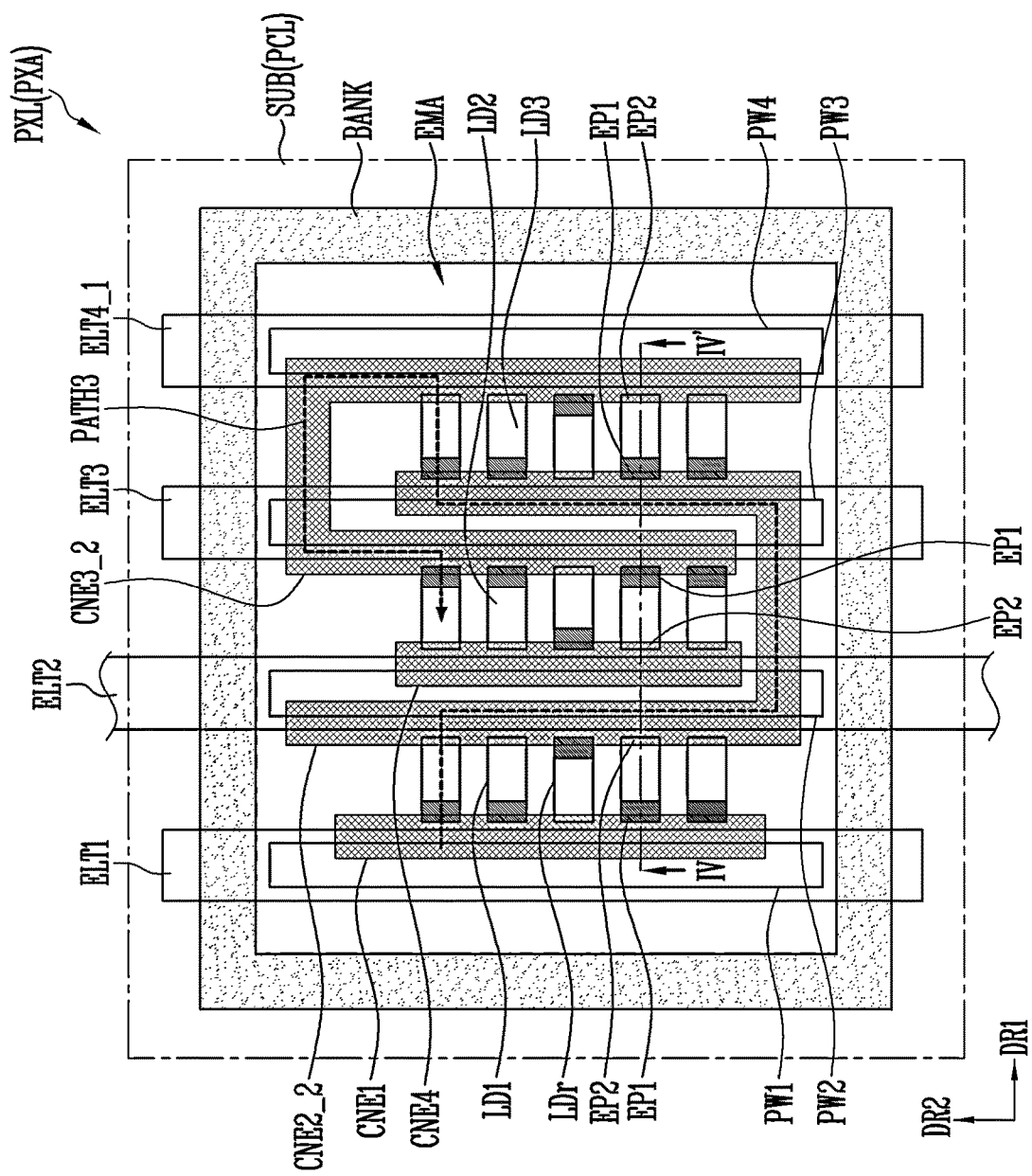
FIG. 16 is a plan view illustrating an example of the pixel included in the display device shown in FIG. 5.

FIG. 16 is a plan view illustrating an example of the pixel included in the display device shown in FIG. 5. A structure of a pixel PXL is illustrated in FIG. 16, based on the light emitting element layer LDL (see FIG. 8A) in which the light emitting elements LD are disposed (or the light emitting units EMU1, EMU2, and EMU3 described with reference to FIG. 6D).

Referring to FIG. 16, the pixel PXL may be formed in the pixel area PXA defined on the base layer SUB.

The pixel PXL may include a first electrode ELT1, a second electrode ELT2, a third electrode ELT3, and a fourth electrode ELT4_1, which are sequentially arranged along the first direction DR1.

Each of the first electrode ELT1, the second electrode ELT2, the third electrode ELT3, and the fourth electrode ELT4_1 may extend in the second direction DR2 crossing the first direction DR1, and the first electrode ELT1, the second electrode ELT2, the third electrode ELT3, and the fourth electrode ELT4_1 may be disposed to be spaced from each other along the first direction DR1.

The first electrode ELT1, the second electrode ELT2, and the third electrode ELT3 are respectively substantially identical or similar to the first electrode ELT1, the second electrode ELT2, and the third electrode ELT3, which are described with reference to FIG. 7, and therefore, duplicated descriptions will not be repeated. In one or more embodiments, the fourth electrode ELT4_1 is substantially identical or similar to the third electrode ELT3, except an arrangement position thereof, and therefore, duplicated descriptions will not be repeated.

In some embodiments, the pixel PXL may include a first bank pattern PW1 overlapping one area of the first electrode ELT1, a second bank pattern PW2 overlapping one area of the second electrode ELT2, a third bank pattern PW3 overlapping one area of the third electrode ELT3, and a fourth bank pattern PW4 overlapping one area of the fourth electrode ELT4_1. The first bank pattern PW1, the second bank pattern PW2, and the third bank pattern PW3 may be respectively substantially identical or similar to the first bank pattern PW1, the second bank pattern PW2, and the third bank pattern PW3, which are described with reference to FIG. 7. The fourth electrode ELT4_1 may be disposed on the fourth bank pattern PW4 to protrude in a height direction of the base layer SUB due to the fourth bank pattern PW4.

The pixel PXL may include a first light emitting element LD1, a second light emitting element LD2, and a third light emitting element LD3. The first light emitting element LD1 and the second light emitting element LD2 may be respectively substantially identical or similar to the first light emitting element LD1 and the second light emitting element LD2, which are described with reference to FIG. 7, and the third light emitting element LD3 may be substantially identical or similar to the first light emitting element LD1 or the second light emitting element LD2, except an arrangement position thereof.

The third light emitting element LD3 may be disposed between the third electrode ELT3 and the fourth electrode ELT4_1. A first end portion EP1 of the third light emitting element LD3 may face the third electrode ELT3, and a second end portion EP2 of the third light emitting element LD3 may face the fourth electrode ELT4_1. When a plurality of third light emitting elements LD3 are provided, the plurality of third light emitting elements LD3 may be connected in parallel to each other between the third electrode ELT3 and the fourth electrode ELT4_1, and constitute the second light emitting unit EMU2 described with reference to FIG. 6D.

In some embodiments, the pixel PXL may include a first contact electrode CNE1, a second contact electrode CNE2_2, a third contact electrode CNE3_2, and a fourth contact electrode CNE4.

The first contact electrode CNE1 may be formed on a first end portion EP1 of the first light emitting element LD1 and at least one area of the first electrode ELT1, which corresponds thereto, to physical and/or electrically connect the first end portion EP1 of the first light emitting element LD1 to the first electrode ELT1.

The second contact electrode CNE2_2 may be formed on a second end portion EP2 of the first light emitting element LD1 and at least one of the second electrode ELT2, which corresponds thereto. Also, the second contact electrode CNE2_2 may extend up to the third electrode ELT3 by detouring the fourth contact electrode CNE4 or the second light emitting element LD2, and be formed on the first end portion EP1 of the third light emitting element LD3 and at least one area of the third electrode ELT3, which corresponds thereto. The second contact electrode CNE2_2 may electrically connect the second end portion EP2 of the first light emitting element LD1 and the first end portion EP1 of the third light emitting element LD3.

As shown in FIG. 16, the second contact electrode CNE2_2 may extend from the second electrode ELT2 to the third electrode ELT3 while being adjacent to a lower end portion of the fourth contact electrode CNE4.

The third contact electrode CNE3_2 may be formed on a first end portion EP1 of the second light emitting element LD2 and at least one area of the third electrode ELT3, which corresponds thereto. Also, the third contact electrode CNE3_2 may extend up to the fourth electrode ELT4_1 by detouring the second contact electrode CNE2_2 or the third light emitting element LD3, and be formed on a second end portion EP2 of the third light emitting element LD3 and at least one area of the fourth electrode ELT4_1, which corresponds thereto. The third contact electrode CNE3_2 may electrically connect the second end portion EP2 of the third light emitting element LD3 and the first end portion EP1 of the second light emitting element LD2.

As shown in FIG. 16, the third contact electrode CNE3_2 may extend from the third electrode ELT3 to the fourth electrode ELT4_1 while being adjacent to an upper end portion of the second contact electrode CNE2_2 on the third electrode ELT3.

The fourth contact electrode CNE4 may be formed on the second end portion EP2 of the second light emitting element LD2 and at least one area of the second electrode ELT2, which corresponds thereto, to physically and/or electrically connect the second end portion EP2 of the second light emitting element LD2 to the second electrode ELT2. Therefore, the first light emitting element LD1, the third light emitting element LD3, and the second light emitting element LD2 may be connected in series between the first electrode ELT1 and the second electrode ELT2 through the first contact electrode CNE1, the second contact electrode CNE2_2, the third contact electrode CNE3_2, and the fourth contact electrode CNE4.

The light emitting elements LD1, LD2, and LD3 gathered in the pixel area PXA may constitute a light source of the corresponding pixel PXL. In one or more embodiments, when a driving current flows along a third path PATH3 or the like in the pixel PXL during each frame period, the pixel PXL may emit light with a luminance corresponding to the driving current while the light emitting elements LD1, LD2, and LD3 connected in the forward direction between the first electrode ELT1 and the second electrode ELT2 of the pixel PXL are emitting light.

Figure 17A:
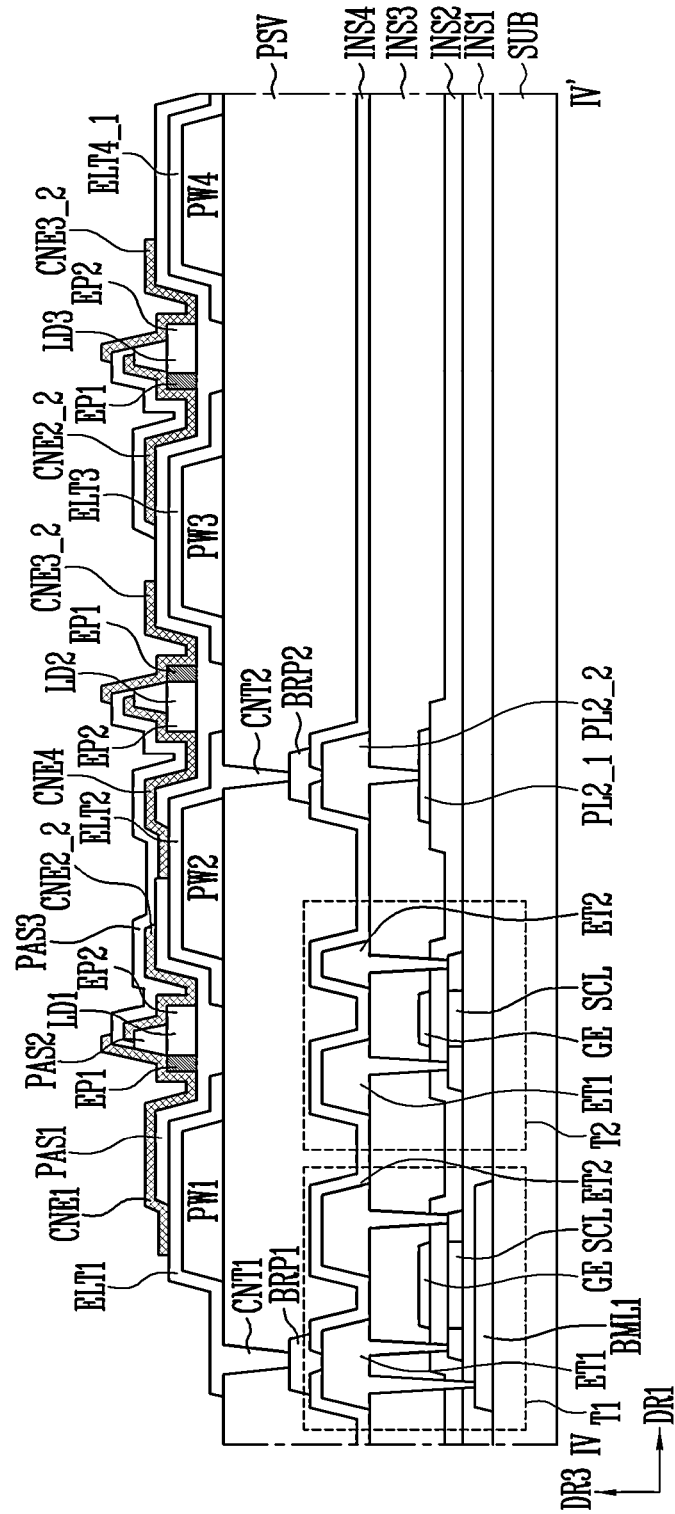
FIGS. 17A and 17B are sectional views illustrating an example of the pixel taken along the line IV-IV' shown in FIG. 16.
Figure 17B:
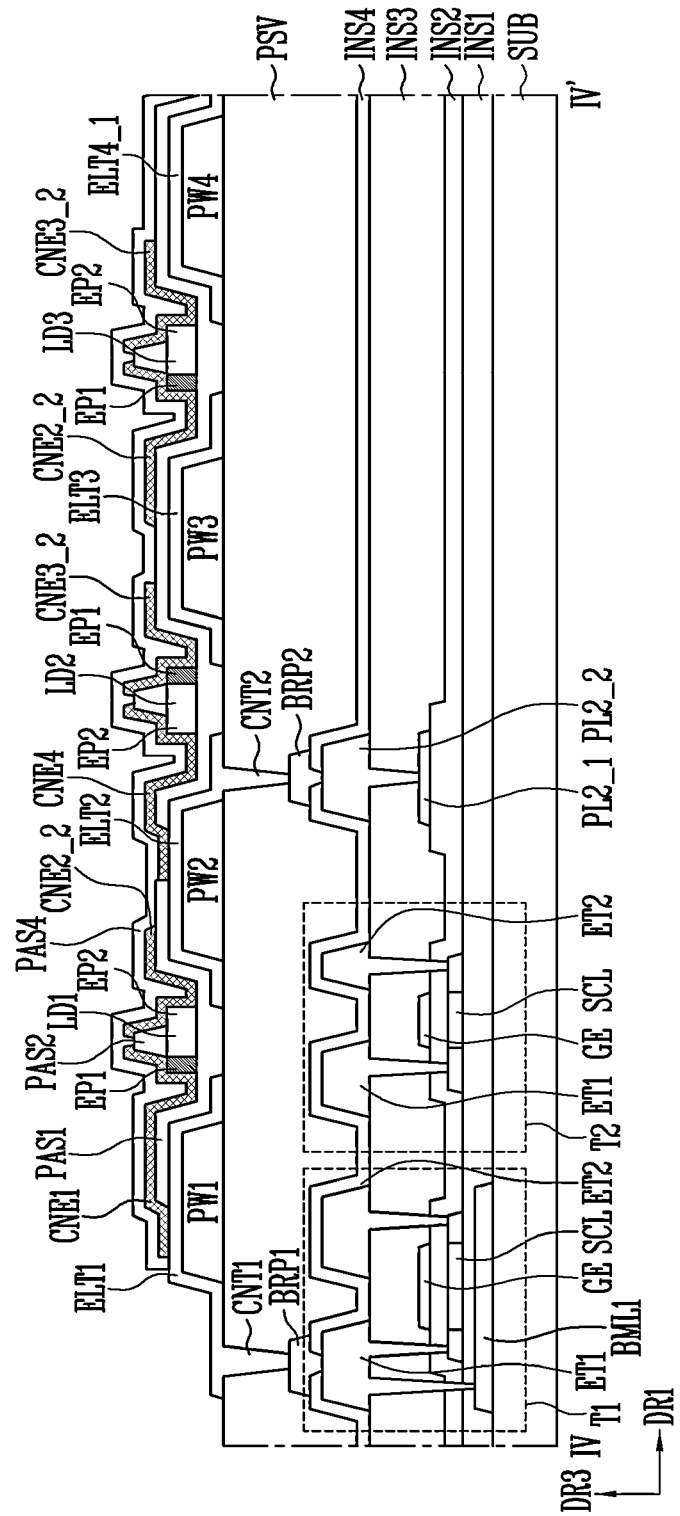

FIGS. 17A and 17B are sectional views illustrating an example of the pixel taken along the line IV-IV' shown in FIG. 16, according to one or more embodiments of the present disclosure. Figures corresponding to FIGS. 8A and 8B are illustrated in FIGS. 17A and 17B, respectively.

First, referring to FIGS. 8A and 17A, a pixel circuit layer (e.g., a structure from a first insulating layer INS1 to a protective layer PSV) shown in FIG. 17A may be substantially identical or similar to the pixel circuit layer PCL described with reference to FIG. 8A. Therefore, duplicated descriptions will not be repeated.

The first to fourth bank patterns PW1, PW2, PW3, and PW4 may be disposed on the pixel circuit layer PCL (or the protective layer PSV1).

The first to fourth electrodes ELT1, ELT2, ELT3, and ELT4_1 may be respectively disposed on the top of the first to fourth bank patterns PW1, PW2, PW3, and PW4.

A first passivation layer PAS1 may be disposed on one areas of the first to fourth electrodes ELT1, ELT2, ELT3, and ELT4_1. For example, the first passivation layer PAS1 may be formed to cover the one areas of the first to fourth electrodes ELT1, ELT2, ELT3, and ELT4_1, and include openings exposing other areas of the first to fourth electrodes ELT1, ELT2, ELT3, and ELT4_1.

In one or more embodiments, the first passivation layer PAS1 may be primarily formed to entirely cover the first to fourth electrodes ELT1, ELT2, ELT3, and ELT4_1. After light emitting elements LD are supplied and aligned on the first passivation layer PAS1, the first passivation layer PAS1 may be partially opened to expose the first electrode ELT1 and the second electrode ELT2 at a first and second contact portions (e.g., a set or predetermined first and second contact portions) as shown in FIG. 17A. If necessary, the first passivation layer PAS1 may be partially opened to expose the third electrode ELT3, and the fourth electrode ELT4_1.

For example, the first passivation layer PAS1 is interposed between the first and second electrodes ELT1 and ELT2 and the first light emitting element LD1, between the second and third electrodes ELT2 and ELT3 and the second light emitting element LD2, and between the third and fourth electrodes ELT3 and ELT4_1 and the third light emitting element LD3, and may expose at least one area of each of the first to fourth electrodes ELT1, ELT2, ELT3, and ELT4_1.

The first to third light emitting elements LD1, LD2, and LD3 may be respectively disposed in areas between the first to fourth electrodes ELT1, ELT2, ELT3, and ELT4_1.

A second passivation layer PAS2 may be disposed on the first to third light emitting elements LD1, LD2, and LD3, for example, each of the top of the first light emitting element LD1 aligned between the first and second electrodes ELT1 and ELT2, the top of the second light emitting element LD2 aligned between the second and third electrodes ELT2 and ELT3, and the top of the third light emitting element LD3 aligned between the third and fourth electrodes ELT3 and ELT4_1, and expose the first and second end portions EP1 and EP2 of each of the first to third light emitting elements LD1, LD2, and LD3.

The second contact electrode CNE2_2 may be disposed on the second and third electrodes ELT2 and ELT3, a second end portion EP2 of the first light emitting element LD1, and a first end portion EP1 of the third light emitting element LD3. The second contact electrode CNE2_2 may electrically connect the second end portion EP2 of the first light emitting element LD1 and the first end portion EP1 of the third light emitting element LD3.

The second contact electrode CNE2_2 is disposed on the second electrode ELT2, and may be insulated from the second electrode ELT2 by the first passivation layer PAS1. Also, the second contact electrode CNE2_2 may be disposed on the second end portion EP2 of the first light emitting element LD1 to be in contact with the second end portion EP2 of the first light emitting element LD1, which is adjacent to the second electrode ELT2. Further, the second contact electrode CNE2_2 may be disposed on the third electrode ELT3. Also, the second contact electrode CNE2_2 may be disposed on the first end portion EP1 of the third light emitting element LD3 to be in contact with the first end portion EP1 of the third light emitting element LD3, which is adjacent to the third electrode ELT3.

The fourth contact electrode CNE4 may be disposed on the second electrode ELT2 to be in contact with the second electrode ELT2. In an example, the fourth contact electrode CNE4 may be disposed to be in contact with the second electrode ELT2 on one area of the second electrode ELT2, which is not covered by the first passivation layer PAS1. Also, the fourth contact electrode CNE4 may be disposed on the second end portion EP2 of the second light emitting element LD2 to be in contact with the second end portion EP2 of the second light emitting element LD2, which is adjacent to the second electrode ELT2. For example, the fourth contact electrode CNE4 may be disposed to cover the second end portion EP2 of the second light emitting element LD2 and at least one area of the second electrode ELT2, which corresponds thereto.

A third passivation layer PAS3 may be disposed over the second contact electrode CNE2_2 and the fourth contact electrode CNE4. The third passivation layer PAS3 may cover the second contact electrode CNE2_2 and the fourth contact electrode CNE4.

The first contact electrode CNE1 may be disposed on the first electrode ELT1 to be in contact with the first electrode ELT1. In one or more embodiments, the first contact electrode CNE1 may be disposed to be in contact with the first electrode ELT1 on one area of the first electrode ELT1, which is not covered by the first passivation layer PAS1. Also, the first contact electrode CNE1 may be disposed on the first end portion EP1 of the first light emitting element LD1 to be in contact with the first end portion EP1 of the first light emitting element LD1, which is adjacent to the first electrode ELT1. For example, the first contact electrode CNE1 may be disposed to cover the first end portion EP1 of the first light emitting element LD1 and at least one area of the first electrode ELT1, which corresponds thereto.

The third contact electrode CNE3_2 may be disposed on the third electrode ELT3. Also, the third contact electrode CNE3_2 may be disposed on the first end portion EP1 of the second light emitting element LD2 to be in contact with the first end portion EP1 of the second light emitting element LD2, which is adjacent to the third electrode ELT3. Further, the third contact electrode CNE3_2 may be disposed on the fourth electrode ELT4_1, and may be disposed on the second end portion EP2 of the third light emitting element LD3 to be in contact with the second end portion EP2 of the third light emitting element LD3, which is adjacent to the fourth electrode ELT4_1. For example, the third contact electrode CNE3_2 may be disposed to cover the second end portion EP2 of the third light emitting element LD3.

In one or more embodiments, although a case where the second and fourth contact electrodes CNE2_2 and CNE4 and the first and third contact electrodes CNE1 and CNE3_2 are disposed in different layers with the third passivation layer PAS3 interposed therebetween is illustrated in FIG. 17A, the first to fourth contact electrodes CNE1, CNE2_2, CNE3_2, and CNE4 are not limited thereto.

In some embodiments, the first to fourth contact electrodes CNE1, CNE2_2, CNE3_2, and CNE4 may be at the same layer.

Referring to FIG. 17B, the first to fourth contact electrodes CNE1, CNE2_2, CNE3_2, and CNE4 may be disposed on the first passivation layer PAS1 (and the second passivation layer PAS2). An arrangement relationship (or overlapping relationship) among the first to fourth contact electrodes CNE1, CNE2_2, CNE3_2, and CNE4, the first to fourth electrodes ELT1, ELT2, ELT3, and ELT4_1, and the light emitting elements LD1, LD2, and LD3 is substantially identical or similar to that described with reference to FIG. 17A, and therefore, duplicated descriptions will not be repeated.

The first contact electrode CNE1 and the second contact electrode CNE2_2 may be disposed on the first light emitting element LD1 to be spaced from each other, the fourth contact electrode CNE4 and the third contact electrode CNE3_2 may be disposed on the second light emitting element LD2 to be spaced from each other, and the second contact electrode CNE2_2 and the third contact electrode CNE3_2 may be disposed on the third light emitting element LD3 to be spaced from each other.

A fourth passivation layer PAS4 may be formed and/or disposed on one surface of the base layer SUB, which the first to fourth electrodes ELT1, ELT2, ELT3, and ELT4_1, the light emitting elements LD1, LD2, and LD3, and the first to fourth contact electrodes CNE1, CNE2_2, CNE3_2, and CNE4 are formed, to cover the first to fourth electrodes ELT1, ELT2, ELT3, and ELT4_1, the light emitting elements LD1, LD2, and LD3, and the first to fourth contact electrodes CNE1, CNE2_2, CNE3_2, and CNE4.

Figure 18:
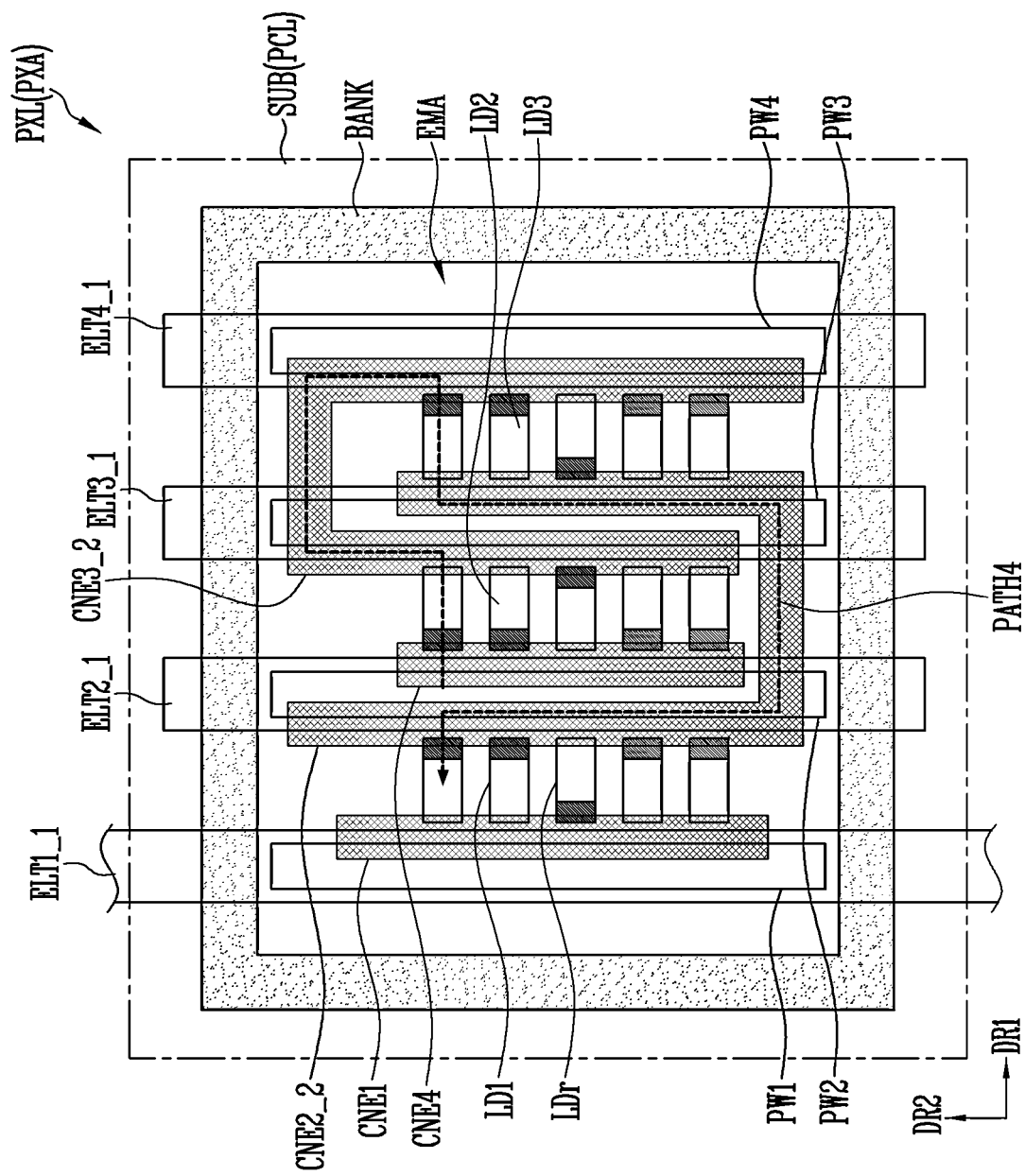
FIG. 18 is a plan view illustrating another example of the pixel included in the display device shown in FIG. 5.

FIG. 18 is a plan view illustrating another example of the pixel included in the display device shown in FIG. 5. A pixel PXL corresponding to FIG. 16 is illustrated in FIG. 18.

Referring to FIGS. 16 and 18, the pixel PXL shown in FIG. 18 may be substantially identical or similar to the pixel PXL shown in FIG. 16, except arrangement directions of first to third electrodes ELT1_1, ELT2_1, and ELT3_1 and first to third light emitting elements LD1, LD2, and LD3. Therefore, duplicated descriptions will not be repeated.

Each of the first electrode ELT1_1, the second electrode ELT2_1, the third electrode ELT3_1, and the fourth electrode ELT4_1 may extend in the second direction DR2 crossing the first direction DR1, and may be disposed to be spaced from each other along the first direction DR1.

A length of the first electrode ELT1_1 in the second direction DR2 may be longer than that of each of the second electrode ELT2_1 and the third electrode ELT3_1 in the second direction DR2. As shown in FIG. 18, the first electrode ELT1_1 may extend up to another pixel area adjacent to the pixel area PXA. Although will be described later, the first electrode ELT1_1 may be connected to the second power source VSS (or second power line) described with reference to FIG. 6A, etc., and the second electrode ELT2_1 may be connected to the first transistor M1 described with reference to FIG. 6A, etc.

In order to arrange the light emitting elements LD1, LD2, and LD3, an AC voltage may be applied to the first electrode ELT1_1 and the third electrode ELT3_1 and a reference voltage (e.g., a ground voltage) may be applied to the second electrode ELT2_1 and the fourth electrode ELT4_1, in a fabricating process of the display device. Accordingly, the first light emitting element LD1 may be arranged such that the first end portion EP1 of the first light emitting element LD1 faces the second electrode ELT2_1 and the second end portion EP2 of the first light emitting element LD1 faces the first electrode ELT1_1. Similarly, the second light emitting element LD2 may be arranged such that the first end portion EP1 of the second light emitting element LD2 faces the second electrode ELT2_1 and the second end portion EP2 of the second light emitting element LD2 faces the third electrode ELT3_1. The third light emitting element LD3 may be arranged such that the first end portion EP1 of the third light emitting element LD3 faces the fourth electrode ELT4_1 and the second end portion EP2 of the third light emitting element LD3 faces the third electrode ELT3_1.

The first contact electrode CNE1 may be formed on the second end portion of the first light emitting element LD1 and at least one area of the first electrode ELT1_1, which corresponds thereto, to physically and/or electrically connect the second end portion EP2 of the first light emitting element LD1 to the first electrode ELT1_1.

The second contact electrode CNE2_2 may be formed on the first end portion EP1 of the first light emitting element LD1 and at least one area of the second electrode ELT2_1, which corresponds thereto. Also, the second contact electrode CNE2_2 may extend up to the third electrode ELT3_1 by detouring the fourth contact electrode CNE4 or the second light emitting element LD2, and may be formed on the second end portion EP2 of the third light emitting element LD3 and at least one area of the third electrode ELT3_1, which corresponds thereto. The second contact electrode CNE2_2 may electrically connect the first end portion EP1 of the first light emitting element LD1 and the second end portion EP2 of the third light emitting element LD3.

The third contact electrode CNE3_2 may be formed on the second end portion EP2 of the second light emitting element LD2 and at least one area of the third electrode ELT3_1, which corresponds thereto. Also, the third contact electrode CNE3_2 may extend up to the fourth electrode ELT4_1 by detouring the second contact electrode CNE2_2 or the third light emitting element LD3, and may be formed on the first end portion EP1 of the third light emitting element LD3 and at least one area of the fourth electrode ELT4_1, which corresponds thereto. The third contact electrode CNE3_2 may electrically connect the first end portion EP1 of the third light emitting element LD3 and the second end portion EP2 of the second light emitting element LD2.

The fourth contact electrode CNE4 may be formed on the first end portion EP1 of the second light emitting element LD2 and at least one area of the second electrode ELT2_1, which corresponds thereto, to physically and/or electrically connect the first end portion EP1 of the second light emitting element LD2 to the second electrode ELT2_1. Therefore, the second light emitting element LD2, the third light emitting element LD3, and the first light emitting element LD1 may be connected in series between the second electrode ELT2_1 and the first electrode ELT1_1 through the fourth contact electrode CNE4, the third contact electrode CNE3_2, the second contact electrode CNE2_2, and the first contact electrode CNE1.

Accordingly, a driving current for driving the pixel PXL may flow along a fourth path PATH4 via the second light emitting element LD2, the third light emitting element LD3, and the first light emitting element LD1.

Figure 19:
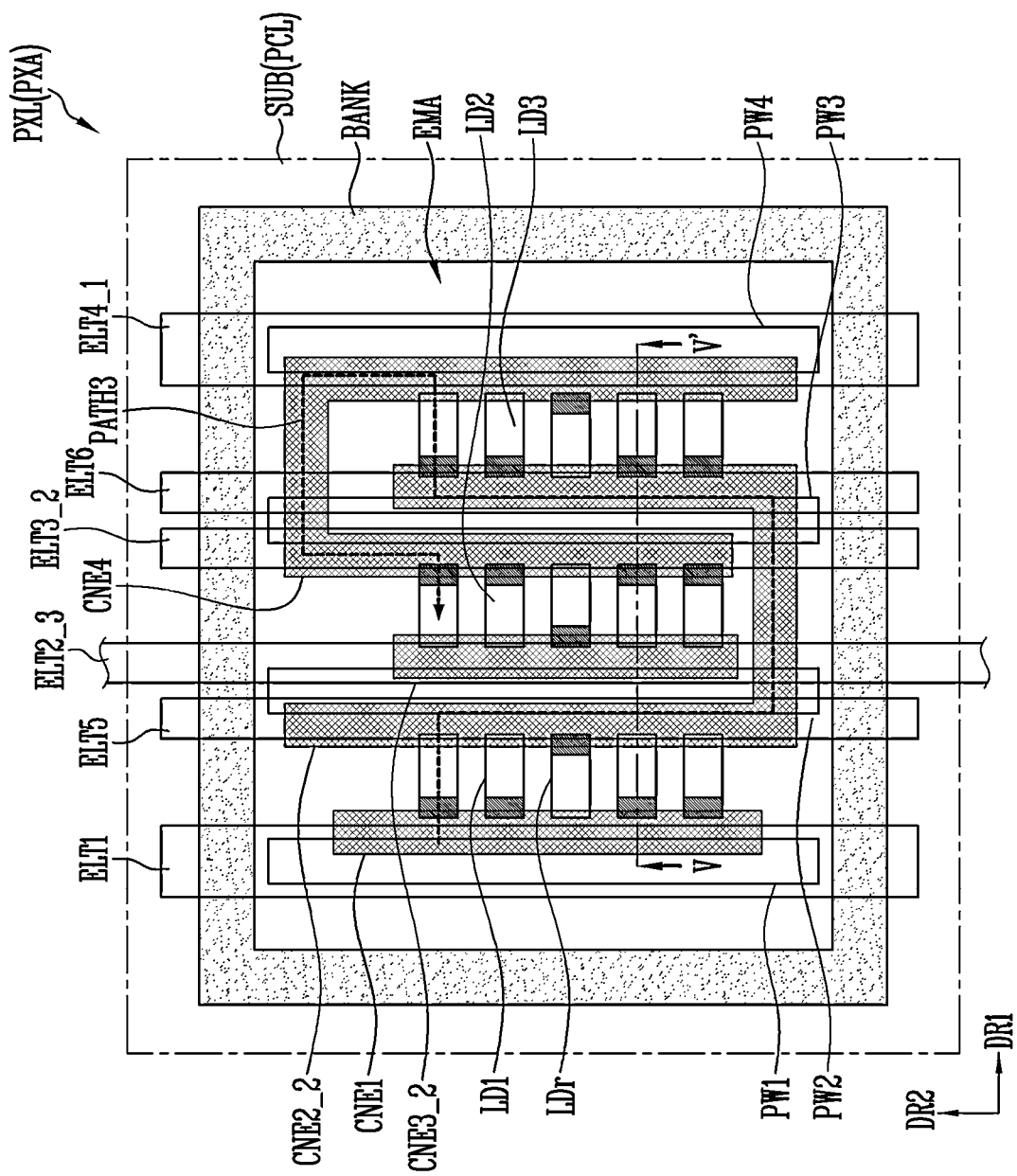
FIG. 19 is a plan view illustrating an example of the pixel included in the display device shown in FIG. 5.

FIG. 19 is a plan view illustrating an example of the pixel included in the display device shown in FIG. 5. A pixel PXL corresponding to FIG. 16 is illustrated in FIG. 19.

Referring to FIGS. 16 and 19, the pixel PXL shown in FIG. 19 may be substantially identical or similar to the pixel PXL shown in FIG. 16, except a second electrode ELT2_3, a third electrode ELT3_2, a fifth electrode ELT5, and a sixth electrode ELT6. Therefore, duplicated descriptions will not be repeated.

The fifth electrode ELT5 may extend in the second direction DR2, and may be disposed between the first electrode ELT1 and the second electrode ELT2_3. The fifth electrode ELT5 may be substantially identical or similar to the fourth electrode ELT4 described with reference to FIG. 13. Therefore, duplicated descriptions will not be repeated.

As described with reference to FIG. 13, the second electrode ELT2 shown in FIG. 16 is separated into the second electrode ELT2_3 and the fifth electrode ELT5, so that the first to third light emitting elements LD1, LD2, and LD3 can normally emit light with a desired luminance, even when a short circuit occurs between the second contact electrode CNE2 and the second electrode ELT2_3.

The sixth electrode ELT6 may extend in the second direction DR2, and may be disposed between the third electrode ELT3_2 and the fourth electrode ELT4_1. The sixth electrode ELT6 may be substantially identical or similar to the fifth electrode ELT5, except an arrangement position thereof. Therefore, duplicated descriptions will not be repeated.

The sixth electrode ELT6 may overlap the third bank pattern PW3. The sixth electrode ELT6 and the third electrode ELT3_2 may be disposed in a form in which the sixth electrode ELT6 and the third electrode ELT3_2 face each other on the third bank pattern PW3, and protrude in a height direction of the base layer SUB due to the third bank pattern PW3.

Similar to the fifth electrode ELT5, the third electrode ELT3_2 shown in FIG. 16 is separated into the third electrode ELT3_2 and the sixth electrode ELT6, so that the first to third light emitting elements LD1, LD2, and LD3 can normally emit light with a desired luminance, even when a short circuit occurs between the second contact electrode CNE2_2 and the sixth electrode ELT6 or between the third contact electrode CNE3_2 and the third electrode ELT3_2.

Figure 20A:
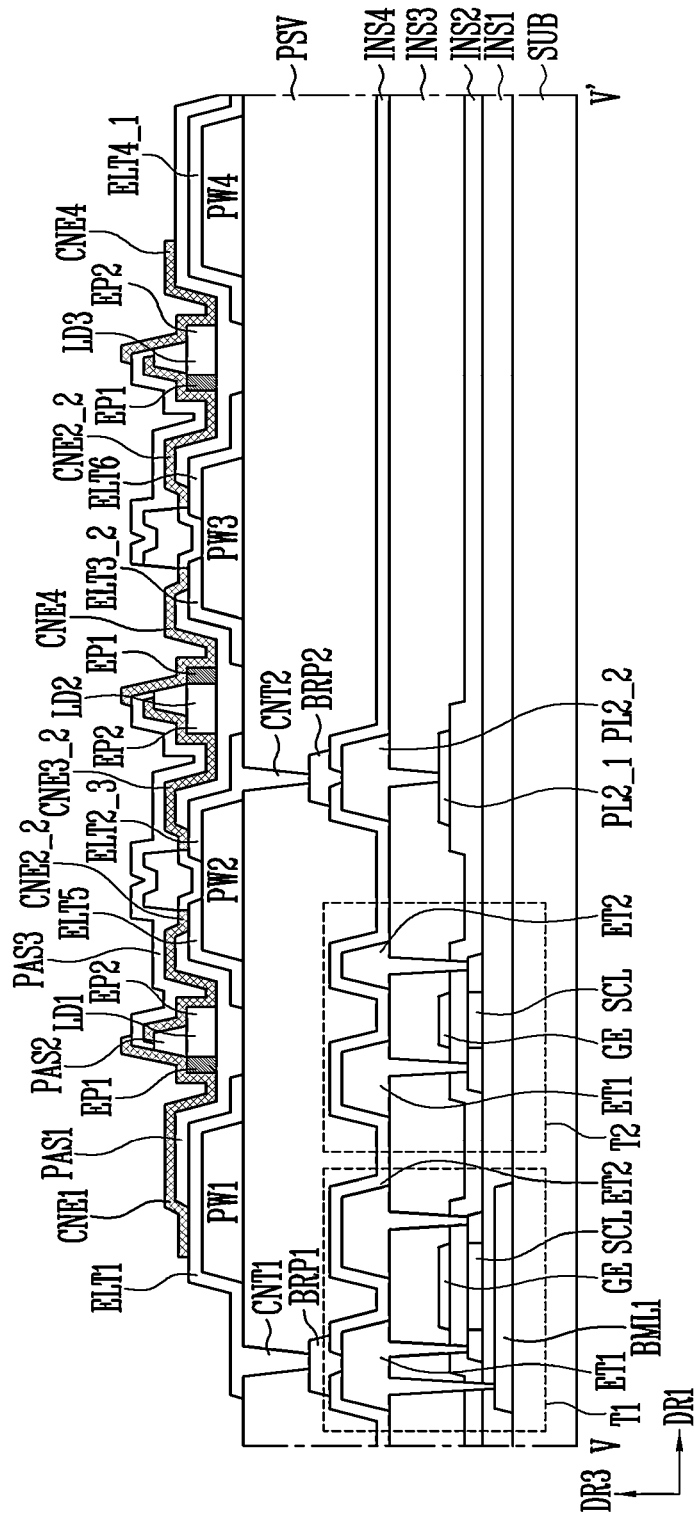
FIGS. 20A and 20B are sectional views illustrating an example of the pixel taken along the line V-V' shown in FIG. 19.
Figure 20B:
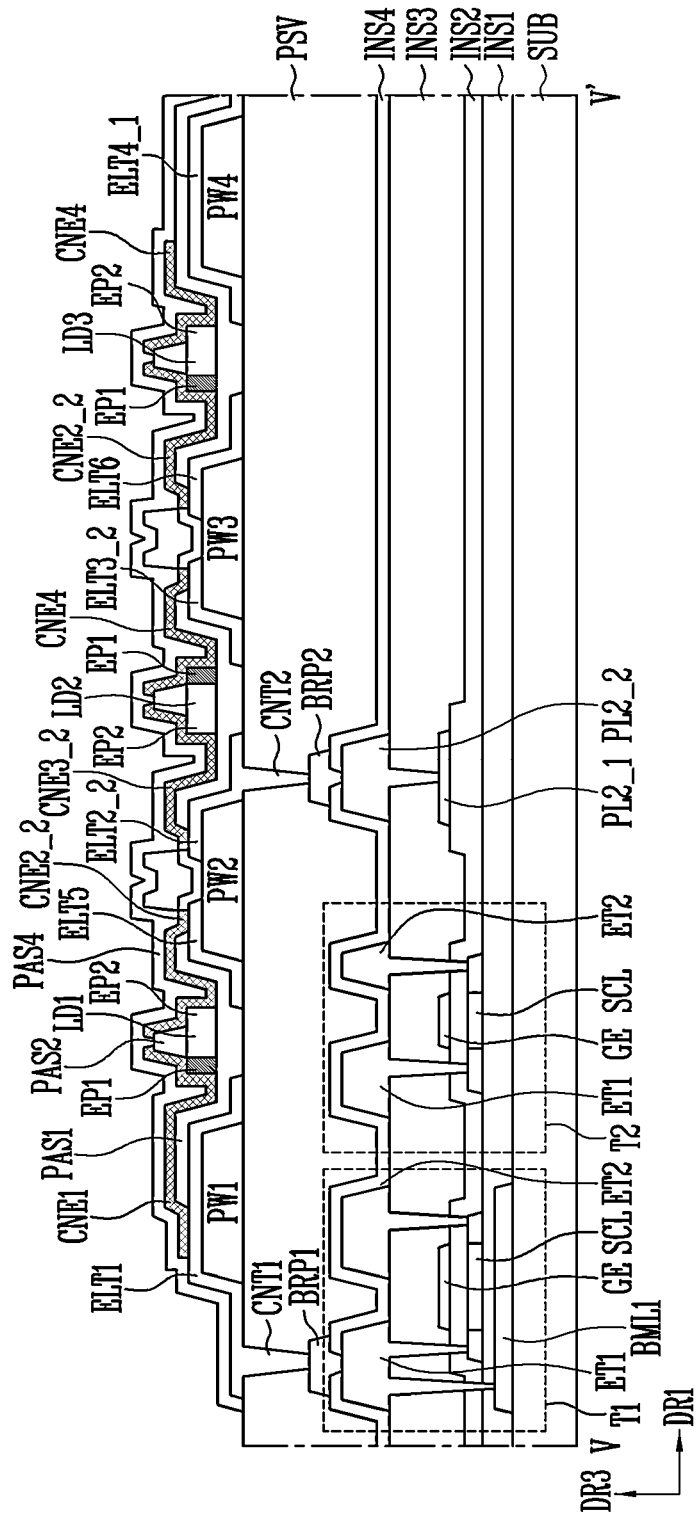

FIGS. 20A and 20B are sectional views illustrating an example of the pixel taken along the line V-V' shown in FIG. 19, according to one or more embodiments of the present disclosure. Figures corresponding to FIGS. 17A and 17B are illustrated in FIGS. 20A and 20B, respectively.

First, referring to FIGS. 17A and 20A, the pixel shown in FIG. 20A may be substantially identical or similar to the pixel shown in FIG. 17A, except the second electrode ELT2_3, the third electrode ELT3_2, the fifth electrode ELT5, and the sixth electrode ELT6. Therefore, duplicated descriptions will not be repeated.

The second electrode ELT2_3 and the fifth electrode ELT5 may be disposed on the top of the second bank pattern PW2. The second electrode ELT2_3 may overlap one side surface (e.g., a right side surface) of the second bank pattern PW2, and have a shape that is same as or similar to that of the one side surface of the second bank pattern PW2. The fifth electrode ELT5 may overlap the other side surface (e.g., a left side surface) of the second bank pattern PW2, and have a shape that is same as or similar to that of the other side surface of the second bank pattern PW2.

The third electrode ELT3_2 and the sixth electrode ELT6 may be disposed on the top of the third bank pattern PW3. The third electrode ELT3_2 may overlap one side surface (e.g., a left side surface) of the third bank pattern PW3, and have a shape that is same as or similar to that of the one side surface of the second bank pattern PW2. The sixth electrode ELT6 may overlap the other side surface (e.g., a right side surface) of the third bank pattern PW3, and have a shape that is same as or similar to that of the other side surface of the third bank pattern PW3.

The first passivation layer PAS1 may be disposed on one areas of the first to sixth electrodes ELT1, ELT2_3, ELT3_2, ELT4_1, ELT5, and ELT6. For example, the first passivation layer PAS1 may be formed to cover the one areas of the first to sixth electrodes ELT1, ELT2_3, ELT3_2, ELT4_1, ELT5, and ELT6, and may include openings exposing other areas of the first to sixth electrodes ELT1, ELT2_3, ELT3_2, ELT4_1, ELT5, and ELT6. Also, the first passivation layer PAS1 may cover one side surface of the second electrode ELT2_3 and one side surface of the fifth electrode ELT5, and may be disposed between the second electrode ELT2_3 and the fifth electrode ELT5. Further, the first passivation layer PAS1 may cover one side surfaces of the third electrode ELT3_2 and one side surface of the sixth electrode ELT6, which face each other, and be disposed between the third electrode ELT3_2 and the sixth electrode ELT6.

The second passivation layer PAS2 may be disposed on the top of each of the light emitting elements LD1, LD2, and LD3, and expose the first and second end portions EP1 and EP2 of each of the light emitting elements LD1, LD2, and LD3. Also, the second passivation layer PAS2 may be disposed on the first passivation layer PAS1 disposed between the second electrode ELT2_3 and the fifth electrode ELT5. The second passivation layer PAS2 may be disposed between the second contact electrode CNE2_2 and the fourth contact electrode CNE4, which are adjacent to each other, to insulate the second electrode CNE2_2 and the fourth contact electrode CNE4 from each other. Further, the second passivation layer PAS2 may also be disposed on the first passivation layer PAS1 disposed between the third electrode ELT3_2 and the sixth electrode ELT6. The second passivation layer PAS2 may be disposed between the second contact electrode CNE2_2 and the third contact electrode CNE3_2, which are adjacent to each other, to insulate the second contact electrode CNE2_2 and the third contact electrode CNE3_2 from each other.

In one or more embodiments, although a case where the second and fourth contact electrodes CNE2_2 and CNE4 and the first and third contact electrodes CNE1 and CNE3_2 are disposed at different layers with the third passivation layer PAS3 interposed therebetween is illustrated in FIG. 20A, the first to fourth contact electrodes CNE1, CNE2_2, CNE3_2, and CNE4 are not limited thereto.

For example, as shown in FIG. 20B, the first to fourth contact electrodes CNE1, CNE2_2, CNE3_2, and CNE4 may be at the same layer. The first to fourth contact electrodes CNE1, CNE2_2, CNE3_2, and CNE4 and the fourth passivation layer PAS4 may respectively substantially identical or similar to the first to fourth contact electrodes CNE1, CNE2_2, CNE3_2, and CNE4 and the fourth passivation layer PAS4, which are described with respect to FIG. 17B.

In the present disclosure, the display device includes a first light emitting element and a second light emitting element, which are respective disposed between first to third electrodes sequentially arranged, the first light emitting element and the second light emitting element are disposed such that second end portions of the first light emitting element and the second light emitting element face each other with the second electrode interposed therebetween, and the second end portion of the first light emitting element and a first end portion of the second light emitting element are connected through a contact electrode disposed in a form in which the contact electrode surrounds at least a portion of the second light emitting element. Thus, the first light emitting element and the second light emitting element, which are arranged in different directions, are connected in series, and the emission efficiency of the display device can be improved.

Further, because the second electrode is separated into two sub-electrodes spaced from each other, the first light emitting element and the second light emitting elements can emit light with a desired luminance, even when a short circuit occurs between the contact electrode and the second electrode. Thus, a display defect of the display device can be reduced.

One or more embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A display device comprising:
    a substrate;
    a first electrode and a second electrode on the substrate, the first electrode and the second electrode being spaced from each other in a first direction;
    at least one first light emitting element located between the first electrode and the second electrode;
    a first contact electrode overlapping the first electrode and one end of the at least one first light emitting element in a plan view, the first contact electrode being in contact with the one end of the at least one first light emitting element; and
    a second contact electrode overlapping the second electrode and another end of the at least one first light emitting element in a plan view, the second contact electrode being in contact with the another end of the at least one first light emitting element,
    wherein the first contact electrode is spaced from the second electrode and at least a portion of the first contact electrode has a closed loop.

2. The display device of claim 1, wherein, in a plan view, the first contact electrode surrounds at least a portion of the second contact electrode.

3. The display device of claim 1, wherein the at least one first light emitting element comprises inorganic light emitting diodes connected in parallel to each other.

4. The display device of claim 1, wherein the first contact electrode is in contact with the first electrode.

5. The display device of claim 1, further comprising:
    a transistor on the substrate; and
    a power line on the substrate,
    wherein the first contact electrode is electrically connected to one electrode of the transistor, and
    wherein the second contact electrode is electrically connected to the power line.

6. The display device of claim 1, further comprising:
    a transistor on the substrate; and
    a power line on the substrate,
    wherein the second contact electrode is electrically connected to one electrode of the transistor, and
    wherein the first contact electrode is electrically connected to the power line.

7. The display device of claim 1, wherein the first contact electrode and the second contact electrode are at different layers with at least one insulating layer interposed therebetween.

8. The display device of claim 1, wherein the first contact electrode and the second contact electrode are at a same layer.

9. The display device of claim 1, further comprising:
    a first insulating layer disposed on the first electrode and the second electrode,
    wherein the at least one first light emitting element is disposed on the first insulating layer.

10. The display device of claim 9, further comprising:
    a second insulating layer disposed on the at least one first light emitting element and exposing the one end and the another end of the at least one first light emitting element.

11. The display device of claim 1, further comprising:
    a third electrode spaced from the second electrode;
    at least one second light emitting element located between the second electrode and the third electrode; and
    a third contact electrode overlapping the third electrode and one end of the at least one second light emitting element in a plan view, the third contact electrode being in contact with the one end of the at least one second light emitting element.

12. The display device of claim 11, wherein the first contact electrode is in contact with another end of the at least one second light emitting element.

13. The display device of claim 11, wherein the another end of the at least one first light emitting element and the another end of the at least one second light emitting element comprise a same type semiconductor layer, and face each other with the second electrode interposed therebetween.

14. The display device of claim 11, wherein the at least one first light emitting element and the at least one second light emitting element are connected in series between the second contact electrode and the third contact electrode.

15. The display device of claim 11, further comprising a bank extending along an edge of a light emitting area of the substrate, the bank defining the light emitting area,
wherein the first electrode, the second electrode, and the third electrode overlap the bank.

16. The display device of claim 11, further comprising:
a transistor on the substrate; and
a power line on the substrate,
wherein the third electrode is electrically connected to one electrode of the transistor,
wherein the second electrode is electrically connected to the power line, and
wherein the first electrode is insulated from the transistor and the power line.

17. The display device of claim 11, further comprising:
a transistor on the substrate; and
a power line on the substrate,
wherein the second electrode is electrically connected to one electrode of the transistor,
wherein the third electrode is electrically connected to the power line, and
wherein the first electrode is insulated from the transistor and the power line.

18. A display device comprising:
a substrate;
a first electrode and a second electrode on the substrate, the first electrode and the second electrode being spaced from each other in a first direction;
at least one first light emitting element located between the first electrode and the second electrode, the at least one first light emitting element being completely spaced from the first electrode and the second electrode;
a first contact electrode in contact with one end of the at least one first light emitting element; and
a second contact electrode in contact with another end of the at least one first light emitting element,
wherein the first contact electrode comprises a first portion and a second portion extending in a second direction to face each other, and the first portion overlaps the one end of the at least one first light emitting element in a plan view,
wherein the second contact electrode comprises a third portion and a fourth portion extending in the second direction to face each other, and the third portion overlaps the another end of the at least one first light emitting element in a plan view, and
wherein the first portion is disposed between the third portion and the fourth portion in a plan view.

19. A display device comprising:
a substrate;
a first electrode and a second electrode on the substrate, the first electrode and the second electrode being spaced from each other in a first direction;
at least one first light emitting element located between the first electrode and the second electrode;
a third electrode spaced from the second electrode;
at least one second light emitting element located between the second electrode and the third electrode;
a first contact electrode in contact with one end of the at least one first light emitting element;
a second contact electrode in contact with another end of the at least one first light emitting element; and
a third contact electrode in contact with one end of the at least one second light emitting element,
wherein the first contact electrode comprises a first portion and a second portion extending in a second direction to face each other, and the first portion overlaps the one end of the at least one first light emitting element in a plan view,
wherein the second contact electrode comprises a third portion and a fourth portion extending in the second direction to face each other, and the third portion overlaps the another end of the at least one first light emitting element in a plan view,
wherein the second contact electrode is in contact with another end of the at least one second light emitting element, and
wherein the third contact electrode is disposed between the second portion and the fourth portion in a plan view.

20. The display device of claim 19, wherein the at least one first light emitting element and the at least one second light emitting element are connected in series between the first contact electrode and the third contact electrode.

* * * * *